United States Patent
Higashi et al.

(10) Patent No.: US 10,295,578 B2
(45) Date of Patent: May 21, 2019

(54) CURRENT SENSOR AND SMART METER

(71) Applicant: KABUSHIKI KAISHA TOSHIBA, Tokyo (JP)

(72) Inventors: Yoshihiro Higashi, Ishikawa (JP); Hideaki Fukuzawa, Kanagawa (JP); Tetsuro Wamura, Kanagawa (JP); Masakazu Yaginuma, Kanagawa (JP); Motomichi Shibano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 549 days.

(21) Appl. No.: 14/933,642

(22) Filed: Nov. 5, 2015

(65) Prior Publication Data
US 2016/0131687 A1 May 12, 2016

(30) Foreign Application Priority Data
Nov. 6, 2014 (JP) ................. 2014-226293

(51) Int. Cl.
*G01R 15/20* (2006.01)
*G01R 21/08* (2006.01)

(52) U.S. Cl.
CPC .......... *G01R 21/08* (2013.01); *G01R 15/205* (2013.01)

(58) Field of Classification Search
CPC ................. G01R 21/08; G01R 15/205
See application file for complete search history.

(56) References Cited

U.S. PATENT DOCUMENTS

| | | | |
|---|---|---|---|
| 7,259,545 B2 | 8/2007 | Stauth et al. | |
| 8,593,133 B2 | 11/2013 | Williams | |
| 2005/0155346 A1 | 5/2005 | Shoji | |
| 2007/0069849 A1* | 3/2007 | Furukawa | B82Y 25/00 338/32 R |
| 2007/0076332 A1 | 4/2007 | Shoji et al. | |

(Continued)

FOREIGN PATENT DOCUMENTS

| | | |
|---|---|---|
| JP | H6-307889 A | 11/1994 |
| JP | H7-92199 A | 4/1995 |

(Continued)

*Primary Examiner* — Jermele M Hollington
*Assistant Examiner* — Feba Pothen
(74) *Attorney, Agent, or Firm* — Finnegan, Henderson, Farabow, Garrett & Dunner, L.L.P.

(57) ABSTRACT

A full bridge circuit comprises first to fourth magnetic resistance elements. The first and fourth magnetic resistance elements have a first polarity, while the second and third magnetic resistance elements have a second polarity. A comparison circuit compares a first value indicating a difference between a potential of a first connecting node and a first potential and a second value indicating a difference between a potential of a second connecting node and a second potential to determine presence/absence of an external magnetic field. An initial magnetization vector of a magnetization free layer of the first magnetic resistance element is the reverse of that of a magnetization free layer of the second magnetic resistance element. An initial magnetization vector of a magnetization free layer of the third magnetic resistance element is the reverse of that of a magnetization free layer of the fourth magnetic resistance element.

9 Claims, 25 Drawing Sheets

(56) References Cited

U.S. PATENT DOCUMENTS

| | | | | |
|---|---|---|---|---|
| 2010/0127803 A1* | 5/2010 | Imai | ............... | B82Y 25/00 333/24 R |
| 2012/0169328 A1 | 7/2012 | Williams | | |
| 2013/0264915 A1 | 10/2013 | Suzuki et al. | | |
| 2013/0265040 A1 | 10/2013 | Ide et al. | | |
| 2014/0292318 A1* | 10/2014 | Wang | ............... | B82Y 25/00 324/228 |

FOREIGN PATENT DOCUMENTS

| | | |
|---|---|---|
| JP | 2005-236134 | 9/2005 |
| JP | 2006-514283 A | 4/2006 |
| JP | 2007-101252 | 4/2007 |
| JP | 2010-91366 A | 4/2010 |
| JP | 2012-122897 | 6/2012 |
| JP | 2012-137457 A | 7/2012 |
| JP | 2012-141301 A | 7/2012 |
| JP | 2012-154823 A | 8/2012 |
| JP | 5540299 | 7/2014 |
| JP | 2014-173970 A | 9/2014 |

\* cited by examiner

FIG. 12
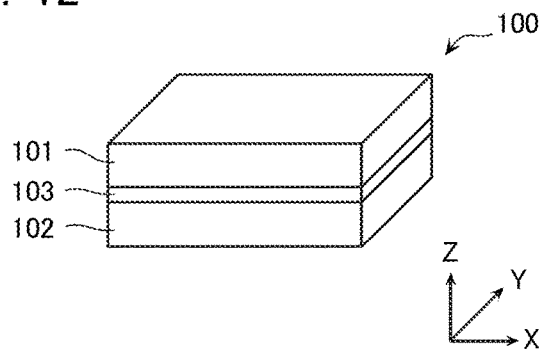
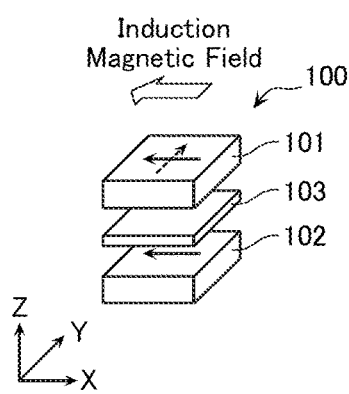
FIG. 13A
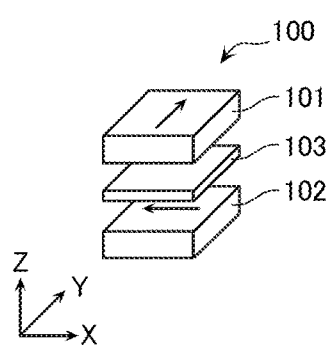
FIG. 13B
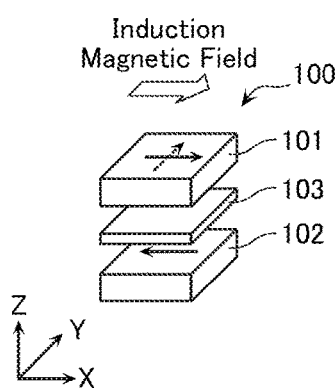
FIG. 13C
FIG. 13D
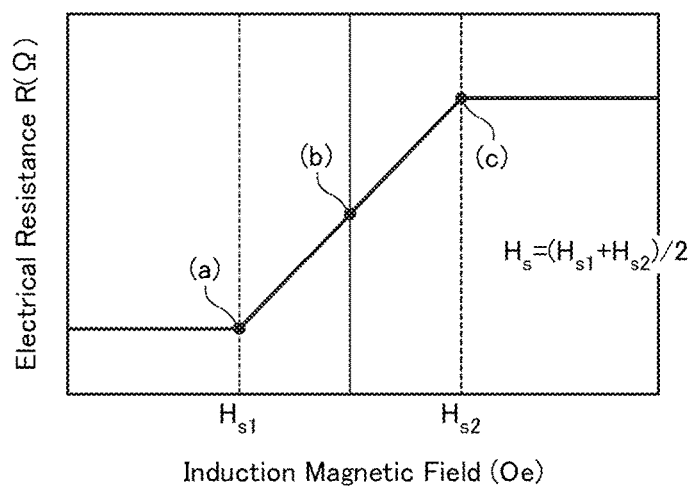

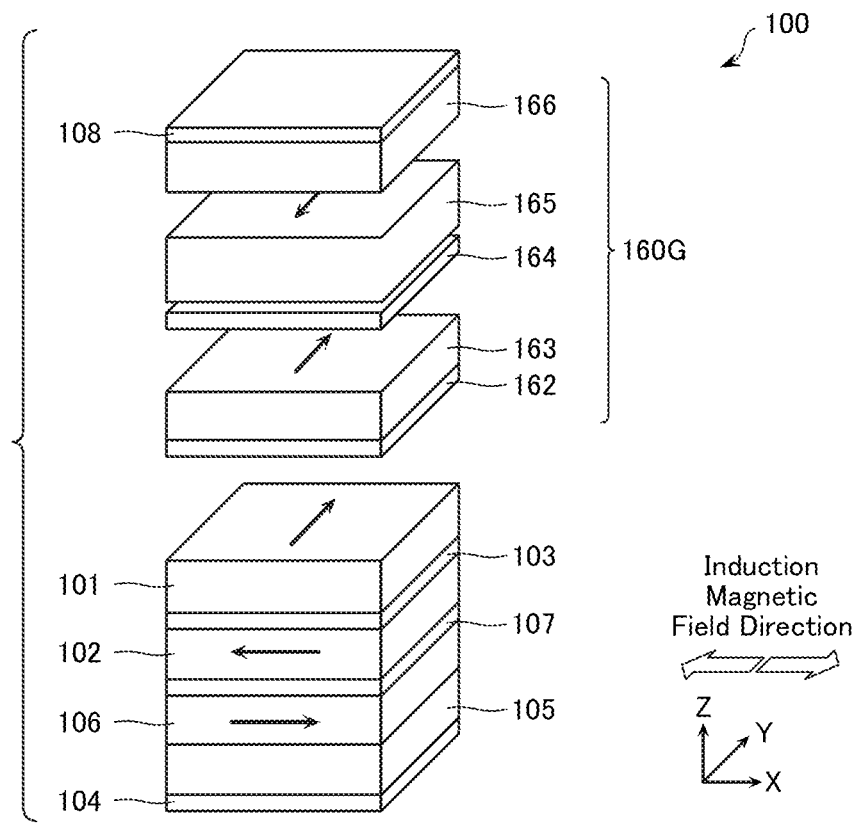
FIG. 22A
FIG. 22B
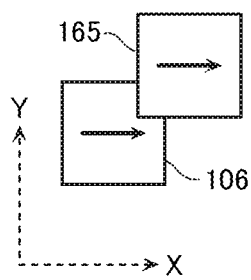
(1) 1st Magnetic Field-Accompanied Annealing  Magnetic Field
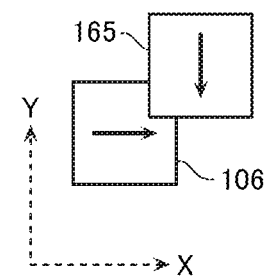
(2) 2nd Magnetic Field-Accompanied Annealing  Magnetic Field
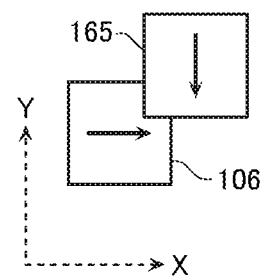
(3) Room Temperature

CURRENT SENSOR AND SMART METER

CROSS REFERENCE TO RELATED APPLICATIONS

This application is based on and claims the benefit of priority from prior Japanese Patent Application NO. 2014-226293, filed on Nov. 6, 2014, the entire contents of which are incorporated herein by reference.

FIELD

The present embodiments relate to a current sensor and to a smart meter installed with the current sensor.

BACKGROUND

In recent years, the introduction of smart meters which are next-generation watt-hour meters that measure electric power digitally and are provided with a communication function within the meter, has continued to be promoted with the object of stability, efficiency, and so on, of electric power supply and demand. There is a need for a current sensor that achieves the broad dynamic range and high resolution that are required in a smart meter, with low power consumption. In order to achieve a high resolution current sensor, it is effective to employ a magnetic resistance element (MR element) having high sensitivity to a magnetic field. However, generally, in an MR element, a resistance value and magnetic field sensitivity of the element end up changing according to an incident magnetic field direction.

A DC magnetic field made incident parallel to a magnetizing moment of a magnetization fixed layer of an MR sensor acts as a DC voltage bias. A component of the DC magnetic field incident perpendicular to the magnetizing moment of the magnetization fixed layer of the MR sensor ends up changing the magnetic field sensitivity of the MR sensor. Due to such an application of bias and change of sensitivity, it may occur that a smart meter ends up displaying a mistaken current value. Moreover, there is a possibility that by applying the MR sensor with a magnetic field from the above-described direction by a magnet or the like, a display of the smart meter, and so on, may be lowered, whereby the sensor performs a mistaken display.

In the conventional technology, in order to prevent a malfunction of the above-described kind, an external magnetic field detection-dedicated magnetic field sensor is separately provided in addition to the current sensor, and a disturbance magnetic field is monitored. However, providing such an external magnetic field detection-dedicated magnetic field sensor in addition to the current sensor leads to an increase in cost of a device.

BRIEF DESCRIPTION OF THE DRAWINGS

FIG. 12 is a schematic perspective view illustrating a schematic configuration of a magnetic resistance element according to the same embodiment.

FIGS. 13A to 13D are schematic views for explaining a function of the magnetic resistance element according to the same embodiment.

FIGS. 22A and 22B are schematic views showing an example of configuration of the current sensor according to the same embodiment.

DETAILED DESCRIPTION

A current sensor according to an embodiment described below comprises a full bridge circuit. The full bridge circuit comprises: a first magnetic resistance element having a first polarity and having a resistance value that increases in accordance with an increase of a magnetic field; a second magnetic resistance element having a second polarity and having a resistance value that decreases in accordance with an increase of the magnetic field; a third magnetic resistance element having the second polarity; and a fourth magnetic resistance element having the first polarity. The first magnetic resistance element and the second magnetic resistance element are connected in series between a first terminal and a second terminal, and the third magnetic resistance element and the fourth magnetic resistance element are connected in series between the first terminal and the second terminal. A differential processing circuit differentially processes a potential between a potential of a first connecting node that connects the first magnetic resistance element and the second magnetic resistance element and a potential of a second connecting node that connects the third magnetic resistance element and the fourth magnetic resistance element. A comparison circuit compares a first value that indicates a difference between the potential of the first connecting node and a first potential and a second value that indicates a difference between the potential of the second connecting node and a second potential, and detects an external magnetic field based on a comparison result. An initial magnetization vector of a magnetization free layer of the first magnetic resistance element is the reverse of an initial magnetization vector of a magnetization free layer of the second magnetic resistance element, and an initial magnetization vector of a magnetization free layer of the third magnetic resistance element is the reverse of an initial magnetization vector of a magnetization free layer of the fourth magnetic resistance element.

Next, current sensors and smart meters according to embodiments will be described in detail with reference to the drawings. Note that magnetic resistance elements employed in the current sensors according to the embodiments below employ a so-called "in-plane magnetization system". As shown in, for example, FIG. 1, in the in-plane magnetization system, a magnetization free layer, a magnetization fixed layer, and a magnetic layer having another magnetization vector have a magnetization vector in a direction perpendicular to a stacking direction of elements (in an XY plane in FIG. 1).

[1. First Embodiment]

[1-1. Overall Configuration]

Figure 1:
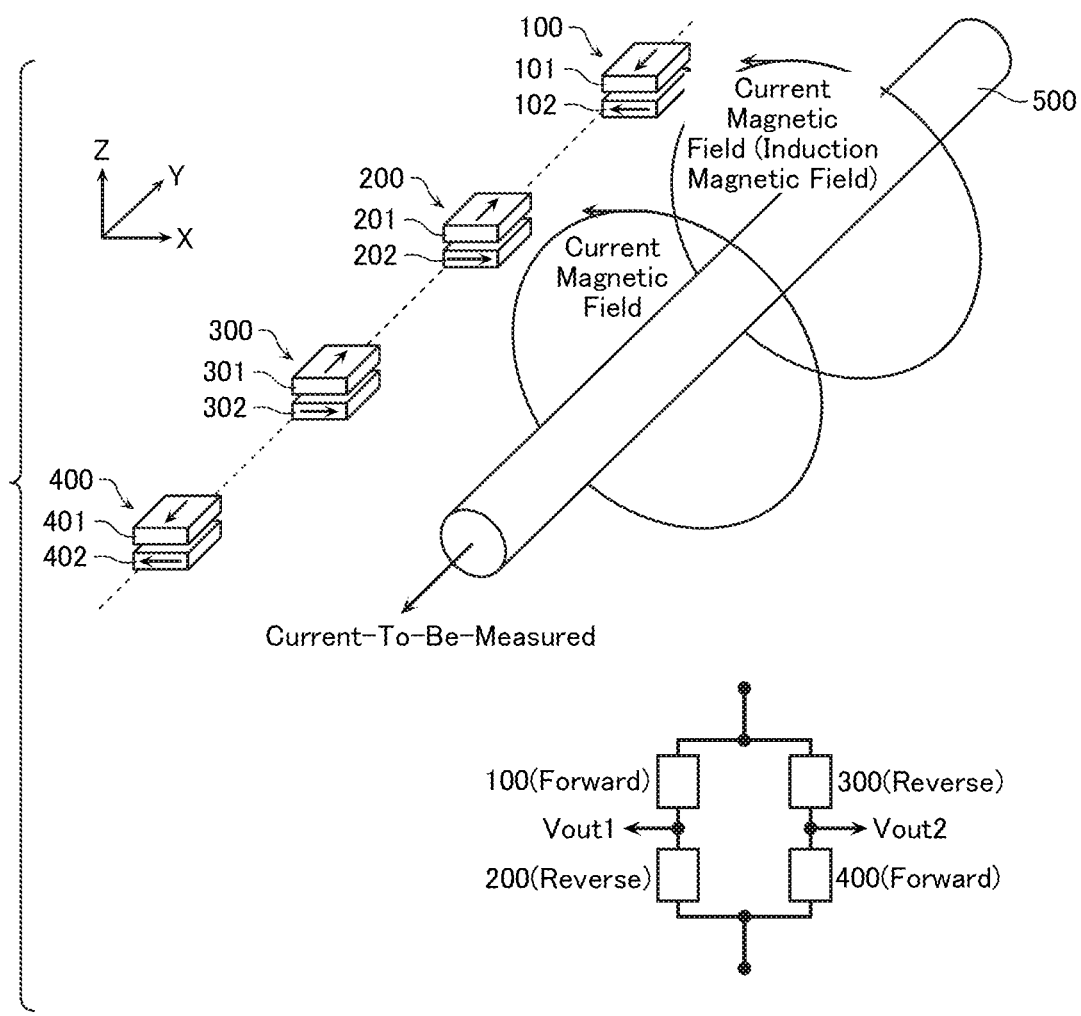
FIG. 1 is a schematic view showing an example of configuration of a current sensor according to a first embodiment.

FIG. 1 is a schematic view showing an example of configuration of a current sensor according to a first embodiment. The current sensor according to the first embodiment includes a first magnetic resistance element 100, a second magnetic resistance element 200, a third magnetic resistance element 300, and a fourth magnetic resistance element 400 that are disposed close to a wiring line W and that have a resistance value that changes by application of a current magnetic field (induction magnetic field) due to a current-to-be-measured flowing in this wiring line W. As shown in the schematic view on the right side in FIG. 1, the first through fourth magnetic resistance elements 100 to 400 are connected so as to configure a full bridge circuit. The first magnetic resistance element 100 and the second magnetic resistance element 200 are connected in series in the full bridge circuit, and moreover the third magnetic resistance element 300 and the fourth magnetic resistance element 400 are connected in series in the full bridge circuit.

The first magnetic resistance element 100 and the fourth magnetic resistance element 400 have a characteristic (referred to below as "forward polarity" or "first polarity") that their resistance value increases due to an increase in the induction magnetic field. On the other hand, contrary to this, the second magnetic resistance element 200 and the third magnetic resistance element 300 have a characteristic (referred to below as "reverse polarity" or "second polarity") that their resistance value decreases due to an increase in the induction magnetic field. Note that the first through fourth magnetic resistance elements 100 to 400 are preferably configured so as to have a substantially identical sensitivity.

The first magnetic resistance element 100, the second magnetic resistance element 200, the third magnetic resistance element 300, and the fourth magnetic resistance element 400 respectively include: first magnetic layers 101, 201, 301, and 401 that operate as magnetization free layers; and second magnetic layers 102, 202, 302, and 402 that operate as magnetization fixed layers.

An amount of increase or amount of decrease of the resistance value with respect to a certain amount of increase of the induction magnetic field will be referred to below as magnetic field sensitivity. If an amount of change of the resistance value of the magnetic resistance element is assumed to be dR, a usual resistance value of the magnetic resistance element is assumed to be R, and a saturation magnetic field of the magnetic resistance element is assumed to be Hs, then magnetic field sensitivity may be expressed by (dR/R)/2Hs. Note that the saturation magnetic field is a magnitude of the magnetic field when the resistance value has ceased changing with respect to a change in the current magnetic field.

Next, a circuit configuration of the current sensor of the first embodiment will be specifically described with reference to FIG. 2. This current sensor comprises a full bridge circuit FB, a preamplifier circuit 500, an analog-to-digital converter 600, a normality/abnormality determination circuit 700 (detection circuit), and an output unit 800.

As previously mentioned, in the current sensor of the first embodiment, the first through fourth magnetic resistance elements 100 to 400 are connected so as to configure the full bridge circuit FB. A power supply voltage V is supplied from a DC power supply between a power supply voltage terminal Np and a ground terminal Ns, whereby the full bridge circuit FB operates.

A connecting node N1 between the first magnetic resistance element 100 and the second magnetic resistance element 200 outputs an output voltage Vout1. On the other hand, a connecting node N2 between the third magnetic resistance element 300 and the fourth magnetic resistance element 400 outputs an output voltage Vout2. In a state where there is no current magnetic field (induction magnetic field) due to the current-to-be-measured and provided there is no variation in resistance values of the four magnetic resistance elements, the output voltages Vout1 and Vout2 each have a value close to half of the power supply voltage V, that is, V/2. On the other hand, if an induction magnetic field occurs whereby resistance values of each of the magnetic resistance elements 100 to 400 change, then the values of the output voltages Vout1 and Vout2 also change.

The preamplifier circuit 500 differentially amplifies these output voltages Vout1 and Vout2 to output an output signal Vp. This output signal Vp (analog signal) is inputted to the analog-to-digital converter 600. This output signal Vp is converted to a digital signal by the analog-to-digital converter 600, a magnitude of the induction magnetic field is determined based on that digital value, and a current value of the current-to-be-measured of the wiring line W is calculated as a result.

The normality/abnormality determination circuit 700, similarly to the preamplifier circuit 500, adopts as its input signals the output voltages Vout1 and Vout2, and on the basis of those values, determines whether an external magnetic field other than the current magnetic field due to the current-to-be-measured of the wiring line W exists or not. That operation will be described in detail later. The output unit 800 has a function of displaying a determination result of the normality/abnormality determination circuit 700, or outputting the determination result as a control signal for controlling another device.

Figure 2:
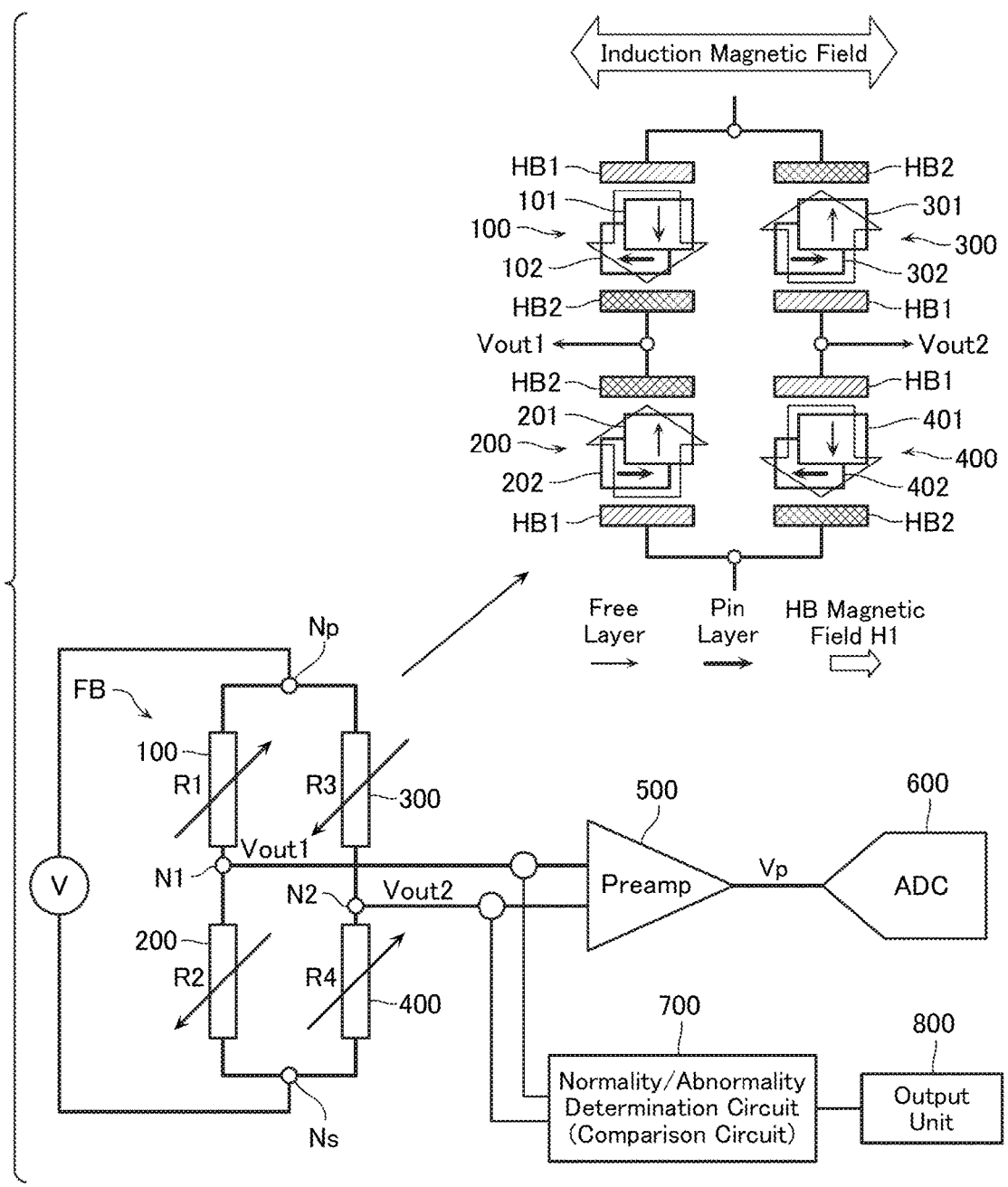
FIG. 2 specifically explains a circuit configuration of the current sensor of the first embodiment.

As shown in FIG. 2, the first through fourth magnetic resistance elements 100 to 400 respectively comprise: the first magnetic layers 101, 201, 301, and 401 acting as magnetization free layers; and the second magnetic layers 102, 202, 302, and 402 acting as magnetization fixed layers. Magnetization direction components parallel or antiparallel to the current magnetic field of the magnetization fixed layers (second magnetic layers 102, 202, 302, and 402) determine whether the first through fourth magnetic resistance elements 100 to 400 have the forward polarity or have the reverse polarity. Moreover, initial magnetization directions at a time of no magnetic field of the magnetization free layers (first magnetic layers 101, 201, 301, and 401) are determined by magnetic bodies HB1 and HB2 accompanying the first through fourth magnetic resistance elements 100 to 400. When the magnetic body HB1 acts as a positive polarity and the magnetic body HB2 acts as a negative polarity, a magnetic field is applied in a direction from the magnetic body HB1 to the magnetic body HB2, and the magnetization direction of the magnetization free layer is determined in this direction. In the example of FIG. 2, magnetization directions are determined such that the first magnetic resistance element 100 and the fourth magnetic resistance element 400 have the forward polarity, and the second magnetic resistance element 200 and the third magnetic resistance element 300 have the reverse polarity.

In addition, initial magnetization vectors of the first magnetic layers 101 and 401 (magnetization free layers) of the first magnetic resistance element 100 and the fourth magnetic resistance element 400 and initial magnetization vectors of the first magnetic layers 201 and 301 (magnetization free layers) of the second magnetic resistance element 200 and the third magnetic resistance element 300 differ by, for example, 180°. That is, whereas the magnetization directions of the magnetization free layers of two magnetic resistance elements aligned diagonally (in an oblique direction) in the full bridge circuit FB are identical, the magnetization directions of the magnetization free layers of two magnetic resistance elements aligned in a lateral direction or a longitudinal direction in the full bridge circuit FB differ by, for example, 180°. By including a full bridge circuit FB of the above configuration and measuring and comparing the output voltages Vout1 and Vout2, the existence of an external magnetic field other than the current magnetic field due to the current-to-be-measured can be detected based on an output of the full bridge circuit FB itself. However, although a maximum effect can be expected when the initial magnetization vectors of the first magnetic layers 101 and 401 (magnetization free layers) of the first magnetic resistance element 100 and the fourth magnetic resistance element 400 and the initial magnetization vectors of the first magnetic layers 201 and 301 (magnetization free layers) of the second magnetic resistance element 200 and the third magnetic resistance element 300 have their directions differing by 180°, there is no need for their directions to necessarily differ by precisely 180°. Regarding the magnetization directions of the magnetization fixed layers, a constant effect can be expected provided those directions are reversed. Here, the directions of both of the initial magnetization vectors are referred to as "reversed", even if they do not differ by precisely 180°. Putting this more specifically, it is only required that a component in a direction perpendicular to the magnetization vector of the magnetization fixed layer of the first magnetic resistance element 100, of the initial magnetization vector of the magnetization free layer of the first magnetic resistance element 100 is made the reverse of a component in a direction perpendicular to the magnetization vector of the magnetization fixed layer of the second magnetic resistance element 200, of the initial magnetization vector of the magnetization free layer of the second magnetic resistance element 200. Moreover, it is only required that a component in a direction perpendicular to the magnetization vector of the magnetization fixed layer of the third magnetic resistance element 300, of the initial magnetization vector of the magnetization free layer of the third magnetic resistance element 300 is made the reverse of a component in a direction perpendicular to the magnetization vector of the magnetization fixed layer of the fourth magnetic resistance element 400, of the initial magnetization vector of the magnetization free layer of the fourth magnetic resistance element 400. In other words, in the description below, simply when "reversed" is used, this should not be interpreted to mean being 180° reversed, and it is sufficient that a reverse component is included in the direction of the magnetization vector of the magnetization fixed layer.

Now, an operating principle of each of the first through fourth magnetic resistance elements 100 to 400 will be described with reference to FIGS. 3 to 7.

Figure 3:
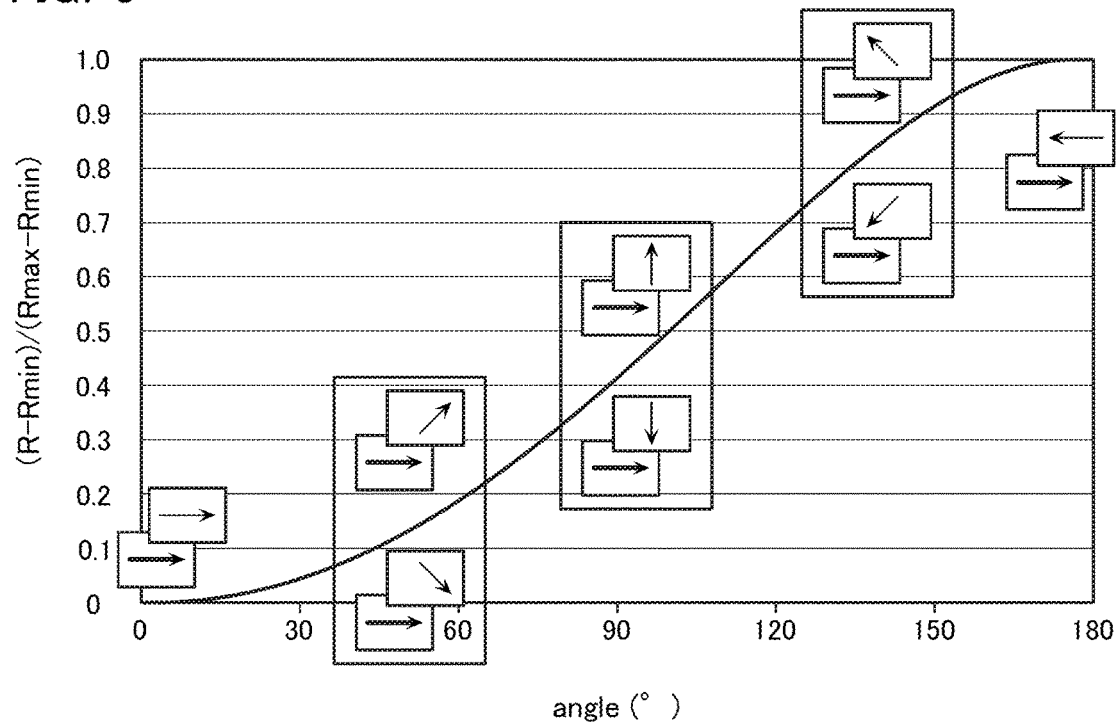
FIG. 3 explains an operating principle of each of first through fourth magnetic resistance elements 100 to 400.
Figure 4:
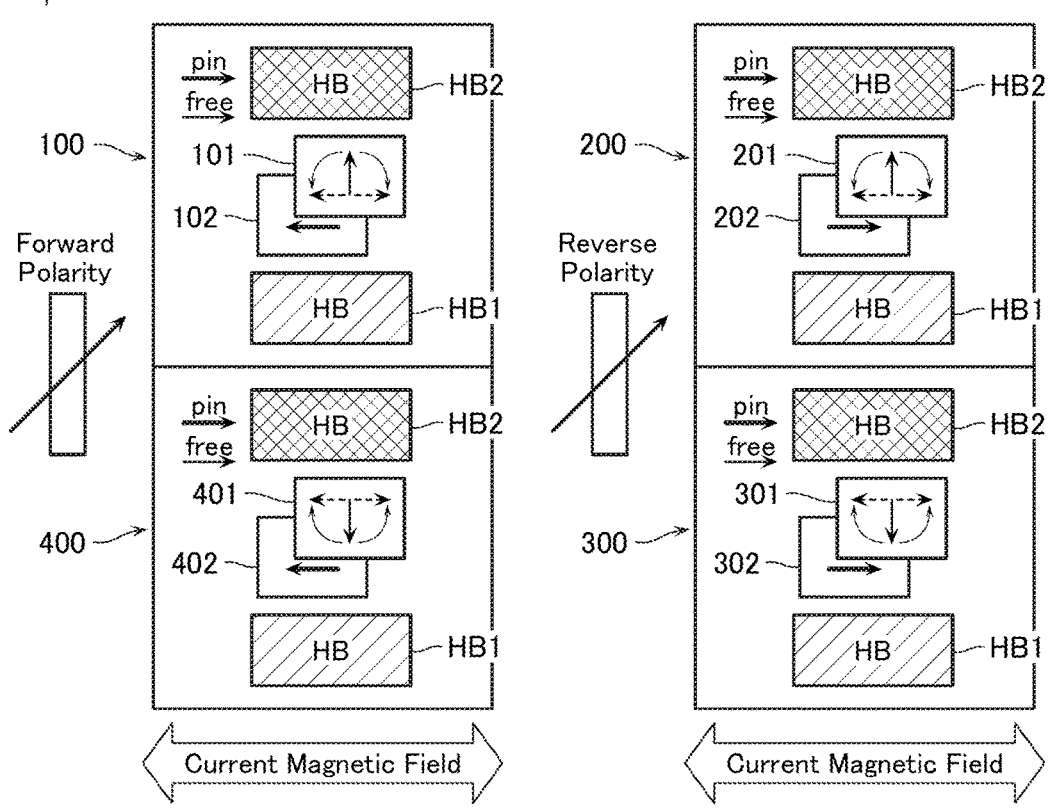
FIG. 4 explains the operating principle of each of the first through fourth magnetic resistance elements 100 to 400.

FIG. 3 is a graph showing a relationship between a resistance value of the magnetic resistance element and a relative change in the magnetization directions of the magnetization free layer and the magnetization fixed layer. FIG. 4 is a conceptual diagram showing a relationship between the magnetization direction of the magnetization fixed layer and an arrangement of the magnetic bodies HB1 and HB2. As shown in FIG. 3, the resistance value of the magnetic resistance element attains a minimum value when the magnetization direction (free) of the magnetization free layer and the magnetization direction (pin) of the magnetization fixed layer are parallel (in an identical direction), and attains a maximum value when these magnetization directions are antiparallel (directions are reversed). In a state between the minimum value and the maximum value, there are cases where the magnetization direction of the magnetization free layer changes clockwise and where it changes anticlockwise, and as shown in FIG. 4, this is determined by the arrangement of the magnetic bodies HB. However, in either case, the same resistance value is shown provided that a relative angle between the magnetization direction of the magnetization free layer and the magnetization direction of the magnetization fixed layer is the same. In other words, in either of the cases where the resistance value of the magnetic resistance element is between the maximum value and the minimum value, two kinds of states of the magnetization directions of the magnetization free layer and the magnetization fixed layer exist.

Figure 5:
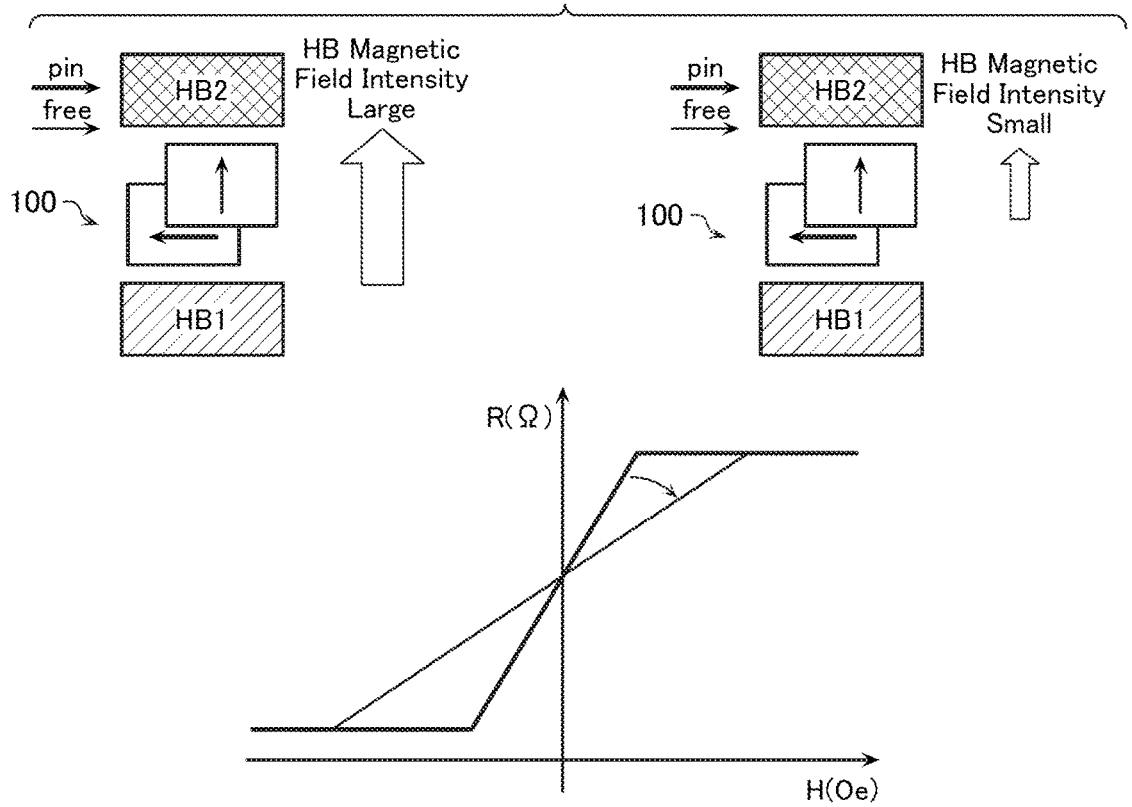
FIG. 5 explains the operating principle of each of the first through fourth magnetic resistance elements 100 to 400.

Next, what kind of change an external magnetic field other than the current magnetic field due to the current-to-be-measured exerts on the change in the resistance value of the magnetic resistance element, will be explained with reference to FIGS. 5 and 6. As previously mentioned, sensitivity to a magnetic field of the magnetic resistance elements 100 to 400 can be adjusted by an intensity of the magnetic field from the magnetic bodies HB1 and HB2. FIG. 5 shows an influence exerted on magnetic field sensitivity of the magnetic resistance element by magnetic field intensity in a direction perpendicular to the magnetization direction of the magnetization fixed layer applied by the magnetic bodies HB1 and HB2. The higher the magnetic field intensity of the magnetic bodies HB1 and HB2, the higher the magnetic field sensitivity to a magnetic field applied parallel to the magnetization direction of the magnetization fixed layer becomes. In other words, a magnetic field component perpendicular to the magnetization direction of the magnetization fixed layer influences sensitivity of the magnetic resistance element.

Figure 6:
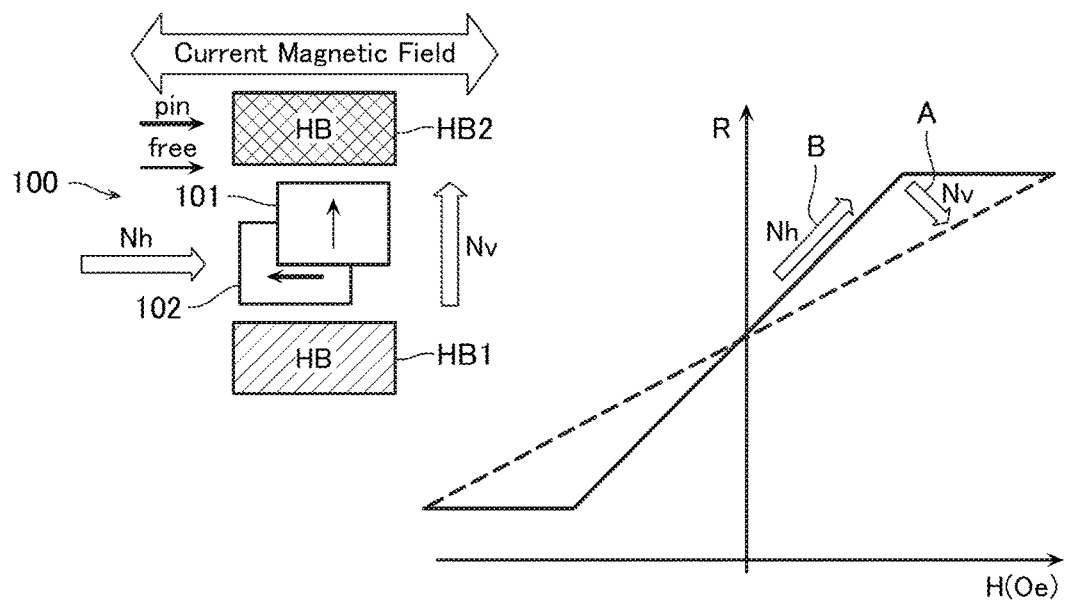
FIG. 6 explains the operating principle of each of the first through fourth magnetic resistance elements 100 to 400.

As shown in FIG. 6, when an external magnetic field Nv in a direction antiparallel to the direction of the magnetic field due to the magnetic bodies HB1 and HB2 is inputted, the magnetization of the magnetization free layer is weakened by this external magnetic field Nv, hence even if the magnetization direction of the magnetization free layer changes by the current magnetic field, the change in the resistance value ends up being smaller. Specifically, whereas the graph expressing the relationship between the magnetic field H and the resistance value R is the thick line graph when there is no external magnetic field Nv, when there is the external magnetic field Nv, the graph is, for example, a graph whose inclination is small as in the thin line graph, and sensitivity of the current sensor ends up being weakened (refer to arrow A in FIG. 6).

On the other hand, when an external magnetic field Nh in a direction perpendicular to the direction of the magnetic field due to the magnetic bodies HB1 and HB2 in inputted, this external magnetic field Nh is in an identical direction to the current magnetic field, hence changes an operation point of the graph (refer to arrow B in FIG. 6).

Figure 7:
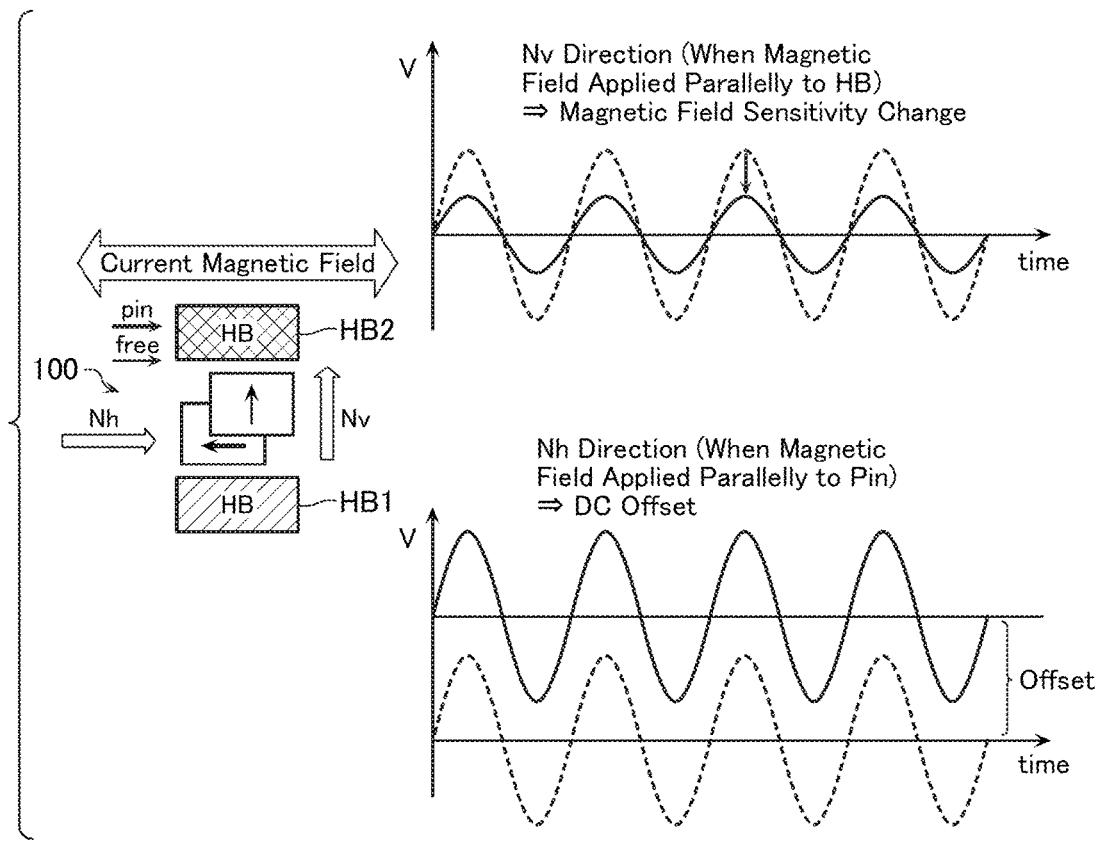
FIG. 7 explains the operating principle of each of the first through fourth magnetic resistance elements 100 to 400.

In this way, the external magnetic fields, that is, magnetic noise Nv and Nh influence sensitivity of the current sensor or change the operation point, by their direction. FIG. 7 is an explanation of the case where a current magnetic field due to an alternating current is applied to the magnetic resistance element simultaneously to an external DC magnetic field Nv or an external DC magnetic field Nh being applied. In the case of the external DC magnetic field Nv being applied, sensitivity of the current sensor is weakened as explained by FIG. 5, hence amplitude is reduced from that of the original output signal. The external DC magnetic field Nh is in an identical direction to the current magnetic field due to the current, hence discrimination of whether a magnetic field due to the current or whether an external magnetic field is difficult. If a measurement current frequency is already-known as in a smart meter, it is possible to determine that another frequency component is an external magnetic field. However, if the frequency is unknown, such a determination cannot be made. Although illustration thereof is omitted, in the case that the external magnetic field is an AC magnetic field, an output signal becomes an output signal superposed according to the frequency of the external magnetic field, in a direction of the external DC magnetic field Nv.

Figure 8:
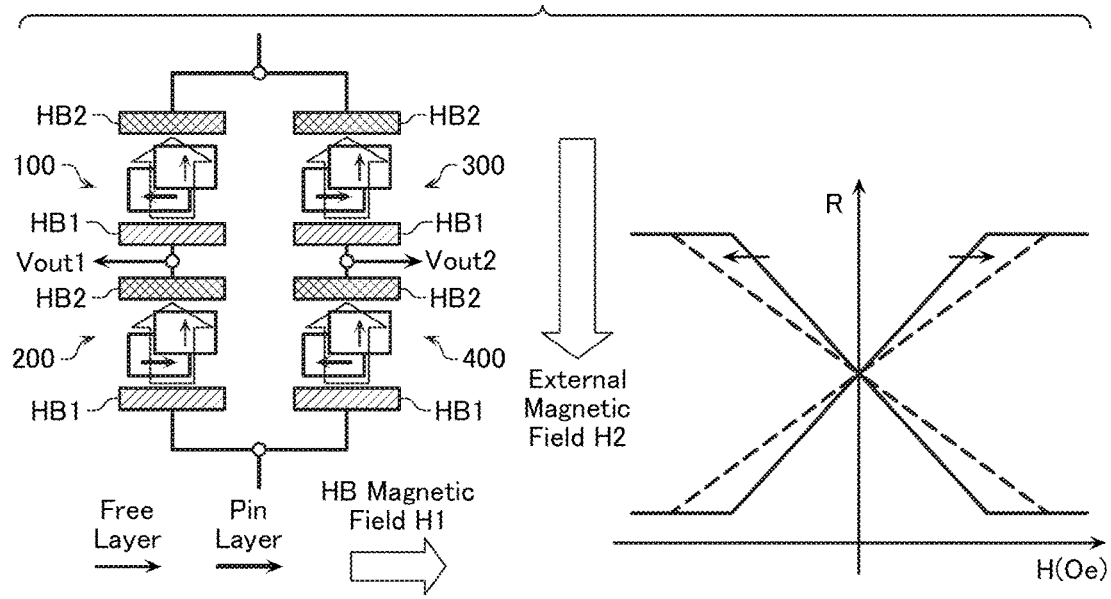
FIG. 8 explains the operating principle of each of the first through fourth magnetic resistance elements 100 to 400.

FIG. 8 shows an example where four magnetic resistance elements having the characteristics explained by FIGS. 3 to 7 are arranged such that each has the magnetic field direction applied by the magnetic bodies HB1 and HB2 aligned and as a result the initial magnetization direction (direction of the initial magnetization vector) of the magnetization free layer of each of the magnetic resistance elements is also directed in an identical direction. In this case, when the illustrated kind of external magnetic field H2 (magnetic field in a direction perpendicular to the magnetization direction of the magnetization fixed layer of the first through fourth magnetic resistance elements 100 to 400) separate from the current magnetic field due to the current-to-be-measured is inputted, the magnetic field applied by the magnetic bodies HB1 and HB2 in all four magnetic resistance elements 100 to 400 is weakened. As a result, as shown in the graph on the right side of FIG. 8, sensitivity is weakened (the inclination of the graph becomes smaller) both in the forward polarity magnetic resistance elements 100 and 400, and at the same time sensitivity is weakened to the same extent also in the reverse polarity magnetic resistance elements 200 and 300. Even if such a situation occurs, a user is unable to discriminate whether the current-to-be-measured has decreased, or whether magnetic field sensitivity of the current sensor has decreased due to an external magnetic field.

Figure 9:
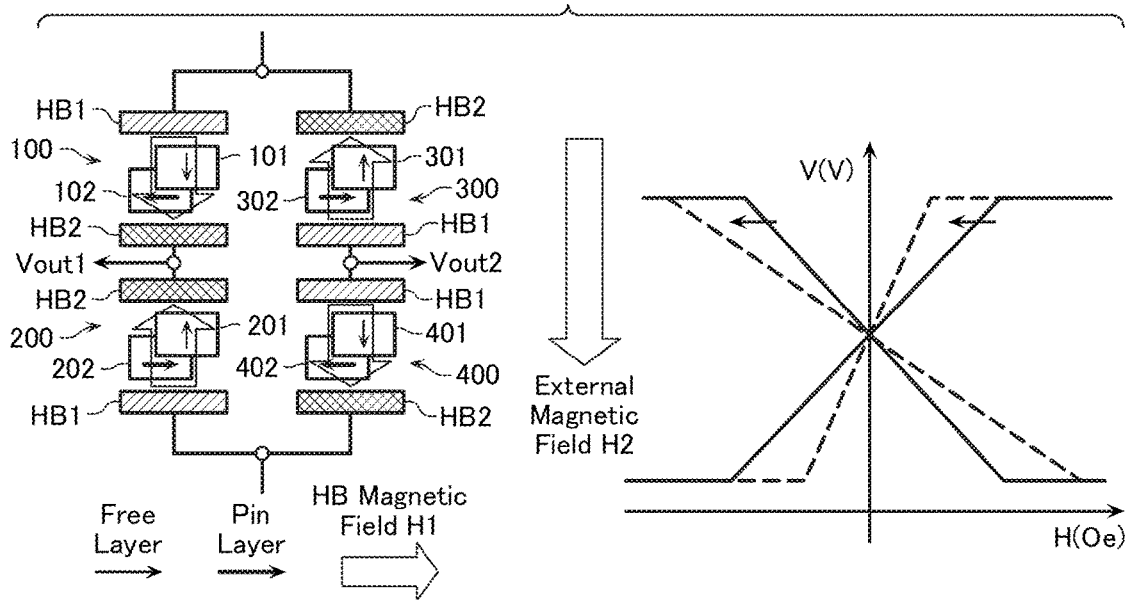
FIG. 9 explains operation of the current sensor of the first embodiment.

Therefore, as previously mentioned, moreover as shown also in FIG. 9, the current sensor of the present embodiment has an arrangement order of the magnetic bodies HB1 and HB2 of the forward polarity magnetic resistance elements 100 and 400 configured in an opposite orientation to an arrangement order of the magnetic bodies HB1 and HB2 of the reverse polarity magnetic resistance elements 200 and 300. As a result, the magnetization direction due to the magnetic bodies HB1 and HB2 of the forward polarity magnetic resistance elements 100 and 400 is made to differ by 180° from the magnetization direction due to the magnetic bodies HB1 and HB2 of the reverse polarity magnetic resistance elements 200 and 300. As a result, the direction of the initial magnetization vector of the magnetization free layer of the forward polarity magnetic resistance elements 100 and 400 differs by 180° from the direction of the initial magnetization vector of the magnetization free layer of the reverse polarity magnetic resistance elements 200 and 300. Due to this configuration, as shown on the right side of FIG. 9, when the forward polarity magnetic resistance elements 100 and 400 are applied with the external magnetic field H2 in the direction perpendicular to the magnetization direction of the magnetization fixed layer, an amount of change of the output voltage Vout1 with respect to change in the magnetic field H (inclination of the graph) becomes smaller, and conversely an amount of change of the output voltage Vout2 with respect to change in the magnetic field H (inclination of the graph) becomes larger. Determining these amounts of change enables detection of the external magnetic field H2.

Figure 10:
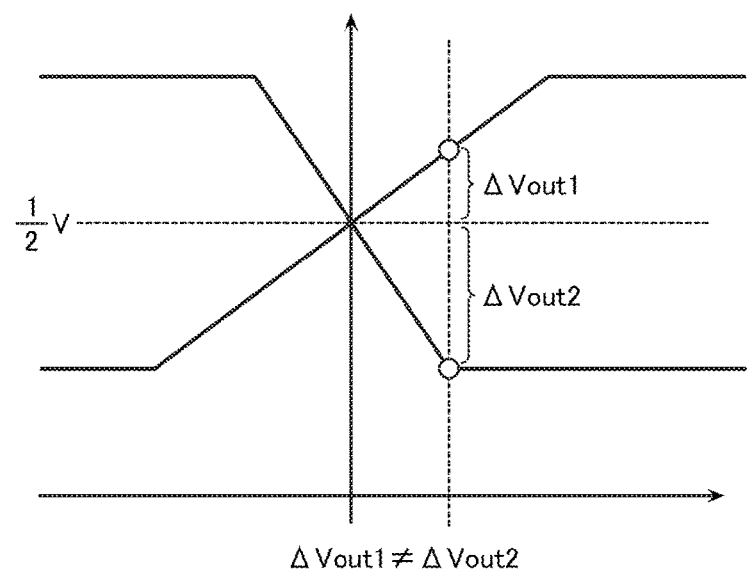
FIG. 10 explains operation of the current sensor of the first embodiment.

The current sensor of the present embodiment utilizes this phenomenon described by FIG. 9 to determine the existence/non-existence of the external magnetic field H2. This point will be described with reference to FIG. 10. Note that FIG. 10 describes as an example the case where a comparison voltage Vout1a=Vout2a=V/2.

Now, a difference between the output voltage Vout1 and the comparison voltage Vout1a with respect to a certain current magnetic field is assumed to be ΔVout1, and a difference between the output voltage Vout2 and the comparison voltage Vout2a with respect to a certain current magnetic field is assumed to be ΔVout2. When the resistance values with no magnetic field of the magnetic resistance elements 100 to 400 are perfectly matched, Vout1a and Vout2a are ½V (V is the power supply voltage). In reality, the resistance values with no magnetic field of the magnetic resistance elements 100 to 400 are not perfectly matched, hence the comparison voltage Vout1a is a value of the output voltage Vout1 with no magnetic field, and the comparison voltage Vout2a is a value of the output voltage Vout2 with no magnetic field. However, even in the latter case, the comparison voltages Vout1a and Vout2a may be set to V/2.

If the external magnetic field H2 does not exist and measurement sensitivities of the magnetic resistance elements 100 to 400 are the same, then ΔVout1 and ΔVout2 are substantially equal.

On the other hand, as the external magnetic field H2 increases, a difference ΔV between values of ΔVout1 and ΔVout2 gradually increases due to the phenomenon shown by FIG. 9. The normality/abnormality determination circuit 700 can determine whether this potential difference ΔV is larger than a threshold voltage or not, to determine a degree of abnormality.

Figure 11A:
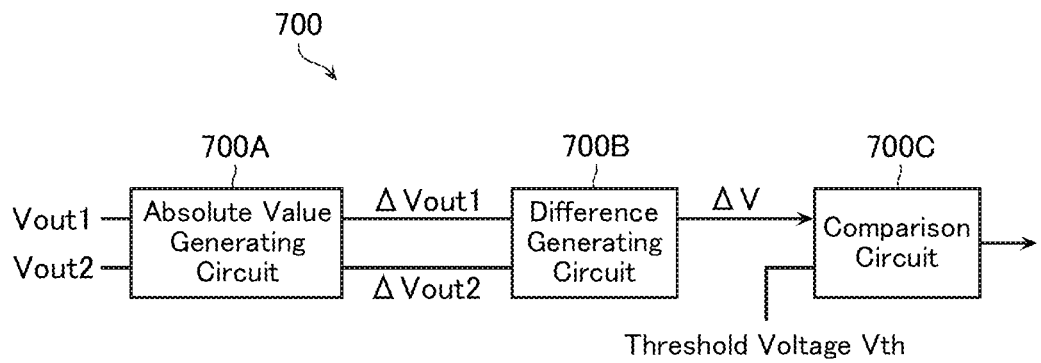
FIG. 11A is a circuit diagram showing a specific example of configuration of a normality/abnormality determination circuit 700 in the current sensor of the first embodiment.

FIG. 11A is a functional block diagram showing a configuration of the normality/abnormality determination circuit 700. This normality/abnormality determination circuit 700 is configured from an absolute value generating circuit 700A, a difference generating circuit 700B, and a comparison circuit 700C.

The absolute value generating circuit 700A is a circuit that calculates voltages ΔVout1 and ΔVout2 which are absolute values of differences of the output voltages Vout1 and Vout2 and the comparison voltages Vout1a and Vout2a. That is, the absolute value generating circuit 700A functions as a first differential processing circuit that differentially processes the voltage Vout1 and the comparison voltage Vout1a to generate the absolute value ΔVout1, and as a second differential processing circuit that differentially amplifies the voltage Vout2 and the comparison voltage Vout2a to generate the absolute value ΔVout2.

Moreover, the difference generating circuit 700B is a circuit that generates the voltage ΔV as a difference of the voltage ΔVout1 and the voltage ΔVout2. That is, the difference generating circuit 700B functions as a third differential processing circuit that differentially processes the absolute values ΔVout1 and ΔVout2. In addition, the comparison circuit 700C is a circuit (fourth differential processing circuit) that compares the voltage ΔV and a threshold voltage Vth to determine which is larger or smaller thereof (perform differential processing thereof), and outputs that result.

Figure 11B:
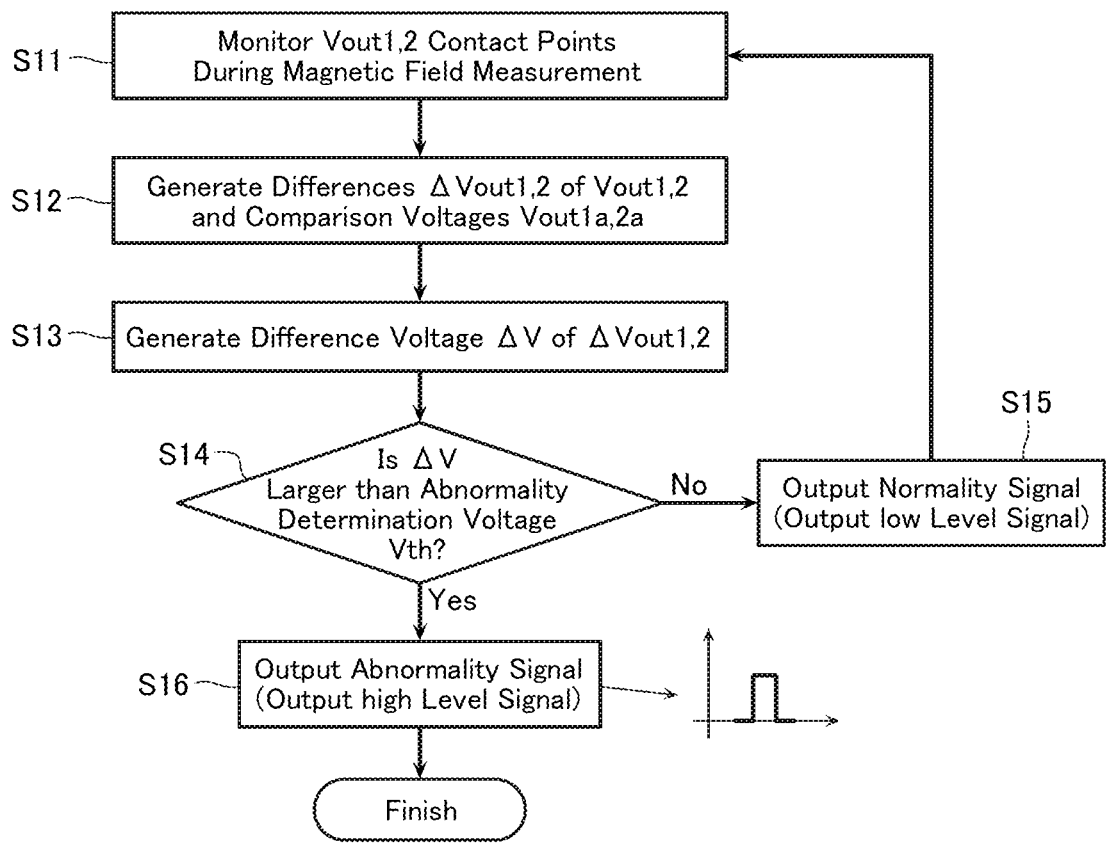
FIG. 11B is a circuit diagram showing a specific example of configuration of the normality/abnormality determination circuit 700 in the current sensor of the first embodiment.

A determination flow by the normality/abnormality determination circuit 700 is shown in FIG. 11B. First, the output voltages Vout1 and Vout2 during magnetic field measurement of the present embodiment are inputted to the absolute value generating circuit 700A (S11). Then, the absolute value generating circuit 700A generates the voltages ΔVout1 and ΔVout2 which are absolute values of differences of the output voltages Vout1 and Vout2 and the comparison voltages Vout1a and Vout2a (S12). Then, the difference generating circuit 700B generates the voltage ΔV as a difference of the voltage ΔVout1 and the voltage ΔVout2 (S13).

When the voltage ΔV is thus obtained, the comparison circuit 700C compares the voltage ΔV and the threshold voltage Vth (S14). If, as a result of comparison, the voltage ΔV is smaller than the threshold voltage Vth, then there is determined to be no influence of the external magnetic field H2 and the comparison circuit 700C outputs a signal Low. A normality signal is outputted from an output circuit (not illustrated in FIG. 11A) based on this signal Low (S15). On the other hand, if, as a result of comparison, the voltage ΔV is larger than the threshold voltage Vth, then the external magnetic field H2 influencing measurement accuracy is assumed to exist, and the comparison circuit outputs a signal High. An abnormality signal is outputted from the output circuit based on this signal High (S16).

Figure 11C:
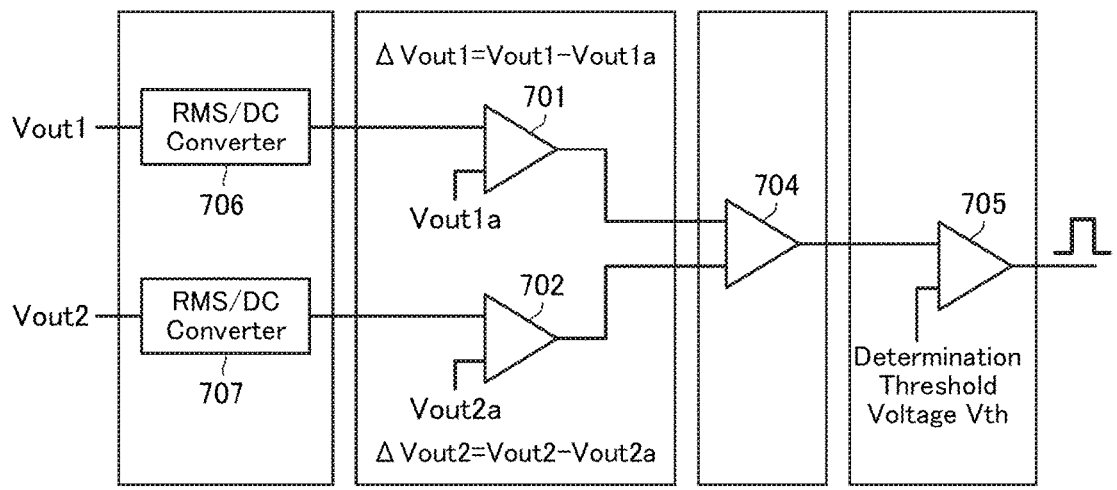
FIG. 11C is a circuit diagram showing a specific example of configuration of the normality/abnormality determination circuit 700 in the current sensor of the first embodiment.

FIG. 11C is a circuit diagram showing a specific example of configuration of the normality/abnormality determination circuit 700. This normality/abnormality determination circuit 700 comprises: differential amplifiers 701 and 702; an inverter 703; and differential amplifiers 704 and 705.

The differential amplifier 701 performs a differential amplification with the output voltage Vout1 and V/2 as its input signals to output the voltage ΔVout1. The differential amplifier 702 and the inverter 703 perform a differential amplification with the output voltage Vout2 and V/2 as input signals, and then invert to output the voltage ΔVout2.

The differential amplifier 704 differentially amplifies the voltages ΔVout1 and ΔVout2 to generate the voltage ΔV. The differential amplifier 705 outputs a signal indicating presence/absence of an external magnetic field, based on a difference between this voltage ΔV and a threshold voltage.

FIG. 11C is a circuit diagram showing a specific example of configuration of the normality/abnormality determination circuit 700. The normality/abnormality determination circuit 700 in this example comprises: RMS/DC converters 706 and 707; the differential amplifiers 701 and 702; the inverter 703; and the differential amplifiers 704 and 705.

The RMS/DC converters 706 and 707 are circuits that output a root-mean-square value DC voltage (DC) with respect to an inputted signal. When the input signal is an AC signal, that AC signal is converted to a DC signal having a root-mean-square value of the AC signal. During actual use of the current sensor, the case of a measurement current being an AC current is also assumed. Determination by an effective voltage (RMS value) of the AC signal is performed because determination by an instantaneous value of an AC signal is difficult. Note that even when the signal is a DC signal, output of the effective voltage is possible.

The differential amplifier 701 performs a differential amplification with the output voltage Vout1 and V/2 as its input signals to output the voltage ΔVout1. The differential amplifier 702 and the inverter 703 perform a differential amplification with the output voltage Vout2 and V/2 as input signals, and then invert to output the voltage ΔVout2.

The differential amplifier 704 differentially amplifies the voltages ΔVout1 and ΔVout2 to generate the voltage ΔV. The differential amplifier 705 outputs a signal indicating presence/absence of an external magnetic field, based on a difference between this voltage ΔV and a threshold voltage.

Figure 11D:
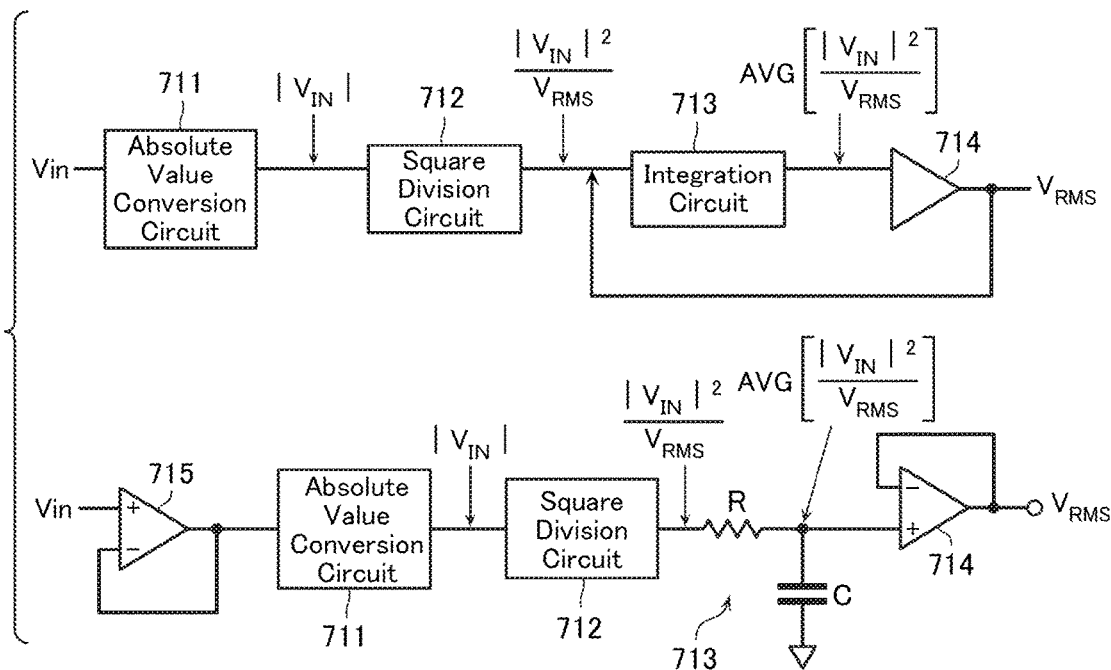
FIG. 11D is a circuit diagram showing a specific example of configuration of the normality/abnormality determination circuit 700 in the current sensor of the first embodiment.

The upper view of FIG. 11D is a circuit diagram showing a specific example of configuration of the RMS/DC converters 706 and 707. The lower view is an even more specific circuit diagram of the upper view.

These RMS/DC converters 706 and 707 comprise: an absolute value conversion circuit 711; a square division circuit 712; an integration circuit 713; and a voltage follower circuit 714. An input side may further comprise a voltage follower circuit 715, as in the lower view.

The absolute value conversion circuit 711 has a function of converting an input voltage Vin to an absolute value |Vin|. The square division circuit 712 outputs a value of the absolute value |Vin| squared and divided by the root-mean-square value. The integration circuit 713 outputs an integration value of this square division circuit 712 integrated at a certain period.

[1-2. Operating Principle of Magnetic Resistance Element]

FIG. 12 is a schematic perspective view illustrating a schematic configuration of the magnetic resistance element employed in the current sensor according to the present embodiment. For example, the first magnetic resistance element 100 includes: the first magnetic layer 101; the second magnetic layer 102; an intermediate layer 103 provided between the first magnetic layer and the second magnetic layer; and an electrode layer not illustrated. Note that the second, third, and fourth magnetic resistance elements 200, 300, and 400 are configured substantially similarly to the first magnetic resistance element 100, hence descriptions thereof will be omitted.

The intermediate layer 103 is, for example, a non-magnetic layer. The first magnetic layer 101 is, for example, a magnetization free layer whose magnetization freely changes. The second magnetic layer 102 is, for example, a magnetization fixed layer whose magnetization is fixed. The initial magnetization vectors of the first magnetic layers 101 and 401 (magnetization free layers) of the first magnetic resistance element 100 and the fourth magnetic resistance element 400 and the initial magnetization vectors of the first magnetic layers 201 and 301 (magnetization free layers) of the second magnetic resistance element 200 and the third magnetic resistance element 300 have directions that differ from each other by 180°.

The first magnetic resistance element 100 is a GMR (Giant Magneto Resistance) element when the intermediate layer 103 is formed by a conductive material, and is a TMR (Tunneling Magneto Resistance) element when the intermediate layer 103 is formed by an insulating material. In the case of being a GMR element, the first magnetic resistance element 100 is sometimes a CPP-GMR element where current flows in a direction perpendicular to a film surface, and is sometimes a CIP-GMR element where current flows in a direction within a film surface. In the case that the first magnetic resistance element 100 is a TMR element, current flows in a direction perpendicular to a film surface. Moreover, the first magnetic resistance element 100 may be an AMR element.

FIGS. 13A to 13D are schematic views explaining a function of a magnetic field being detected by the magnetic resistance element used in the present embodiment. Description hereafter exemplifies the case where the first magnetic layer 101 is a magnetization free layer, and the second magnetic layer 102 is a magnetization fixed layer.

The function of a magnetic field being detected by the magnetic resistance element is based on an "MR effect". The "MR effect" appears in a stacked film of the first magnetic layer 101, the intermediate layer 103, and the second magnetic layer 102. The "MR effect" is a phenomenon that when an external magnetic field is applied in a stacked film including a magnetic body, a value of electrical resistance of the stacked film changes due to a change in magnetization of the magnetic body.

As shown in FIG. 13B, in an initial state when the induction magnetic field is not applied to the first magnetic resistance element 100, magnetization directions of the first magnetic layer 101 and the second magnetic layer 102 have certain angles. As will be described later, the magnetization direction of the second magnetic layer 102 is fixed by the likes of an antiferromagnetic layer adjacent in a stacking direction, and the magnetization direction of the first magnetic layer 101 is set to a certain inclination by the likes of a first linear response magnetic body 160 or a direction of a magnetic field during annealing, and so on.

As shown in FIGS. 13A and 13C, the magnetization direction of the first magnetic layer 101 changes by the induction magnetic field being applied to the first magnetic resistance element 100. As a result, a relative angle of the magnetization directions of the first magnetic layer 101 and the second magnetic layer 102 changes.

When a current is passed through the first magnetic resistance element 100, the change in the relative angle of the magnetization directions appears as a resistance change. When resistance of a low-resistance state is assumed to be R, and an amount of change in electrical resistance changing by the MR effect is assumed to be ΔR, then ΔR/R is referred to as "MR change rate". When a positive magnetic resistance effect occurs due to the combination of materials of the first magnetic layer 101, the intermediate layer 103, and the second magnetic layer 102, the electrical resistance decreases with decrease in the relative angle of the magnetization directions of the first magnetic layer 101 and the second magnetic layer 102. On the other hand, when a negative magnetic resistance effect occurs due to the combination of materials of the first magnetic layer 101, the intermediate layer 103, and the second magnetic layer 102, the electrical resistance increases with decrease in the relative angle of the magnetization directions of the first magnetic layer 101 and the second magnetic layer 102.

In the example shown in FIG. 13D, a positive magnetic resistance effect is exemplified. In a magnetic resistance element such as a GMR element or a TMR element, the "MR change rate" is extremely large, hence sensitivity to a magnetic field is higher compared to in a Hall element. Moreover, as illustrated in FIG. 13D, the magnetic resistance element has a dynamic range of electrical resistance change with respect to the magnetic field that assumes a minimum value of resistance when the magnetization free layer and magnetization fixed layer are parallel and a maximum value of resistance when the magnetization free layer and magnetization fixed layer are antiparallel. As shown in FIG. 13D, the dynamic range of the magnetic resistance element is defined by 2Hs.

[1-3. Example of Configuration of Magnetic Resistance Element]

An example of configuration of the magnetic resistance element according to the present embodiment will be described below. FIGS. 14A to 14D are schematic perspective views illustrating the magnetic resistance element employed in the current sensor according to the present embodiment. Note that below, a description of "material A/material B" indicates a state where a layer of material B is provided on a layer of material A. Note that in the description below, the first magnetic resistance element 100 will be taken as an example, but the second through fourth magnetic resistance elements 200, 300, and 400 may also be similarly configured, and when other magnetic resistance elements are further provided, these may also be similarly configured.

Figure 14A:
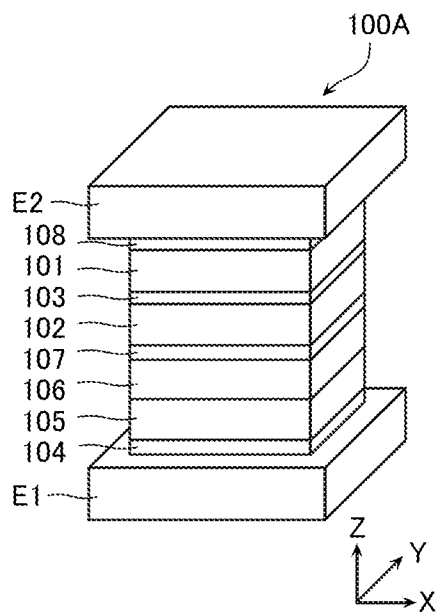
FIGS. 14A to 14D are schematic perspective views illustrating the magnetic resistance element according to the same embodiment.

FIG. 14A is a schematic perspective view illustrating a first magnetic resistance element 100A employed in a certain embodiment. As indicated in FIG. 14A, the first magnetic resistance element 100A includes, aligned sequentially therein: a lower electrode E1; a base layer 104; a pinning layer 105; a second magnetization fixed layer 106; a magnetic coupling layer 107; the second magnetic layer 102; the intermediate layer 103; the first magnetic layer 101; a cap layer 108; and an upper electrode E2.

In this example, the first magnetic layer 101 functions as a magnetization free layer, and the second magnetic layer 102 functions as a first magnetization fixed layer. The first magnetic resistance element 100A of FIG. 14A is called a bottom spin valve type.

Employed in the base layer 104 is, for example, Ta/Ru. A thickness (length in a Z axis direction) of a Ta layer thereof is, for example, 3 nm. A thickness of a Ru layer thereof is, for example, 2 nm. Employed in the pinning layer 105 is, for example, an IrMn layer having a thickness of 7 nm. Employed in the second magnetization fixed layer 106 is, for example, a $Co_{75}Fe_{25}$ layer having a thickness of 2.5 nm. Employed in the magnetic coupling layer 107 is, for example, a Ru layer having a thickness of 0.9 nm. Employed in the first magnetization fixed layer 102 is, for example, a $Co_{40}Fe_{40}B_{20}$ layer having a thickness of 3 nm. Employed in the intermediate layer 103 is, for example, a MgO layer having a thickness of 1.6 nm. Employed in the first magnetic layer 101 is, for example, $Co_{40}Fe_{40}B_{20}/Ni_{80}Fe_{20}$. A stacked body of $Co_{40}Fe_{40}B_{20}$ having a thickness of 2 nm and $Ni_{80}Fe_{20}$ having a thickness of 8 nm is employed. Employed in the cap layer 108 is, for example, Ta/Ru. A thickness of a Ta layer thereof is, for example, 1 nm. A thickness of a Ru layer thereof is, for example, 5 nm.

Employed in the lower electrode E1 and the upper electrode E2 is, for example, at least one of aluminum (Al), an aluminum copper alloy (Al—Cu), copper (Cu), silver (Ag), and gold (Au). Employing such materials having a comparatively small electrical resistance as the lower electrode E1 and the upper electrode E2 makes it possible to pass a current efficiently through the first magnetic resistance element 100A.

The lower electrode E1 may have a structure in which a layer of at least one of Al, Al—Cu, Cu, Ag, and Au is provided between a lower electrode E1-dedicated base layer (not illustrated) and cap layer (not illustrated). For example, employed in the lower electrode E1 is the likes of tantalum (Ta)/copper (Cu)/tantalum (Ta). Employing Ta as the lower electrode E1-dedicated base layer makes it possible to improve adhesion between layers configuring the lower electrode E1, for example. Titanium (Ti) or titanium nitride (TiN), and so on, may be employed as the lower electrode E1-dedicated base layer. Employing tantalum Ta as the lower electrode E1-dedicated cap layer makes it possible to prevent oxidation of the likes of copper (Cu) below that cap layer. Titanium (Ti) or titanium nitride (TiN), and so on, may be employed as the lower electrode E1-dedicated cap layer.

A stacked structure of a buffer layer (not illustrated) and a seed layer (not illustrated) may be employed in the base layer 104. This buffer layer eases surface roughness of the lower electrode E1 and improves crystallinity of a layer stacked on the buffer layer, for example.

Employed as the buffer layer is, for example, at least one selected from the group configured by tantalum (Ta), titanium (Ti), vanadium (V), tungsten (W), zirconium (Zr), hafnium (Hf), and chromium (Cr). An alloy including at least one material selected from these materials may be employed as the buffer layer.

A thickness of the buffer layer is preferably not less than 1 nm and not more than 10 nm. The thickness of the buffer layer is more preferably not less than 1 nm and not more than 5 nm. If the buffer layer is too thin, a buffer effect is lost. If the buffer layer is too thick, the first magnetic resistance element 100A becomes excessively thick. The seed layer is formed on the buffer layer, and that seed layer may have a buffer effect. The buffer layer may be omitted. Employed in the buffer layer is, for example, a Ta layer having a thickness of 3 nm.

The seed layer not illustrated controls crystalline orientation of a layer stacked on the seed layer. The seed layer controls grain size of the layer stacked on the seed layer. Employed as the seed layer are the likes of a metal of fcc structure (Face-Centered Cubic Structure), hcp structure (Hexagonal Close-Packed Structure), or bcc structure (Body-Centered Cubic Structure).

Employing ruthenium (Ru) of hcp structure, or NiFe of fcc structure, or Cu of fcc structure as the seed layer makes it possible to set the crystalline orientation of a spin valve film on the seed layer to an fcc (111) orientation, for example. Employed in the seed layer is, for example, a Cu layer having a thickness of 2 nm, or a Ru layer having a thickness of 2 nm. When raising crystalline orientation of the layer formed on the seed layer, a thickness of the seed layer is preferably not less than 1 nm and not more than 5 nm. The thickness of the seed layer is more preferably not less than 1 nm and not more than 3 nm. As a result, a function as a seed layer of improving crystalline orientation is sufficiently displayed. On the other hand, when, for example, there is no need to cause crystalline orientation of the layer formed on the seed layer (when, for example, forming an amorphous magnetization free layer, and so on), the seed layer may be omitted. Employed as the seed layer is, for example, a Ru layer having a thickness of 2 nm.

The pinning layer 105 gives unidirectional anisotropy to a ferromagnetic layer formed on the pinning layer 105, and thereby fixes magnetization of that ferromagnetic layer. In the example shown in FIG. 14A, the pinning layer 105 gives unidirectional anisotropy to a ferromagnetic layer of the second magnetization fixed layer 106 formed on the pinning layer 105, and thereby fixes magnetization of that ferromagnetic layer. Employed in the pinning layer 105 is, for example, an antiferromagnetic layer. Employed in the pinning layer 105 is, for example, at least one selected from the group configured by Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. It is also possible to employ an alloy having an additional element further added to the Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. A thickness of the pinning layer 105 is appropriately set to give sufficiently strong unidirectional anisotropy.

In order to perform fixing of magnetization of the ferromagnetic layer contacting the pinning layer 105, heat treatment during magnetic field application is performed. Magnetization of the ferromagnetic layer contacting the pinning layer 105 is fixed in a direction of the magnetic field applied during the heat treatment. Annealing temperature is set to, for example, a temperature higher than a magnetization fixing temperature of an antiferromagnetic material employed in the pinning layer 105. Moreover, when an antiferromagnetic layer including Mn is employed, Mn sometimes diffuses to a layer other than the pinning layer 105 to lower the MR change rate. Hence, the annealing temperature is desirably set to not more than a temperature at which diffusion of Mn occurs. The annealing temperature may be set to, for example, not less than 200° C. and not more than 500° C. Preferably, it may be set to, for example, not less than 260° C. and not more than 400° C.

When Pt—Mn or Pd—Pt—Mn are employed as the pinning layer 105, the thickness of the pinning layer 105 is preferably not less than 8 nm and not more than 20 nm. The thickness of the pinning layer 105 is more preferably not less than 10 nm and not more than 15 nm. When IrMn is employed as the pinning layer 105, unidirectional anisotropy may be given by a pinning layer 105 which is thinner than when PtMn is employed as the pinning layer 105. In this case, the thickness of the pinning layer 105 is preferably not less than 4 nm and not more than 18 nm. The thickness of the pinning layer 105 is more preferably not less than 5 nm and not more than 15 nm. Employed in the pinning layer 105 is, for example, an $Ir_{22}Mn_{78}$ layer having a thickness of 7 nm. When the $Ir_{22}Mn_{78}$ layer is employed, heat treatment may be performed for one hour at 320° C. while applying a magnetic field of 10 kOe, as magnetic field-accompanied heat treatment conditions. When a $Pt_{50}Mn_{50}$ layer is employed, heat treatment may be performed for 10 hours at 320° C. while applying a magnetic field of 10 kOe, as magnetic field-accompanied heat treatment conditions.

Configurable as the second magnetization fixed layer 106 is, for example, at least one of Fe, Co, and Ni, or an alloy including at least one kind thereof. Moreover, a material having an additional element added to these materials may also be configured as the second magnetization fixed layer 106.

Employed in the second magnetization fixed layer 106 is, for example, a $Co_xFe_{100-x}$ alloy (where x is not less than 0 at. % and not more than 100 at. %), a $Ni_xFe_{100-x}$ alloy (where x is not less than 0 at. % and not more than 100 at. %), or a material having a non-magnetic element added to these alloys. Employed as the second magnetization fixed layer 106 is, for example, at least one selected from the group configured by Co, Fe, and Ni. It is also possible to employ as the second magnetization fixed layer 106 an alloy including at least one material selected from these materials.

A thickness of the second magnetization fixed layer 106 is preferably not less than 1.5 nm and not more than 5 nm, for example. As a result, for example, intensity of the unidirectional anisotropic magnetic field due to the pinning layer 105 can be more greatly strengthened. For example, intensity of an antiferromagnetic coupling magnetic field between the second magnetization fixed layer 106 and the first magnetization fixed layer 102 can be more greatly strengthened, via the magnetic coupling layer 107 formed on the second magnetization fixed layer 106. Magnetic film thickness (product (Bs·t) of saturation magnetization Bs and thickness t) of the second magnetization fixed layer 106 is preferably substantively equal to magnetic film thickness of the first magnetization fixed layer 102.

Saturation magnetization of $Co_{40}Fe_{40}B_{20}$ with a thin film is approximately 1.9 T (tesla). For example, when a $Co_{40}Fe_{40}B_{20}$ layer having a thickness of 3 nm is employed as the first magnetization fixed layer 102, the magnetic film thickness of the first magnetization fixed layer 102 is 1.9 T×3 nm, that is, 5.7 Tnm. On the other hand, saturation magnetization of $Co_{75}Fe_{25}$ is approximately 2.1 T. The thickness of the second magnetization fixed layer 106 at which a magnetic film thickness equal to that described above can be obtained is 5.7 Tnm/2.1 T, that is, 2.7 nm. In this case, $Co_{75}Fe_{25}$ having a thickness of approximately 2.7 nm is preferably employed in the second magnetization fixed layer 106. Employed as the second magnetization fixed layer 106 is, for example, a $Co_{75}Fe_{25}$ layer having a thickness of 2.5 nm.

In the first magnetic resistance element 100A shown in FIG. 14A, a synthetic pin structure of the second magnetization fixed layer 106, the magnetic coupling layer 107, and the first magnetization fixed layer 102 is employed. Instead, a single pin structure configured from a single-layer magnetization fixed layer may be employed. When the single pin structure is employed, a $Co_{40}Fe_{40}B_{20}$ layer having a thickness of 3 nm, for example, is employed as the magnetization fixed layer. The same material as that of the later-to-be-described first magnetization fixed layer 102 may be employed as the ferromagnetic layer employed in the single pin structure magnetization fixed layer.

The magnetic coupling layer 107 generates antiferromagnetic coupling between the second magnetization fixed layer 106 and the first magnetization fixed layer 102. The magnetic coupling layer 107 forms a synthetic pin structure. Employed as the magnetic coupling layer 107 is, for example, Ru. A thickness of the magnetic coupling layer 107 is preferably not less than 0.8 nm and not more than 1 nm. A material other than Ru may be employed as the magnetic coupling layer 107, provided it is a material generating sufficient antiferromagnetic coupling between the second magnetization fixed layer 106 and the first magnetization fixed layer 102. The thickness of the magnetic coupling layer 107 may be set to a thickness of not less than 0.8 nm and not more than 1 nm corresponding to a second peak of RKKY (Ruderman-Kittel-Kasuya-Yosida) coupling. Furthermore, the thickness of the magnetic coupling layer 107 may be set to a thickness of not less than 0.3 nm and not more than 0.6 nm corresponding to a first peak of RKKY coupling. Employed as the magnetic coupling layer 107 is, for example, Ru having a thickness of 0.9 nm. As a result, highly reliable coupling can be more stably obtained.

Configurable as the first magnetization fixed layer is, for example, at least one of Fe, Co, and Ni, or an alloy including at least one kind thereof. Moreover, a material having an additional element added to these materials may also be configured as the first magnetization fixed layer.

A magnetic layer employed in the first magnetization fixed layer 102 contributes directly to the MR effect. Employed as the first magnetization fixed layer 102 is, for example, a Co—Fe—B alloy. Specifically, a $(Co_xFe_{100-x})_{100-y}B_y$ alloy (where x is not less than 0 at. % and not more than 100 at. %, and y is not less than 0 at. % and not more than 30 at. %) may be employed as the first magnetic fixed layer 102. When an amorphous alloy of $(Co_xFe_{100-x})_{100-y}B_y$ is employed as the first magnetization fixed layer 102, variation between elements due to crystal grains can be suppressed even when size of the magnetic resistance element is small. When an amorphous alloy is employed as the first magnetization fixed layer 102, a layer (for example, a tunnel insulating layer) formed on the first magnetization fixed layer 102 can be planarized. Planarization of the tunnel insulating layer makes it possible to reduce defect density of the tunnel insulating layer. For example, when MgO is employed as a material of the tunnel insulating layer, employing an amorphous alloy of $(Co_xFe_{100-x})_{100-y}B_y$ makes it possible to strengthen (100) orientation of an MgO layer formed on the tunnel insulating layer. More greatly raising the (100) orientation of the MgO layer enables an even larger MR change rate to be obtained. The $(Co_xFe_{100-x})_{100-y}B_y$ alloy crystallizes adopting a (100) surface of the MgO layer as a template during annealing. Therefore, good crystal conformity can be obtained between the MgO and the $(Co_xFe_{100-x})_{100-y}B_y$ alloy. Obtaining good crystal conformity enables an even larger MR change rate to be obtained. An Fe—Co alloy, for example, may be employed as the first magnetization fixed layer 102, besides the Co—Fe—B alloy.

If the first magnetization fixed layer 102 is thicker, a larger MR change rate is obtained. In order to obtain a larger fixed magnetic field, it is more preferable for the first magnetization fixed layer 102 to be thin. There is a tradeoff relationship in the thickness of the first magnetization fixed layer 102 between the MR change rate and the fixed magnetic field. When a Co—Fe—B alloy is employed as the first magnetization fixed layer 102, the thickness of the first magnetization fixed layer 102 is preferably not less than 1.5 nm and not more than 5 nm. The thickness of the first magnetization fixed layer 102 is more preferably not less than 2.0 nm and not more than 4 nm.

Employed in the first magnetization fixed layer 102 (second magnetic layer 20), besides the above-mentioned materials, is a $Co_{90}Fe_{10}$ alloy of fcc structure, or Co of hcp structure, or a Co alloy of hcp structure. Employed as the first magnetization fixed layer 102 is at least one selected from the group configured by Co, Fe, and Ni. Employed as the first magnetization fixed layer 102 is an alloy including at least one material selected from these materials. Employing a bcc structure FeCo alloy material, a Co alloy including a cobalt composition of 50 at. % or more, or a material having a Ni composition of 50 at. % or more as the first magnetization fixed layer 102 results in, for example, a larger MR change rate being obtained. It is also possible to employ as the first magnetization fixed layer 102 a Heusler magnetic alloy layer of the likes of $Co_2MnGe$, $Co_2FeGe$, $Co_2MnSi$, $Co_2FeSi$, $Co_2MnAl$, $Co_2FeAl$, $Co_2MnGa_{0.5}Ge_{0.5}$, and $Co_2FeGa_{0.5}Ge_{0.5}$. For example, employed as the first magnetization fixed layer 102 is a $Co_{40}Fe_{40}B_{20}$ layer having a thickness of 3 nm.

The intermediate layer 103 decouples magnetic coupling between the first magnetization fixed layer 102 and the first magnetic layer 101. Employed in the intermediate layer 103 is a metal or an insulator or a semiconductor. When a metal is employed as the intermediate layer 103, the likes of Cu, Au, or Ag are employed, for example. In this case, a thickness of the intermediate layer 103 is, for example, about not less than 1 nm and not more than 7 nm. When an insulator or semiconductor is employed as the intermediate layer 103, the likes of a magnesium oxide (Mg—O, and so on), an aluminum oxide ($Al_2O_3$, and so on), a titanium oxide (Ti—O, and so on), a zinc oxide (Zn—O, and so on), or gallium oxide (Ga—O) are employed, for example. In this case, the thickness of the intermediate layer 103 is, for example, about not less than 0.6 nm and not more than 5 nm.

Configurable as a material of the first magnetic layer 101 is, for example, at least one of Fe, Co, and Ni, or an alloy including at least one kind thereof. Moreover, a material having an additional element added to these materials may also be configured as the material of the first magnetic layer 101. The first magnetic layer is a layer including a ferromagnetic body whose magnetization direction changes due to an external magnetic field. Moreover, B, Al, Si, Mg, C, Ti, V, Cr, Mn, Cu, Zn, Ga, Zr, Hf, and so on, can also be added to these metals and alloys as an additional element or ultra-thin layer. In addition, it is also possible to employ an amorphous magnetic layer, not only a crystalline magnetic layer.

Moreover, it is also possible to employ a magnetic layer of an oxide or nitride. For example, it is possible to employ a two-layer configuration of $Co_{90}Fe_{10}$ [1 nm]/$Ni_{80}Fe_{20}$ [3.5 nm] that employs NiFe, forming CoFe at a boundary thereof. Note that when a NiFe layer is not employed, a $Co_{90}Fe_{10}$ [4 nm] single layer can be employed. Moreover, a three-layer configuration such as CoFe/NiFe/CoFe may also be adopted as the first magnetic layer 101.

$Co_{90}Fe_{10}$ is preferable in the first magnetic layer 101, since among CoFe alloys, $Co_{90}Fe_{10}$ has stable soft magnetic characteristics. When employing a CoFe alloy close to $Co_{90}Fe_{10}$, a film thickness of the first magnetic layer 101 is preferably set to not less than 0.5 nm and not more than 4 nm. In addition, $Co_xFe_{100-x}$ (where x=70 at. % to 90 at. %) may also be employed.

Moreover, in a TMR element employing MgO in the intermediate layer, it is preferable to employ a $(Co_xFe_{100-x})_{100-y}B_y$ alloy (where x=0 at. % to 100 at. %, and y=0 at. % to 30 at. %) as a material of the first magnetic layer. The $(Co_xFe_{100-x})_{100-y}B_y$ alloy crystallizes adopting an MgO (100) surface as a template during annealing, hence good crystal conformity of the MgO and the $(Co_xFe_{100-x})_{100-y}B_y$ alloy can be obtained. Such good crystal conformity is important in terms of obtaining a high MR change rate. On the other hand, when a Co—Fe—B alloy is employed in the first magnetic layer, it is preferable to configure a stacked body with a Ni—Fe alloy in terms of improving soft magnetic characteristics. For example, $Co_{40}Fe_{40}B_{20}$ [2 nm]/$Ni_{80}Fe_{20}$ [8 nm], and so on, can be employed. Now, the Co—Fe—B layer is preferably disposed on an intermediate layer side in terms of obtaining a high MR change rate. In addition, when crystal conformity between the $Co_{40}Fe_{40}B_{20}$ layer and the $Ni_{80}Fe_{20}$ layer is cut, the $Co_{40}Fe_{40}B_{20}$ layer can obtain good orientation adopting the MgO intermediate layer as a template, hence a non-magnetic metal of the likes of Ta or Ti may be inserted between the $Co_{40}Fe_{40}B_{20}$ and $Ni_{80}Fe_{20}$ layers. Moreover, a stacked body of a Co—Fe—B layer and a Ni—Fe—B layer may be configured.

The cap layer 108 protects a layer provided below the cap layer 108. Employed in the cap layer 108 are, for example, a plurality of metal layers. A non-magnetic metal may be employed in the cap layer 108, for example. Employed in the cap layer 108 is, for example, a two-layer structure (Ta/Ru) of a Ta layer and a Ru layer. A thickness of this Ta layer is, for example, 1 nm, and a thickness of this Ru layer is, for example, 5 nm. Another metal layer may be provided instead of the Ta layer or Ru layer, as the cap layer 108. There may be any configuration of the cap layer 108. For example, a non-magnetic material may be employed in the cap layer 108. Another material may be employed as the cap layer 108, provided that material is capable of protecting the layer provided below the cap layer 108.

Figure 14B:
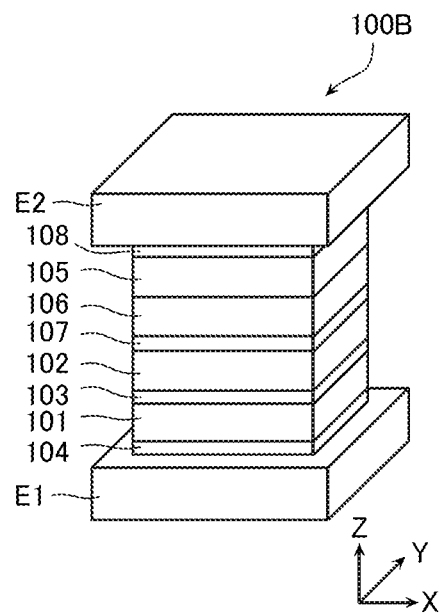

FIG. 14B is a schematic perspective view illustrating a first magnetic resistance element 100B used in another embodiment. As indicated in FIG. 14B, the first magnetic resistance element 100B includes, aligned sequentially therein: the lower electrode E1; the base layer 104; the first magnetic layer 101; the intermediate layer 103; the second magnetic layer 102; the magnetic coupling layer 107; the second magnetization fixed layer 106; the pinning layer 105; the cap layer 108; and the upper electrode E2.

In this example, the first magnetic layer 101 functions as a magnetization free layer, and the second magnetic layer 102 functions as a first magnetization fixed layer. The first magnetic resistance element 100B of FIG. 14B is called a top spin valve type. The materials described for the magnetic resistance element shown in FIG. 14A, for example, may be employed in each of the layers included in the first magnetic resistance element 100B.

Figure 14C:
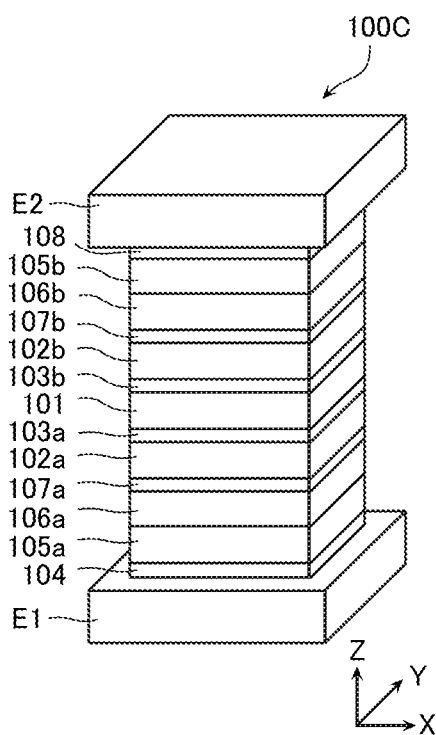

FIG. 14C is a schematic perspective view illustrating a first magnetic resistance element 100C used in another embodiment. As indicated in FIG. 14C, the first magnetic resistance element 100C includes, aligned sequentially therein: the lower electrode E1; the base layer 104; a lower pinning layer 105a; a lower second magnetization fixed layer 106a; a lower magnetic coupling layer 107a; a lower second magnetic layer 102a; a lower intermediate layer 103a; the first magnetic layer 101; an upper intermediate layer 103b; an upper second magnetic layer 102b; an upper magnetic coupling layer 107b; an upper second magnetization fixed layer 106b; an upper pinning layer 105b; the cap layer 108; and the upper electrode E2.

In this example, the first magnetic layer 101 functions as a magnetization free layer, the lower second magnetic layer 102a functions as a lower first magnetization fixed layer 102a, and the upper second magnetic layer 102b functions as an upper first magnetization fixed layer. In the first magnetic resistance element 100A shown in FIG. 14A and the first magnetic resistance element 100B shown in FIG. 14B already described, the second magnetic layer 102 which is a magnetization fixed layer is disposed on a side of one surface of the first magnetic layer 101 which is a magnetization free layer. On the other hand, in the first magnetic resistance element 100C shown in FIG. 14C, a magnetization free layer is disposed between two magnetization fixed layers. The first magnetic resistance element 100C shown in FIG. 14C is called a dual spin valve type. The materials described for the first magnetic resistance element 100A shown in FIG. 14A, for example, may be employed in each of the layers included in the first magnetic resistance element 100C shown in FIG. 14C.

Figure 14D:
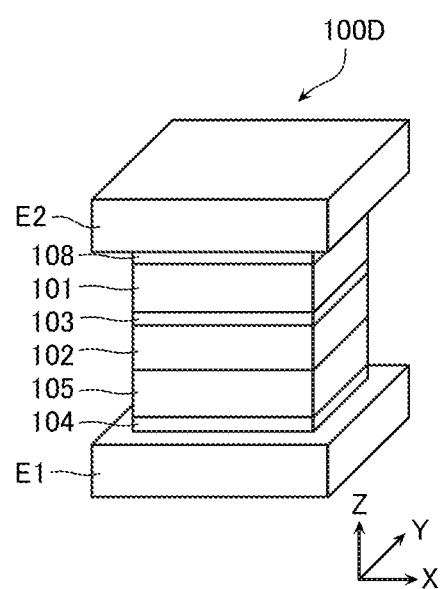

FIG. 14D is a schematic perspective view illustrating a first magnetic resistance element 100D used in another embodiment. As indicated in FIG. 14D, the first magnetic resistance element 100D includes, aligned sequentially therein: the lower electrode E1; the base layer 104; the pinning layer 105; the second magnetic layer 102; the intermediate layer 103; the first magnetic layer 101; the cap layer 108; and the upper electrode E2.

In this example, the first magnetic layer 101 functions as a magnetization free layer, and the second magnetic layer 102 functions as a magnetization fixed layer. The first magnetic resistance element 100A shown in FIG. 14A and the first magnetic resistance element 100B shown in FIG. 14B already described adopt a structure employing the second magnetization fixed layer 106, the magnetic coupling layer 107, and the second magnetic layer 102 functioning as the first magnetization fixed layer. On the other hand, the first magnetic resistance element 100D shown in FIG. 14D adopts a single pin structure employing a single magnetization fixed layer 24. The materials described for the first magnetic resistance element 100A shown in FIG. 14A, for example, may be employed in each of the layers included in the first magnetic resistance element 100D shown in FIG. 14D.

Figure 15:
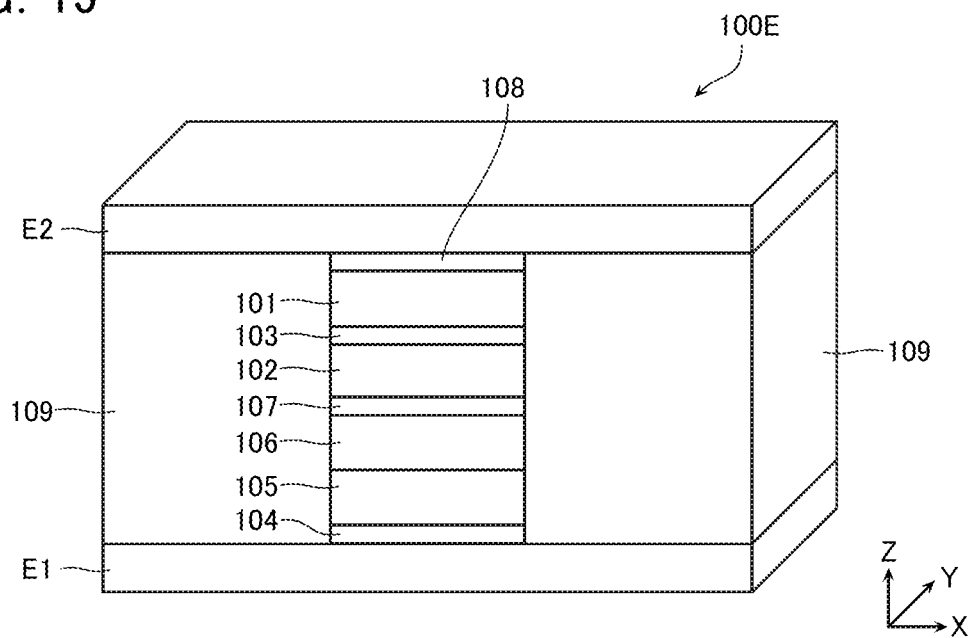
FIG. 15 is a schematic perspective view illustrating a first magnetic resistance element 100E according to another configuration of the same embodiment.

FIG. 15 is a schematic perspective view illustrating a first magnetic resistance element 100E according to another configuration. As indicated in FIG. 15, an insulating layer 109 is provided in the first magnetic resistance element 100E. That is, provided between the lower electrode E1 and the upper electrode E2 are two insulating layers (insulating portions) 109 that are separated from each other, and provided between these two insulating layers 109 is a stacked body configured from the base layer 104, the pinning layer 105, the second magnetization fixed layer 106, the magnetic coupling layer 107, the second magnetic layer 102, the intermediate layer 103, the magnetization free layer 101, and the cap layer 108.

In this example, the first magnetic layer 101 functions as a magnetization free layer, and the second magnetic layer 102 functions as a first magnetization fixed layer. The materials described for the magnetic resistance element shown in FIG. 14A, for example, may be employed in each of the layers included in the first magnetic resistance element 100E. Moreover, employable in the insulating layer 109 is, for example, an aluminum oxide (for example, $Al_2O_3$) or a silicon oxide (for example, $SiO_2$), and so on. Leak current in a periphery of the above-described stacked body can be suppressed by the insulating layer 109. The above-described insulating layer 109 may be applied also to any of the magnetic resistance elements shown in FIGS. 14A to 14D.

[1-4. Adjustment of Magnetic Field Sensitivity of Magnetic Resistance Element]

Next, adjustment of magnetic field sensitivity of the magnetic resistance element will be described. In order to adjust magnetic field sensitivity of the magnetic resistance element, it is possible to apply a method employing a linear response magnetic body, a method employing a magnetic flux guide, and other methods. A linear response magnetic body applies a magnetic field to the magnetic resistance element from a direction substantially perpendicular to the direction of the current magnetic field due to the current-to-be-measured. In the current sensor according to the present embodiment, adjustment of magnetic field sensitivity is performed using this linear response magnetic body.

[1-5. Horizontally-Positioned Linear Response Magnetic Body]

Figure 16:
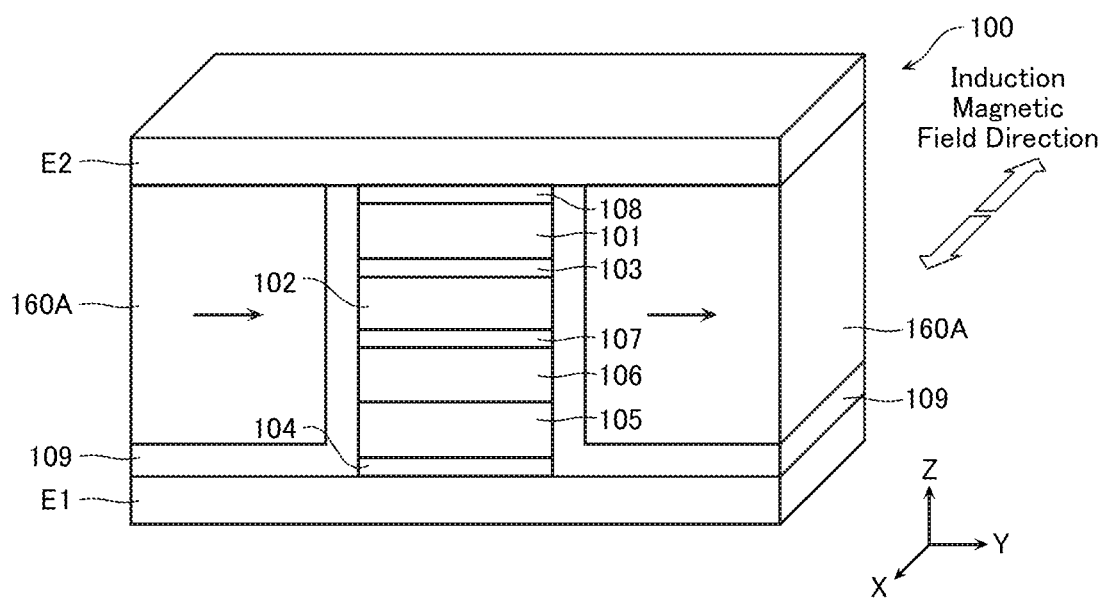
FIG. 16 is a schematic view of the first magnetic resistance element 100 and a first linear response magnetic body 160A according to the same embodiment.

A method of adjusting magnetic field sensitivity of the magnetic resistance element using the linear response magnetic body will be described. FIG. 16 is a schematic view of the first magnetic resistance element 100 and a first linear response magnetic body 160A. The first linear response magnetic body 160A is one mode of the linear response magnetic body.

The first linear response magnetic body 160A is disposed adjacently to the first magnetic layer 101, the second magnetic layer 102, and the intermediate layer 103 in the first magnetic resistance element 100, and applies a magnetic field to the first magnetic layer 101, the second magnetic layer 102, and the intermediate layer 103. In addition, the first linear response magnetic body 160A is provided between the lower electrode E1 and the upper electrode E2. Furthermore, disposed, for example, between the first linear response magnetic body 160A and the first magnetic resistance element 100 is the insulating layer 109. In this example, the insulating layer 109 extends to between the first linear response magnetic body 160A and the lower electrode E1.

In FIG. 16, a pair of first linear response magnetic bodies 160A are provided sandwiching one first magnetic resistance element 100. However, one first linear response magnetic body 160A may be provided to one first magnetic resistance element 100. The specific examples described hereafter also have a pair of first linear response magnetic bodies 160A provided, but may also have the first linear response magnetic body 160A configured on one side only.

The magnetization direction of the first magnetic layer 101 in a state where not applied with an external magnetic field can be set to a desired direction by the magnetic field of the first linear response magnetic body 160A. For example, setting the magnetization direction of the first linear response magnetic body 160A to a direction orthogonal to the magnetization direction of the second magnetic layer 102 makes it possible to orthogonalize the magnetization direction of the first magnetic layer 101 and the magnetization direction of the second magnetic layer 102, as shown in FIG. 13B. Intersecting (orthogonalizing) the magnetization direction of the first magnetic layer 101 and the magnetization direction of the second magnetic layer 102 enables linear responsiveness to positive/negative magnetic fields, as shown in FIG. 13D.

Employed in the first linear response magnetic body 160A is, for example, a hard magnetic material (hard ferromagnetic material) of comparatively high magnetic anisotropy and coercivity such as Co—Pt, Fe—Pt, Co—Pd, Fe—Pd, and so on. Moreover, an alloy having an additional element further added to Co—Pt, Fe—Pt, Co—Pd, and Fe—Pd may be employed. For example, CoPt (where a percentage of Co is not less than 50 at. % and not more than 85 at. %), $(Co_xPt_{100-x})_{100-y}Cr_y$ (where x is not less than 50 at. % and not more than 85 at. %, and y is not less than 0 at. % and not more than 40 at. %), or FePt (where a percentage of Pt is not less than 40 at. % and not more than 60 at. %), and so on, may be employed. When such materials are employed, applying the first linear response magnetic body 160A with an external magnetic field larger than the coercivity of the first linear response magnetic body 160A makes it possible to set (fix) the direction of magnetization of the first linear response magnetic body 160A to the direction in which the external magnetic field is applied. A thickness of the first linear response magnetic body 160A (for example, a length along a direction from the lower electrode E1 toward the upper electrode E2) is, for example, not less than 5 nm and not more than 50 nm.

When the insulating layer 109 is disposed between the first linear response magnetic body 160A and the lower electrode E1 as shown in FIG. 16, $SiO_x$ or $AlO_x$ may be employed as the material of the insulating layer 109. Furthermore, a magnetic body base layer not illustrated may be provided between the insulating layer 109 and the first linear response magnetic body 160A. When a hard ferromagnetic material of comparatively high magnetic anisotropy and coercivity such as Co—Pt, Fe—Pt, Co—Pd, Fe—Pd, and so on, is employed in the first linear response magnetic body 160A, Cr or Fe—Co and the like may be employed as a material of the magnetic body base layer. The above-described first linear response magnetic body 160A may also be applied to any of the above-described and below-described first magnetic resistance elements 100.

The first linear response magnetic body 160A may have a structure of being stacked on a linear response magnetic body-dedicated pinning layer not illustrated. In this case, the direction of magnetization of the first linear response magnetic body 160A can be set (fixed) by exchange coupling between the first linear response magnetic body 160A and the linear response magnetic body-dedicated pinning layer. In this case, employable in the first linear response magnetic body 160A is a ferromagnetic material configured from at least one of Fe, Co, and Ni, or an alloy including at least one kind thereof. In this case, employable in the first linear response magnetic body 160A is, for example, a $Co_xFe_{100-x}$ alloy (where x is not less than 0 at. % and not more than 100 at. %), a $Ni_xFe_{100-x}$ alloy (where x is not less than 0 at. % and not more than 100 at. %), or a material having a non-magnetic element added to these. A material similar to that of the previously mentioned second magnetic layer 102 may be employed as the first linear response magnetic body 160A.

Moreover, a material similar to that of the previously mentioned pinning layer 105 of the magnetic resistance element may be employed in the linear response magnetic body-dedicated pinning layer. In addition, when the linear response magnetic body-dedicated pinning layer is provided, a base layer of the same material as described in the base layer of the magnetic resistance element may be provided below the linear response magnetic body-dedicated pinning layer. Moreover, the linear response magnetic body-dedicated pinning layer may be provided in a lower portion or an upper portion of the first linear response magnetic body 160A. A magnetization direction of the first linear response magnetic body 160A in this case can be set by magnetic field-accompanied heat treatment, as described in the pinning layer of the magnetic resistance element.

The above-described first linear response magnetic body 160A may also be applied to any of the above-described first magnetic resistance elements 100 and the first magnetic resistance elements 100 to be described below. When employing the above-described kind of stacked structure of the first linear response magnetic body 160A and the linear response magnetic body-dedicated pinning layer, the inclination of magnetization of the first linear response magnetic body 160A can be easily maintained even when a large current flows instantaneously as the current-to-be-measured and a large current magnetic field is applied to the first linear response magnetic body 160A.

Figure 17A:
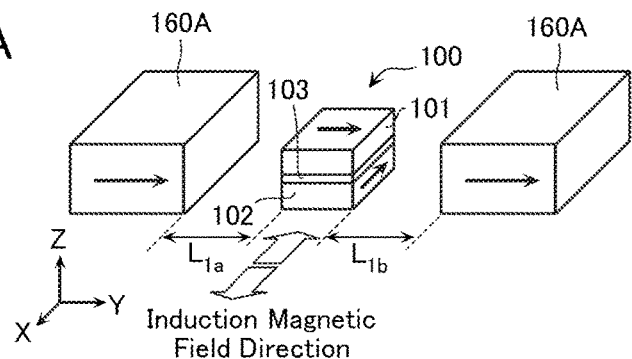
FIGS. 17A to 17C are schematic views showing an example of configuration of the current sensor according to the same embodiment.
Figure 17B:
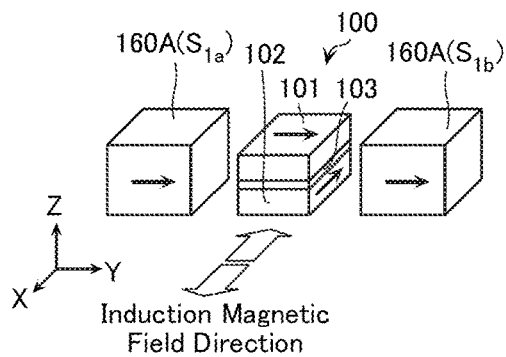
Figure 17C:
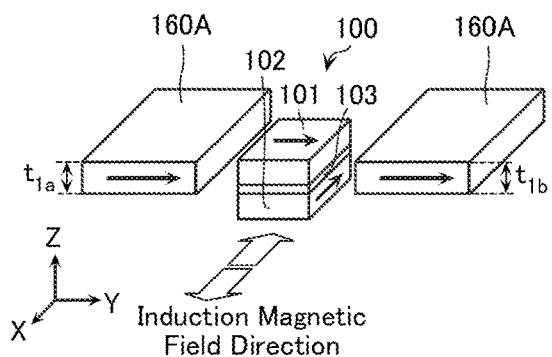

Now, magnetic field sensitivity ((dR/R)/2Hs) of the magnetic resistance element can be adjusted by configurations of the linear response magnetic body, and so on. FIGS. 17A to 17C show examples of methods of adjusting magnetic field sensitivity. In addition, FIG. 17 is described taking as an example the case such as shown in FIG. 16 where the first linear response magnetic bodies 160A are provided adjacently to the side of the magnetic resistance element, but similarly, a different magnetic field sensitivity can be obtained even when the first linear response magnetic bodies 160A are provided obliquely to the side of the magnetic resistance element.

As shown in FIG. 17A, it is possible to change magnetic field sensitivity by changing the sum $L_{1a}+L_{1b}$ of distances between the first magnetic resistance element and the first linear response magnetic bodies 160A. In this case, the larger the distance from the first linear response magnetic bodies 160A, the smaller the magnetic field applied to the first magnetic resistance element 100 becomes. Therefore, the smaller the saturation magnetic field Hs of the first magnetic resistance element 100 becomes, and the higher the magnetic field sensitivity ((dR/R)/2Hs) of the first magnetic resistance element 100 is set.

As shown in FIG. 17B, it is possible to change magnetic field sensitivity by changing the sum $S_{1a}+S_{1b}$ of areas in a substrate plane of the first linear response magnetic bodies 160A. In this case, the larger the area of the first linear response magnetic bodies 160A, the larger the magnetic volume of the first linear response magnetic bodies 160A becomes. Therefore, the smaller the saturation magnetic field Hs of the first magnetic resistance element 100 becomes, and the higher the magnetic field sensitivity ((dR/R)/2Hs) of the first magnetic resistance element 100 is set.

As shown in FIG. 17C, it is possible to change magnetic field sensitivity by changing the sum $t_{1a}+t_{1b}$ of film thicknesses of the first linear response magnetic bodies 160A. In this case, the larger the film thickness of the first linear response magnetic bodies 160A, the larger the magnetic volume of the first linear response magnetic bodies 160A becomes. Therefore, the smaller the saturation magnetic field Hs of the first magnetic resistance element 100 becomes, and the higher the magnetic field sensitivity ((dR/R)/2Hs) of the first magnetic resistance element 100 is set.

The above-mentioned FIGS. 17B and 17C described the case where magnetic volume is changed by changing area or film thickness of the first linear response magnetic bodies 160A, but magnetic volume can be changed also by changing a kind of magnetic material employed in the first linear response magnetic bodies 160A.

Figure 18:
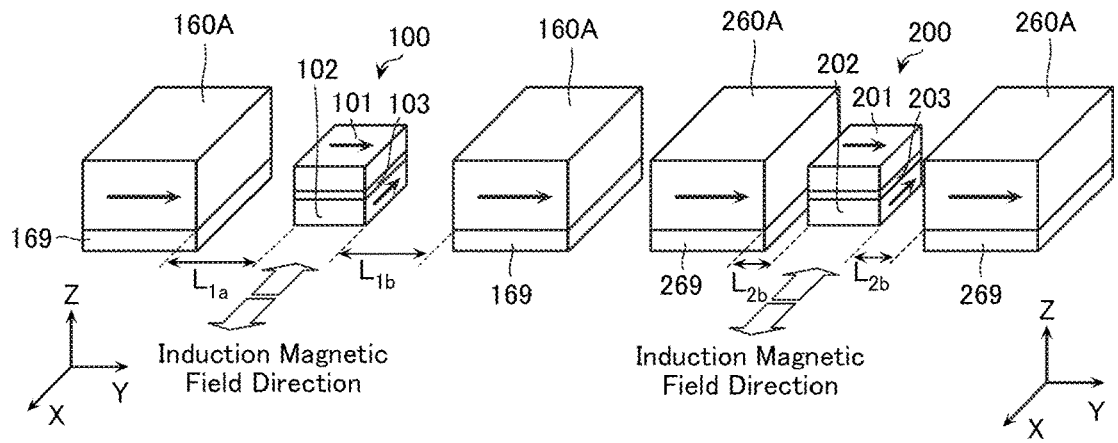
FIG. 18 is a schematic view showing another example of configuration of the current sensor according to the same embodiment.

Each of the linear response magnetic bodies 160A to 160E described heretofore may employ a hard ferromagnetic material of comparatively high magnetic anisotropy and coercivity such as Co—Pt, Fe—Pt, Co—Pd, Fe—Pd, and so on, and may employ the stacked structure of the linear response magnetic body and the linear response magnetic body-dedicated pinning layer. As a variation of FIG. 17A, FIG. 18 shows an example where linear response magnetic body-dedicated pinning layers 169 respectively contacting lower surfaces of the first linear response magnetic bodies 160A are disposed. The pinning layer 169 is an example of the linear response magnetic body-dedicated pinning layer. Note that FIG. 18 shows a modified example of FIG. 17A, but such a variation employing the linear response magnetic body and the linear response magnetic body-dedicated pinning layer may be applied also to any of the examples of FIGS. 16 and 17A to 17C. Moreover, the linear response magnetic body-dedicated pinning layer may be provided in a lower portion or an upper portion of the linear response magnetic body.

Figure 19A:
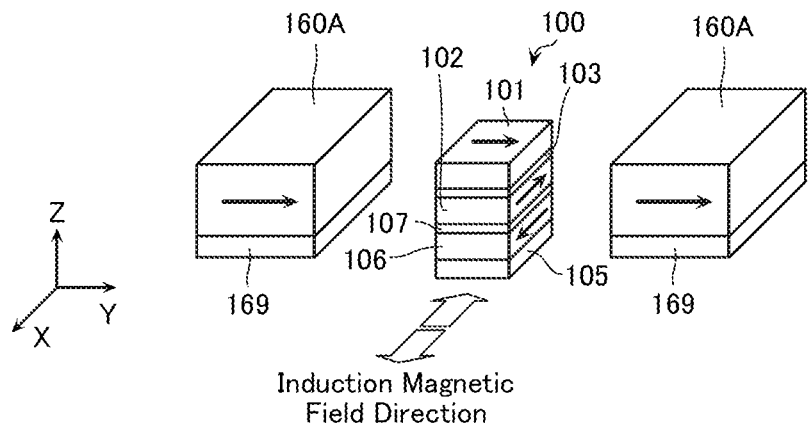
FIGS. 19A to 19C are schematic views showing another example of configuration of the current sensor according to the same embodiment.
Figure 19B:
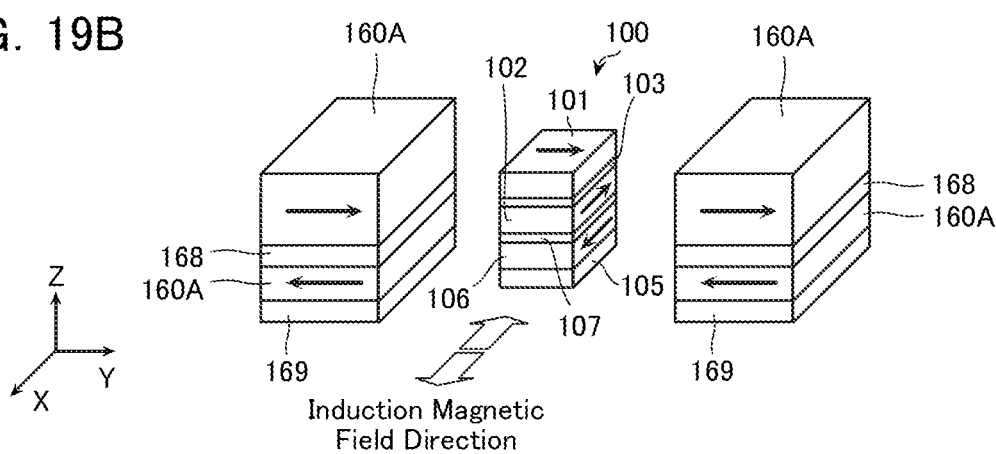
Figure 19C:
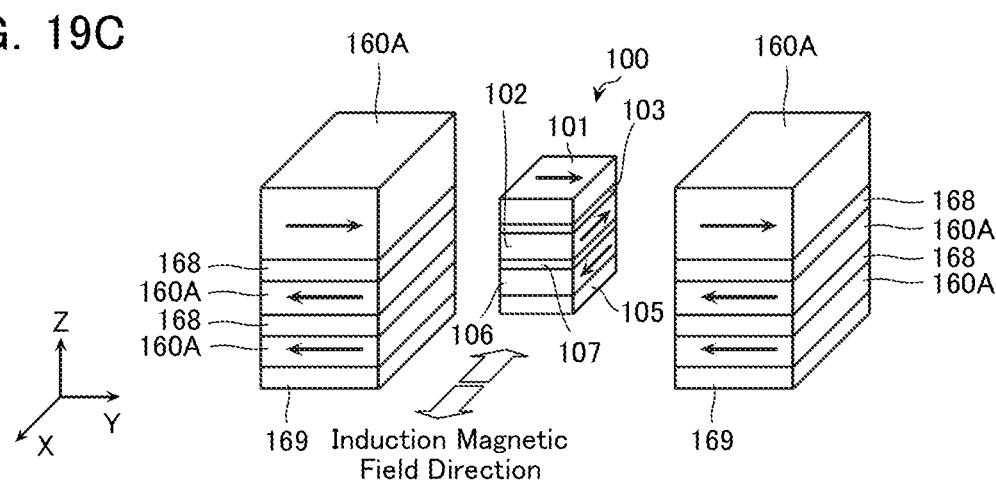

FIG. 19A to 19C are schematic views showing an example of stacked configuration of the first linear response magnetic body 160A and the linear response magnetic body-dedicated pinning layer 169. When employing a stacked structure of the first linear response magnetic body 160A and the linear response magnetic body-dedicated pinning layer 169, it is possible to adopt not only the structure shown in FIG. 19A, but also a stacked structure of the kind of linear response magnetic body-dedicated pinning layer 169/linear response magnetic body 160A/linear response magnetic body-dedicated magnetic coupling layer 168/linear response magnetic body 160A as shown in FIG. 19B.

Moreover, it is possible to stack three or more layers of linear response magnetic bodies 160A via linear response magnetic body-dedicated magnetic coupling layers 168, as shown in FIG. 19C. In the case of such a stacked structure, two linear response magnetic bodies 160A mediated by the linear response magnetic body-dedicated magnetic coupling layer 168 attain magnetization directions that are antiparallel to each other. In this case, magnetization of the first magnetic layer 101 is directed in an inclination of magnetization of the first linear response magnetic body 160A whose distance is closest to the first magnetic layer 101 of the first magnetic resistance element 100. Moreover, when such a structure is employed, the thickness of the linear response magnetic body 160A whose distance is closest to the first magnetic layer 101 of the first magnetic resistance element 100 is preferably set larger than the thickness of another linear response magnetic body 160A included in the stacked structure.

When employing the stacked structure of the first linear response magnetic body 160A and the linear response magnetic body-dedicated pinning layer 169, the inclination of magnetization of the first linear response magnetic body 160A can be easily maintained even when a large current flows instantaneously as the current-to-be-measured and a large current magnetic field is applied to the first linear response magnetic body 160A.

[1-6. Vertically-Positioned Linear Response Magnetic Body]

Next, a relationship between the magnetic resistance element and the linear response magnetic body when the linear response magnetic body is disposed stacked on the magnetic resistance element will be described. The description below takes as an example the first magnetic resistance element 100 and the first linear response magnetic body 160, but the other second through fourth magnetic resistance elements 200 to 400 and their linear response magnetic bodies may also be similarly configured.

Figure 20:
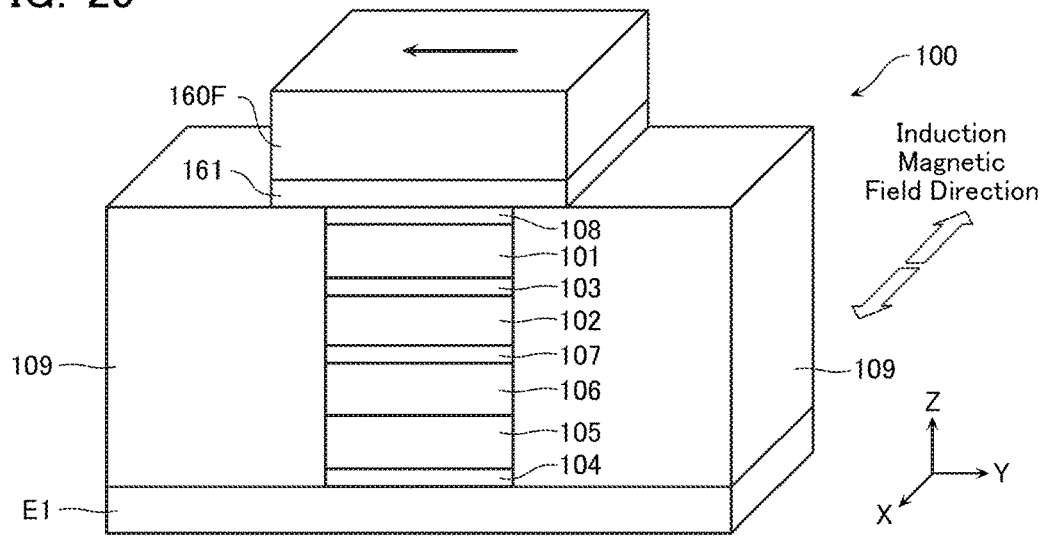
FIG. 20 is a schematic view showing another example of configuration of the current sensor according to the same embodiment.

FIG. 20 shows a schematic view of the first magnetic resistance element 100 and a first linear response magnetic body 160F that functions as the linear response magnetic body. The first linear response magnetic body 160F is another mode of the first linear response magnetic body 160. Note that in FIG. 20, the upper electrode E2 is omitted.

In the present embodiment, the first linear response magnetic body 160F is provided in a stacking direction of the first magnetic resistance element 100. For example, as shown in FIG. 20, the first linear response magnetic body 160F is provided above the cap layer 108 in the first magnetic resistance element 100. However, the first linear response magnetic body 160F may be provided below the base layer 104, for example. However, when the first magnetic layer 101 functioning as a magnetization free layer is positioned above the second magnetic layer 102 functioning as a magnetization fixed layer, the first linear response magnetic body 160F is more preferably disposed above the first magnetic layer 101, and when the first magnetic layer 101 is positioned below the second magnetic layer 102, the first linear response magnetic body 160F is more preferably disposed below the second magnetic layer 102.

In addition, as shown in FIG. 20, a base layer 161 dedicated to the first linear response magnetic body 160F may be provided between the first linear response magnetic body and the cap layer 108. In FIG. 20, by providing an upper electrode, not illustrated, on the first linear response magnetic body 160, a current that has passed between the upper electrode and the lower electrode E1 flows in the first linear response magnetic body 160F and the magnetic resistance element. Moreover, the upper electrode may be provided between the first linear response magnetic body 160F and the cap layer 108.

Employing the first linear response magnetic body 160F makes it possible to obtain similar advantages to when employing the above-mentioned first linear response magnetic body 160A. Now, the first linear response magnetic body 160F is provided in a stacking direction of the first magnetic layer 101, and so on, hence a leakage magnetic field from the first linear response magnetic body 160F to the first magnetic layer 101 is reversely-directed to the magnetization direction of the first linear response magnetic body 160F. Note that such a first linear response magnetic body 160F may be used in combination with the previously mentioned linear response magnetic body.

Similar materials to those mentioned in the description of FIG. 16 can be used as materials employed in the first linear response magnetic body 160F or the linear response magnetic body-dedicated base layer 161. In the first linear response magnetic body disposed in the stacking direction of the kind in FIG. 20, a leakage magnetic field is generated from an end of the first linear response magnetic body 160F.

Therefore, if area of the first linear response magnetic body 160F is made too large compared to area of the first magnetic resistance element 100, the magnetic field from the first linear response magnetic body 160F is not applied sufficiently to the first magnetic resistance element 100. Therefore, area of the first linear response magnetic body 160F must be appropriately set. For example, area of the first linear response magnetic body 160F is preferably about not less than equal to and not more than 25 times area of the first magnetic resistance element 100. Moreover, the first linear response magnetic body 160F may also employ the previously mentioned stacked structure of the linear response magnetic body and the linear response magnetic body-dedicated pinning layer. In this case, the inclination of magnetization of the first linear response magnetic body 160F can be easily maintained even when a large current flows instantaneously as the current-to-be-measured and a large current magnetic field is applied to the first linear response magnetic body 160F.

Figure 21A:
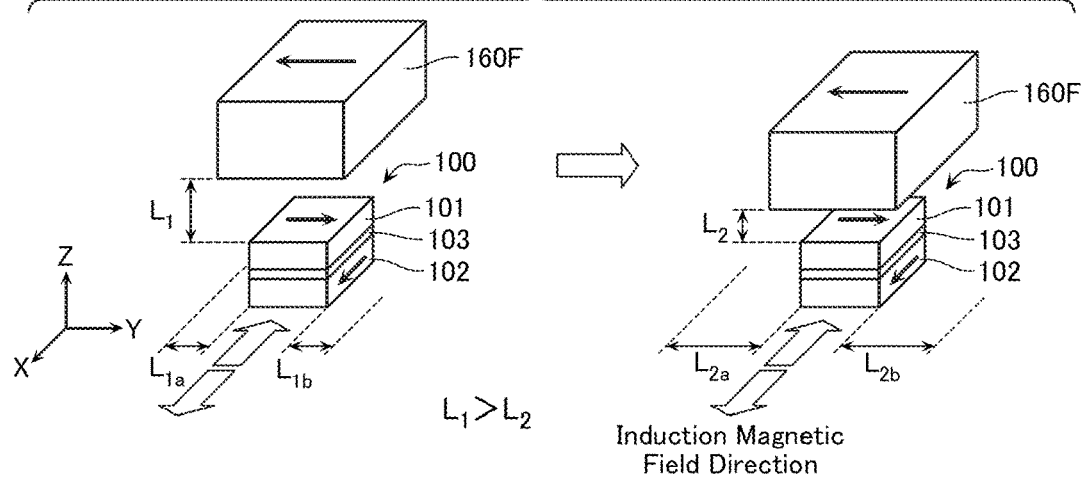
FIGS. 21A and 21B are schematic views showing another example of configuration of the current sensor according to the same embodiment.
Figure 21B:
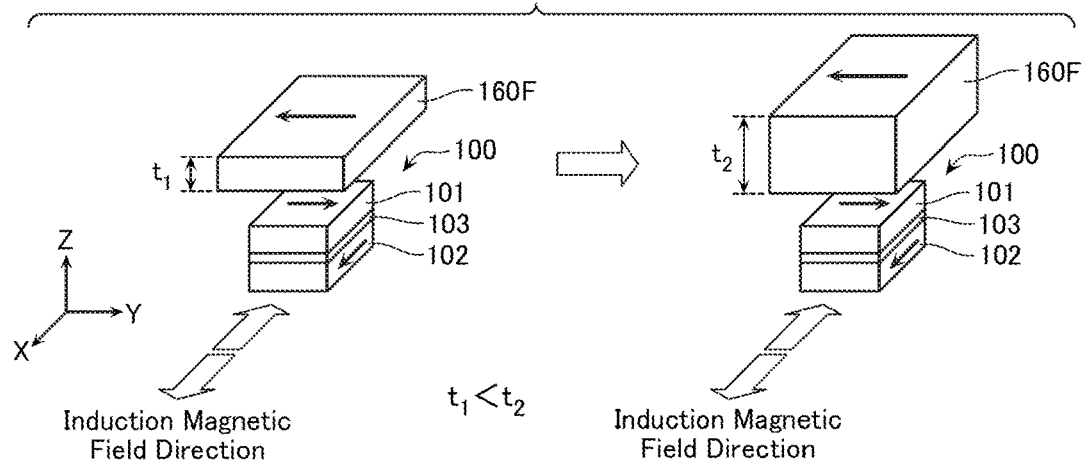

Now, magnetic field sensitivity ((dR/R)/2Hs) of the magnetic resistance element can be adjusted by a configuration of the first linear response magnetic body 160F, and so on. FIGS. 21A and 21B show examples of when configurations of the first linear response magnetic bodies 160F are made different.

As shown in FIG. 21A, it is possible to change the magnetic field by changing a distance between the magnetic resistance element and the first linear response magnetic body 160F. A distance $L_1$ between the first magnetic resistance element 100 and the first linear response magnetic body 160F shown in FIG. 21A (on the left in the drawing) is set to a distance $L_2$ which is larger than the distance $L_1$. In this case, the larger the distance from the first or a second linear response magnetic body 160F, the smaller the magnetic field applied to the first magnetic resistance element 100 becomes. Therefore, the smaller the saturation magnetic field Hs of the first magnetic resistance element 100 becomes, and the higher the magnetic field sensitivity ((dR/R)/2Hs) of the first magnetic resistance element 100 is set.

As shown in FIG. 21B, it is possible to change the magnetic field by changing film thickness of the first linear response magnetic body 160F. A film thickness $t_1$ of the first linear response magnetic body 160F shown in FIG. 21(b) is set to a film thickness $t_2$ which is smaller than the film thickness $t_1$. In this case, the larger the film thickness of the first linear response magnetic body 160F, the larger the magnetic volume of the first linear response magnetic body 160F becomes. Therefore, the smaller the saturation magnetic field Hs of the first magnetic resistance element 100 becomes, and the higher the magnetic field sensitivity ((dR/R)/2Hs) of the first magnetic resistance element 100 is set.

FIG. 21B described the case where magnetic volume is changed by changing film thickness of the first linear response magnetic body 160F, but magnetic volume can be changed also by changing a kind of magnetic material employed in the first linear response magnetic body 160F.

Moreover, as previously mentioned, it is possible to change the magnetic field by changing area of the first linear response magnetic body 160F. When the first linear response magnetic body 160F is disposed in the stacking direction with respect to the first magnetic resistance element 100, the greater a distance between an end of the first linear response magnetic body 160F and an end of the first magnetic resistance element 100, the smaller the magnetic field applied to the first magnetic resistance element 100 becomes, and the higher the magnetic field sensitivity ((dR/R)/2Hs) of the first magnetic resistance element 100 becomes.

[1-7. In-Stack Type Linear Response Magnetic Body]

Next, a relationship between the magnetic resistance element and the linear response magnetic body when the linear response magnetic body is included in the magnetic resistance element will be described. The description below takes as an example the first magnetic resistance element 100 and the first linear response magnetic body 160, but the second through fourth magnetic resistance elements 200 to 400 or second through fourth linear response magnetic bodies accompanying these magnetic resistance elements 200 to 400 may also be similarly configured.

FIG. 22A shows a schematic view of the first magnetic resistance element 100 and a first linear response magnetic body 160G according to the present embodiment. The first linear response magnetic body 160G is one mode of the first linear response magnetic body 160.

In the mode shown in FIG. 22A, the first magnetic resistance element 100 includes the first linear response magnetic body 160G. The first linear response magnetic body 160G is configured as an in-stack bias layer configured from a stacked structure. Therefore, the first linear response magnetic body 160G can adjust magnetic field sensitivity of the first magnetic resistance element 100, by an exchange coupling magnetic field between magnetization of a bias magnetic layer included inside the first linear response magnetic body 160G and a magnetization free layer. For example, setting a magnetization direction of the first linear response magnetic body 160G substantially perpendicularly to the current magnetic field generated from the current-to-be-measured makes it possible to obtain similar advantages to when employing the above-mentioned first linear response magnetic body 160A.

In the mode indicated in FIG. 22A, the first linear response magnetic body 160G includes: an isolating layer 162; a first bias magnetic layer 163; a bias magnetic coupling layer 164; a second bias magnetic layer 165; and a bias pinning layer 166.

The first bias magnetic layer 163 and the second bias magnetic layer 165 are formed by a magnetic material, for example. Magnetization of the second bias magnetic layer 165 is fixed in one direction by the bias pinning layer 166. Magnetization of the first bias magnetic layer 163 is set oppositely to magnetization of the second bias magnetic layer 165 that neighbors the first bias magnetic layer 163 via the bias magnetic coupling layer 164. The first bias magnetic layer 163 whose magnetization is fixed in one direction applies a bias to the first magnetic layer 101 by magnetic coupling such as exchange coupling. When such a linear response magnetic body 160G configured from a stacked structure of the bias magnetic layer and the bias pinning layer is employed, the inclination of magnetization of the first linear response magnetic body 160G can be easily maintained even when a large current flows instantaneously as the current-to-be-measured and a large current magnetic field is applied to the first linear response magnetic body 160G.

The isolating layer 162 is formed from the likes of a non-magnetic material, for example, and by physically isolating the first bias magnetic layer 163 and the first magnetic layer 101, adjusts intensity of magnetic coupling between the first bias magnetic layer 163 and the first magnetic layer 101. Note that depending on a material of the first bias magnetic layer 163, the isolating layer 162 need not necessarily be provided. Setting magnetization of a plurality of bias magnetic layers to be antiparallel (180°) as in FIG. 22A makes it possible to suppress a leakage magnetic field from the bias magnetic layer to external and suppress magnetic interference other than bias application due to exchange coupling to the magnetization free layer.

As shown in FIG. 22A, the first linear response magnetic body 160G includes first bias magnetic layer 163/bias magnetic coupling layer 164/second bias magnetic layer 165, but may be configured by providing only a single-layer first bias magnetic layer 163 between the isolating layer 162 and the bias pinning layer 166. Moreover, three or more layers of bias magnetic layers may be adopted, as in first bias magnetic layer/first magnetic coupling layer/second bias magnetic layer/second magnetic coupling layer/third bias magnetic layer.

Employed in the isolating layer 162 is, for example, Cu of 5 nm. Employed in the first bias magnetic layer 163 is, for example, $Fe_{50}Co_{50}$ of 3 nm. Employed in the bias magnetic coupling layer 164 is, for example, Ru of 0.9 nm. Employed in the second bias magnetic layer 165 is, for example, $Fe_{50}Co_{50}$ of 3 nm. Employed in the bias pinning layer 166 is, for example, IrMn of 7 nm.

Employable in the first bias magnetic layer 163 and the second bias magnetic layer 165 is, for example, at least one selected from the group configured by Co, Fe, and Ni. Also employable as the first bias magnetic layer 163 is an alloy including at least one material selected from the group configured by Co, Fe, and Ni. For example, employed in the first bias magnetic layer 163 is a $Co_xFe_{100-x}$ alloy (where x is not less than 0 at. % and not more than 100 at. %), a $Ni_xFe_{100-x}$ alloy (where x is not less than 0 at. % and not more than 100 at. %), or a material having a non-magnetic element added to these alloys. Employable as the first bias magnetic layer 163 is a $(Co_xFe_{100-x})_{100-y}B_y$ alloy (where x is not less than 0 at. % and not more than 100 at. %, and y is not less than 0 at. % and not more than 30 at. %).

Employed in the isolating layer 162 is, for example, a non-magnetic material. Employable in the isolating layer 162 is, for example, a layer including at least one element selected from the group of Cu, Ru, Rh, Ir, V, Cr, Nb, Mo, Ta, W, Rr, Au, Ag, Pt, Pd, Ti, Zr, and Hf.

The bias pinning layer 166 gives unidirectional anisotropy to the second bias magnetic layer 165 formed contacting the bias pinning layer, and thereby fixes magnetization of the first bias magnetic layer 163. Employed in the bias pinning layer 166 is, for example, an antiferromagnetic layer. Employed in the bias pinning layer 166 is, for example, at least one selected from the group configured by Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. It is also possible to employ an alloy having an additional element further added to the Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. A thickness of the bias pinning layer 166 is appropriately set to give sufficiently strong unidirectional anisotropy.

When PtMn or PdPtMn are employed as the bias pinning layer 166, the thickness of the bias pinning layer 166 is preferably not less than 8 nm and not more than 20 nm. The thickness of the bias pinning layer 166 is more preferably not less than 10 nm and not more than 15 nm. When IrMn is employed as the bias pinning layer 166, unidirectional anisotropy may be given to the first bias magnetic layer 163 by a bias pinning layer 166 which is thinner than when PtMn is employed as the bias pinning layer 166. In this case, the thickness of the bias pinning layer 166 is preferably not less than 4 nm and not more than 18 nm. The thickness of the bias pinning layer 166 is more preferably not less than 5 nm and not more than 15 nm.

A hard magnetic layer (hard ferromagnetic material) may be employed as the bias pinning layer 166. For example, a hard magnetic material (hard ferromagnetic material) of comparatively high magnetic anisotropy and coercivity such as Co—Pt, Fe—Pt, Co—Pd, Fe—Pd, and so on, may be employed. Moreover, an alloy having an additional element further added to Co—Pt, Fe—Pt, Co—Pd, and Fe—Pd may be employed. Employable as the hard magnetic layer is, for example, CoPt (where a percentage of Co is not less than 50 at. % and not more than 85 at. %), $(Co_xPt_{100-x})_{100-y}Cr_y$ (where x is not less than 50 at. % and not more than 85 at. %, and y is not less than 0 at. % and not more than 40 at. %), or FePt (where a percentage of Pt is not less than 40 at. % and not more than 60 at. %), and so on.

The bias magnetic coupling layer 164 generates antiferromagnetic coupling between the first bias magnetic layer 163 and the second bias magnetic layer 165. The bias magnetic coupling layer 164 forms a synthetic pin structure. Employed as the bias magnetic coupling layer 164 is, for example, Ru. A thickness of the bias magnetic coupling layer 164 is preferably not less than 0.8 nm and not more than 1 nm. A material other than Ru may be employed as the bias magnetic coupling layer 164, provided it is a material generating sufficient antiferromagnetic coupling between the first bias magnetic layer 163 and the second bias magnetic layer 165. The thickness of the bias magnetic coupling layer 164 may be set to a thickness of not less than 0.8 nm and not more than 1 nm corresponding to a second peak of RKKY (Ruderman-Kittel-Kasuya-Yosida) coupling. Furthermore, the thickness of the bias magnetic coupling layer 164 may be set to a thickness of not less than 0.3 nm and not more than 0.6 nm corresponding to a first peak of RKKY coupling. Employed as the bias magnetic coupling layer 164 is, for example, Ru having a thickness of 0.9 nm. As a result, highly reliable coupling can be more stably obtained.

A thickness of the first bias magnetic layer 163 is preferably not less than 1.5 nm and not more than 5 nm, for example. A thickness of the second bias magnetic layer 165 is preferably not less than 1.5 nm and not more than 5 nm, for example. As a result, for example, intensity of the unidirectional anisotropic magnetic field due to the bias pinning layer 166 can be more greatly strengthened. Magnetic film thickness (product (Bs·t) of saturation magnetization Bs and thickness t) of the first bias magnetic layer 163 is preferably substantively equal to magnetic film thickness of the second bias magnetic layer 165.

A direction of the bias magnetic field applied to the first magnetic layer 101 from the first linear response magnetic body 160G can be set to any direction with respect to the magnetization direction of the second magnetic layer 102.

FIG. 22B is a schematic view for explaining a setting method of the magnetization direction in the first linear response magnetic body 160G. For example, it is also possible to set the direction of the bias magnetic field applied to the first magnetic layer 101 from the first linear response magnetic body 160G to 90° (or 270°) with respect to the magnetization direction of the second magnetic layer 102. Such a setting of direction of the bias magnetic field is made possible by selection of two-stage magnetic field-accompanied annealing and of configuration of materials employed in the pinning layer 105 and configuration of materials employed in the bias pinning layer 166.

A temperature at which magnetization fixing occurs for an antiferromagnetic material employed in the pinning layer 105 or bias pinning layer 166 differs according to composition of the antiferromagnetic material. For example, the temperature at which magnetization fixing is performed for a material of an ordered alloy system such as PtMn is higher compared to a material that causes magnetization fixing even disordered such as IrMn. For example, it is possible to employ PtMn in the pinning layer 105 and IrMn in the bias pinning layer 166.

Next, two-stage magnetic field-accompanied heat treatment such as shown in FIG. 22B is performed. For example, as indicated in (1) of FIG. 22B, annealing is performed for 10 hours at 320° C. while applying a magnetic field in a rightward direction of FIG. 22B. As a result, the magnetization direction of the second magnetization fixed layer 106 contacting the pinning layer 105 is fixed facing right. Moreover, the magnetization direction of the second bias magnetic layer 165 contacting the bias pinning layer 166 is once fixed facing right.

Next, for example, as indicated in (2) of FIG. 22B, annealing is performed for one hour at 260° C. while applying a magnetic field in a leftward direction of FIG. 22B. As a result, the magnetization direction of the second magnetization fixed layer 106 contacting the pinning layer 105 remains unchanged facing right, and the magnetization direction of the second bias magnetic layer 165 contacting the bias pinning layer 166 is fixed facing left. As shown in the diagram on the right of FIG. 22B, this orientation of magnetization is maintained even at room temperature.

Selection of the method of magnetic field-accompanied annealing and of configuration of the material of the pinning layer 105 and configuration of the material of the bias pinning layer 166 in this way makes it possible to arbitrarily set the direction of the bias magnetic field to the first magnetic layer 101 and the second magnetic layer 102. In addition, a temperature difference of magnetization fixing of the pinning layer 105 and the bias pinning layer 166 can also be set by a film thickness of the respective layers and not only by selection of respective materials. For example, it is possible to perform the alignment of magnetization directions of the kind shown in FIG. 22A by performing the magnetic field-accompanied two-stage annealing shown in FIG. 22B, even when IrMn of 7 nm is employed in the pinning layer 105 and IrMn of 5 nm is employed in the bias pinning layer 166.

Now, magnetic field sensitivity ((dR/R)/2Hs) of the magnetic resistance element can be adjusted by the configuration of the in-stack bias layer. For example, the first magnetic resistance element 100 and first linear response magnetic body 160G are configured as shown in FIG. 22, and the second magnetic resistance element 200 and second linear response magnetic body 260 are further configured similarly to these. However, in the second linear response magnetic body 260, the isolating layer 162 is made thicker compared to in the first linear response magnetic body 160G. As a result, the bias magnetic field for the first magnetic resistance element 100 weakens relatively. In addition, it is possible to change the bias magnetic field also by differentiating thicknesses of the first bias magnetic layer 163 and the second bias magnetic layer 165 between the two magnetic resistance elements. In this case, increasing the thicknesses of the first bias magnetic layer 163 and the second bias magnetic layer 165 causes the bias magnetic field applied to the first magnetic layer 101 to weaken. Therefore, saturation magnetization Hs lowers, and magnetic field sensitivity ((dR/R)/2Hs) is set high.

Figure 23A:
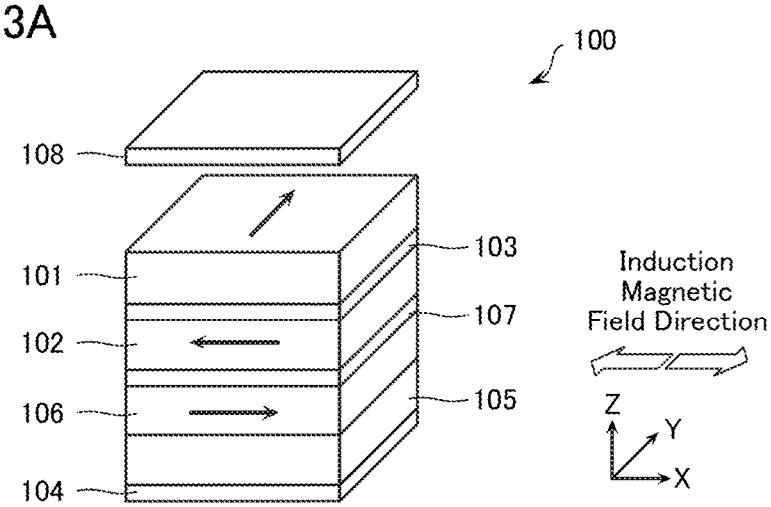
FIGS. 23A and 23B are schematic views showing an example of configuration of the current sensor according to the same embodiment.

Note that the description heretofore described performing two-stage magnetic field-accompanied annealing for setting the magnetization direction of the first linear response magnetic body 160G. Now, when employing such a two-stage magnetic field-accompanied annealing, it is also possible to set the magnetization direction of the first magnetic layer 101. FIG. 23A is a schematic view for explaining a method for this. Such a method also enables the magnetization direction of a magnetization free layer to be orthogonalized with the magnetization direction of a magnetization fixed layer, as shown in FIG. 13B, for example, and enables linear responsiveness to positive/negative magnetic fields, as shown in FIG. 13D.

Figure 23B:
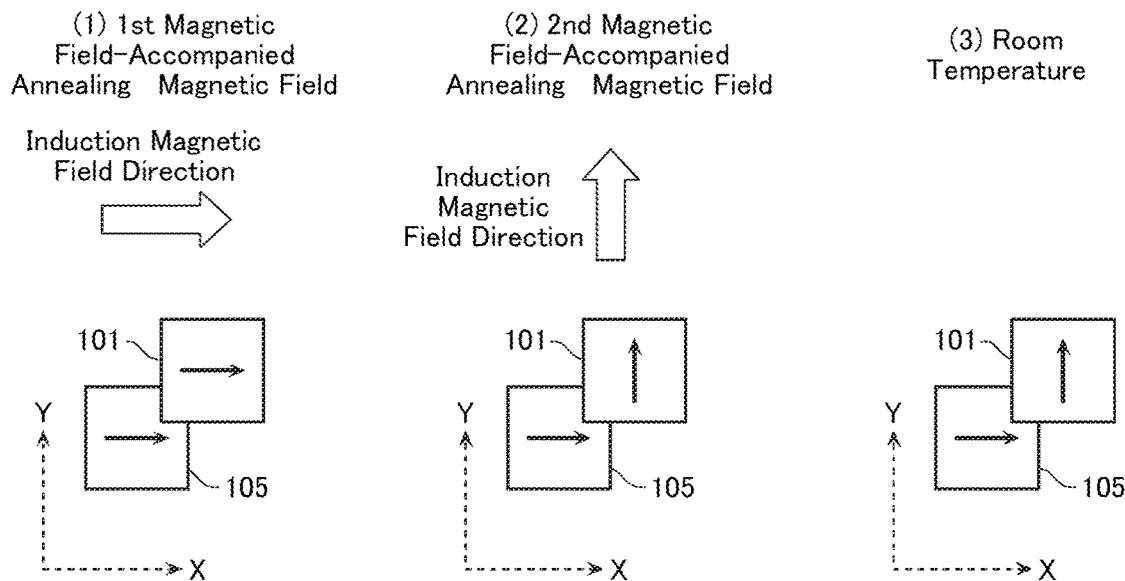

In order to set the magnetization direction of the first magnetic layer 101 and the magnetization direction of the second magnetic layer 102 to different directions, for example, a first magnetic field-accompanied heat treatment is performed as shown in the diagram on the left of FIG. 23B. The first magnetic field-accompanied heat treatment is performed by, for example, performing annealing for 10 hours at 320° C. while applying a magnetic field in a rightward direction of FIG. 23B. As a result, the magnetization direction of the second magnetization fixed layer 106 contacting the pinning layer 105 is fixed facing right.

Next, for example, a second magnetic field-accompanied heat treatment is performed. The second magnetic field-accompanied heat treatment is performed by, for example, performing annealing while applying a magnetic field in an upward direction of FIG. 23B, as shown in the diagram in the center of FIG. 23B. A temperature at this time is a temperature lower than 320° C., and is set to a temperature lower than a magnetization fixing temperature of an antiferromagnetic body employed in the bias pinning layer 166. As a result, the magnetization direction of the first magnetic layer 101 can be set facing upward, with the magnetization direction of the second magnetization fixed layer 106 unchanged set facing right. That is, a direction of induction magnetic anisotropy of the first magnetic layer 101 can be set in an up/down direction.

Now, magnetic field sensitivity ((dR/R)/2Hs) of the magnetic resistance element can be adjusted by temperature or time of the second magnetic field-accompanied heat treatment of the two-stage annealing. For example, by producing the first magnetic resistance element 100 and the second magnetic resistance element 200 and setting a time of the second magnetic field-accompanied heat treatment during manufacturing of the first magnetic resistance element 100 to be longer than a time of the second magnetic field-accompanied heat treatment during manufacturing of the second magnetic resistance element 200, the induction magnetic anisotropy of the first magnetic layer of the second magnetic resistance element 200 becomes higher than that of the first magnetic resistance element 100, hence Hs increases and magnetic field sensitivity ((dR/R)/2Hs) is set low.

[1-8. Manufacturing Method]

Next, a manufacturing method of the current sensor according to the present embodiment will be described. FIGS. 24A to 24J are stepwise schematic perspective views illustrating the manufacturing method of the current sensor according to the present embodiment.

Figure 24A:
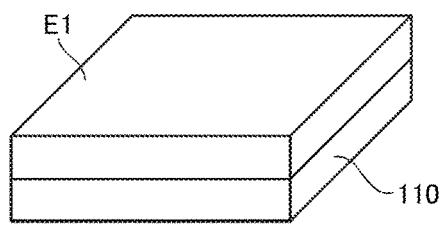
FIGS. 24A to 24J are schematic perspective views illustrating a manufacturing method of the current sensor according to the present embodiment.

As indicated in FIG. 24A, the lower electrode E1 is formed on a substrate 110. For example, Ta (5 nm)/Cu (200 nm)/Ta (35 nm) is formed. After this, surface smoothing processing such as CMP processing is performed on an outermost surface of the lower electrode E1, and a configuration formed on the lower electrode E1 may be planarized.

Figure 24F:
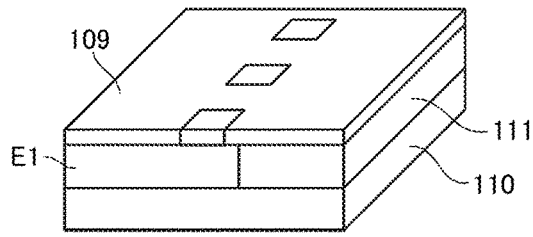
Figure 24B:
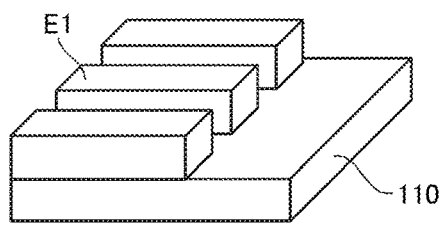

Next, as shown in FIG. 24B, a planar shape of the lower electrode E1 is processed. In this step, resist undergoes patterning by photolithography, and then physical milling or chemical milling are implemented using a resist pattern not illustrated as a mask. For example, Ar ion milling is performed.

Figure 24G:
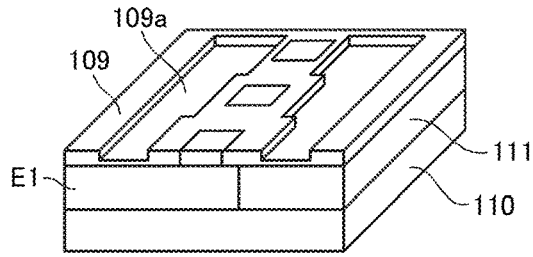
Figure 24C:
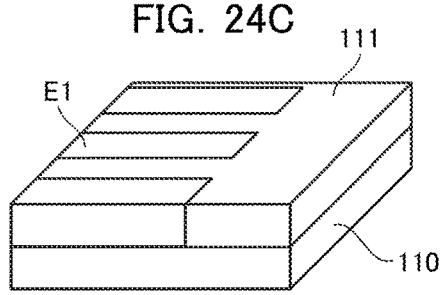

Next, as shown in FIG. 24C, film formation filling a periphery of the lower electrode E1 with an insulating layer 111 is performed. In this step, for example, a lift-off step is performed. For example, the insulating layer 111 is deposited on the entire surface in a state where the resist pattern formed by photolithography of FIG. 24B is left unchanged, and then the resist pattern is removed. Employable as the insulating layer 111 are, for example, $SiO_x$, $AlO_x$, $SiN_x$, $AlN_x$, and so on.

Next, inter-electrode configurations of the magnetic resistance element are deposited on the lower electrode E1. For example, Ta (3 nm)/Ru (2 nm) is formed as the base layer 104. IrMn (7 nm) is formed thereon as the pinning layer 105. $Co_{75}Fe_{25}$ (2.5 nm)/Ru (0.9 nm)/$Co_{40}Fe_{40}B_{20}$ (3 nm) is formed thereon as the second magnetic layer 102. MgO (2 nm) is formed thereon as the intermediate layer 103. $Co_{40}Fe_{40}B_{20}$ (2 nm)/Ta (0.4 nm)/$Ni_{80}Fe_{20}$ (6 nm) is formed thereon as the first magnetic layer 101. Cu (1 nm)/Ta (2 nm)/Ru (5 nm) is formed thereon as the cap layer 108.

Next, magnetic field-accompanied annealing that fixes the magnetization direction of the second magnetic layer 102 is performed. For example, annealing for one hour at 300° C. while applying a magnetic field of 7 kOe is performed. For example, this annealing is performed applying an external magnetic field substantially parallelly to the induction magnetic field application direction (X direction). Now, in such cases as when, for example, the previously mentioned linear response magnetic body (160G, FIG. 22A) provided with an in-stack bias layer is employed, two-stage annealing may be performed.

Figure 24H:
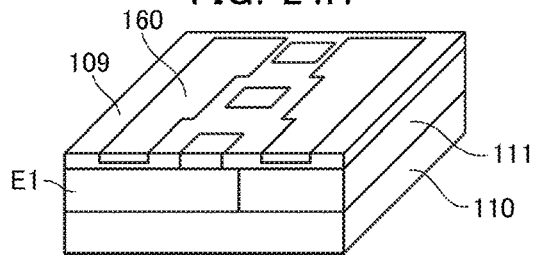
Figure 24D:
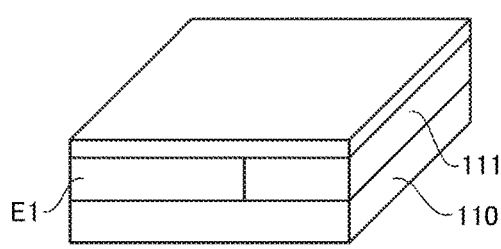
Figure 24I:
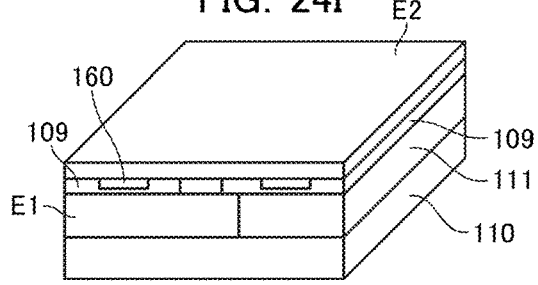
Figure 24E:
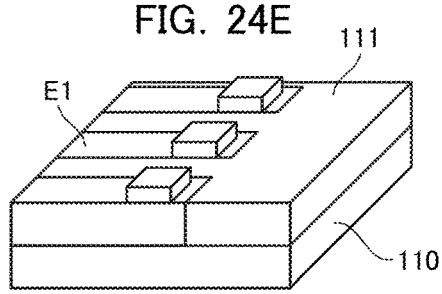

Next, as shown in FIG. 24E, a planar shape of the inter-electrode configurations of the magnetic resistance element is processed. In this step, resist undergoes patterning by photolithography, and then physical milling or chemical milling are implemented using a resist pattern not illustrated as a mask. This step makes it possible to batch process a plurality of configurations as shown in FIG. 24(e).

Next, as shown in FIG. 24F, film formation filling a periphery of the inter-electrode configurations of the magnetic resistance element with an insulating layer 109 is performed. In this step, for example, a lift-off step is performed. For example, the insulating layer 109 is deposited on the entire surface in a state where the resist pattern formed by photolithography of FIG. 24E is left unchanged, and then the resist pattern is removed. Employable as the insulating layer 109 are, for example, $SiO_x$, $AlO_x$, $SiN_x$, $AlN_x$, and so on.

Next, as shown in FIG. 24G, a hole 109a for implanting the linear response magnetic body 160 provided adjacently to the inter-electrode configurations of the magnetic resistance element is formed. In this step, resist undergoes patterning by photolithography, and then physical milling or chemical milling are implemented using a resist pattern not illustrated as a mask. FIG. 24G takes as an example the case where a pair of first linear response magnetic bodies 160E are formed with respect to a plurality of magnetic resistance elements, but batch processing can be performed even when linear response magnetic bodies are formed individually with respect to a plurality of magnetic resistance elements. In this step, processing may be performed until the hole 109a penetrates the insulating layer 109, or may be stopped along the way. FIG. 24G illustrates the case where processing is stopped along the way. Although mentioned later, when the hole 109a is etched until it penetrates the insulating layer 109, an insulating layer not illustrated needs to be deposited under the first linear response magnetic body 160E in an implanting step of the first linear response magnetic body 160 shown in FIG. 24H.

Next, as shown in FIG. 24H, the first linear response magnetic body 160E is implanted in the hole 109a formed in FIG. 24G. In this step, for example, a lift-off step is performed. For example, the first linear response magnetic body 160E is deposited on the entire surface in a state where a resist pattern formed by photolithography of FIG. 24H is left unchanged, and then the resist pattern is removed. Now, for example, Cr (5 nm) is formed as a first linear response magnetic body 160E-dedicated base layer, and, for example, $Co_{80}Pt_{20}$ (20 nm) is formed thereon as the first linear response magnetic body 160E. A cap layer not illustrated may be further formed thereon. Employable as this cap layer is the material mentioned above as a material usable in the cap layer 108 of the magnetic resistance element, or an insulating layer of the likes of $SiO_x$, $AlO_x$, $SiN_x$, and $AlN_x$. In FIG. 24H, after the first linear response magnetic body 160E has been implanted, an external magnetic field is applied at room temperature to perform setting of the magnetization direction of the hard magnetic layer (hard ferromagnetic material) included in the first linear response magnetic body 160E. For example, application of an external magnetic field in a substantially perpendicular direction to the direction of the induction magnetic field is performed. Setting of the magnetization direction of the first linear response magnetic body 160E by this external magnetic field, provided it is performed after implanting of the first linear response magnetic body 160E, may be performed at any of timings of before removal of the resist pattern, after removal of the resist pattern, and after processing of the upper electrode E2 shown in FIG. 24J.

Figure 24J:
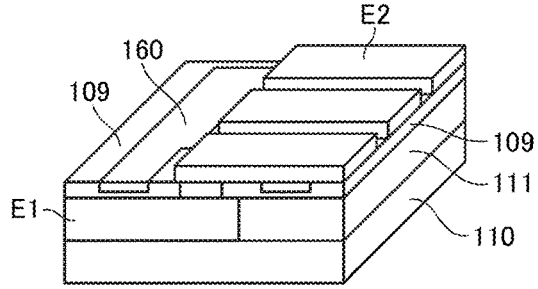

Next, as shown in FIG. 24I, the upper electrode E2 is deposited. Next, as shown in FIG. 24J, a planar shape of the upper electrode E2 is processed. In this step, resist undergoes patterning by photolithography, and then physical milling or chemical milling are performed using a resist pattern not illustrated as a mask.

The manufacturing method according to such a mode makes it possible to manufacture the current sensor according to the present embodiment without increase in the number of steps. Note that although not illustrated in FIGS. 24(a) to 24(j), formation of a contact hole to the lower electrode E1 may be performed, or a protective film may be formed after processing of the upper electrode E2.

[Advantages]

As described above, due to the current sensor of the present embodiment, a direction of magnetization applied by the magnetic bodies HB1 and HB2 of the forward polarity magnetic resistance elements 100 and 400 differs by 180° from a direction of magnetization applied by the magnetic bodies HB1 and HB2 of the reverse polarity magnetic resistance elements 200 and 300. Therefore, it becomes possible to determine existence/non-existence of an external magnetic field in a direction perpendicular to the magnetization directions of the magnetization fixed layers of the first through fourth magnetic resistance elements 100 to 400, based on an output of the magnetic resistance element for measuring a current. Therefore, the current sensor of the present embodiment makes it possible to detect whether a malfunction-causing external magnetic field is being applied or not, by monitoring an output signal, without using a separately-provided external magnetic field detection-dedicated magnetic field sensor.

(Example of Application to Smart Meter)

Figure 25:
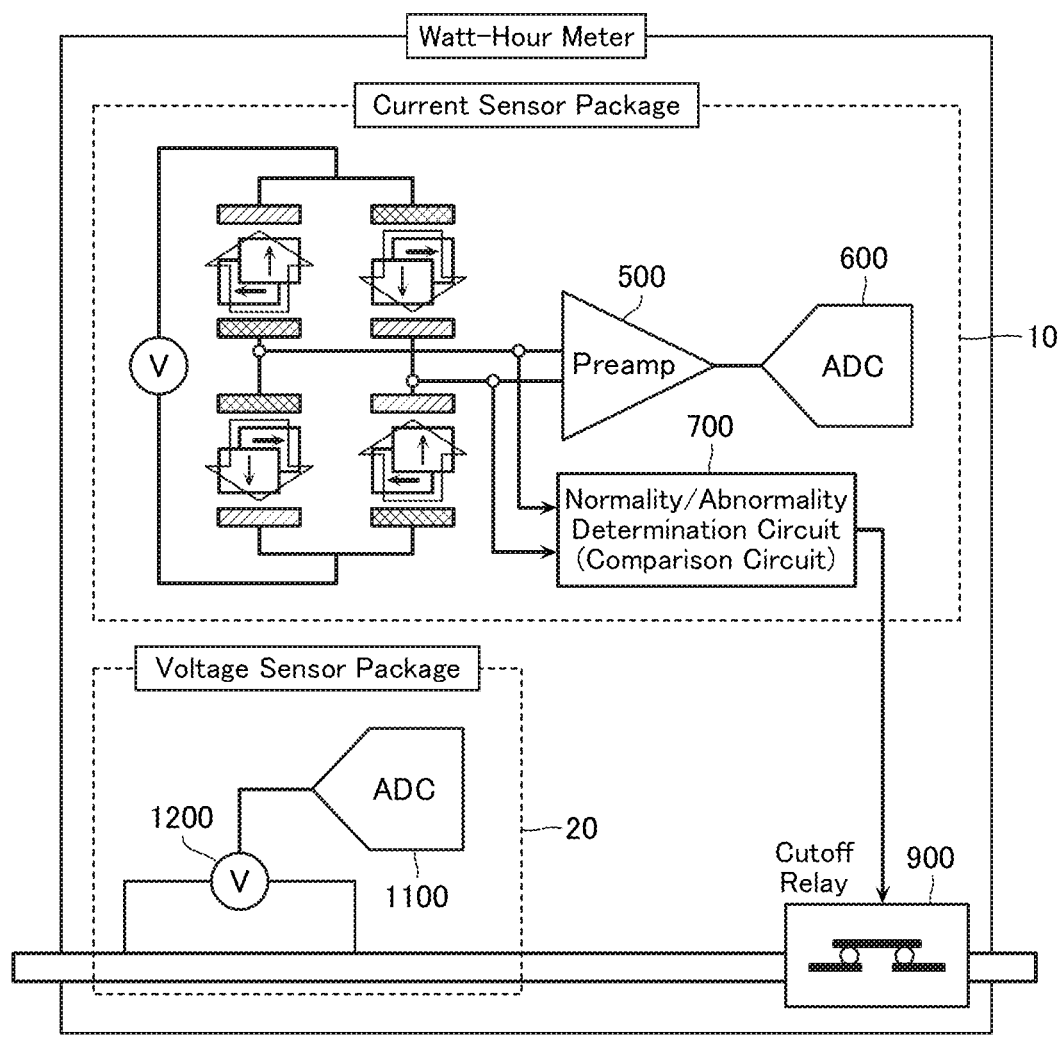
FIG. 25 is an example of configuration of a smart meter installed with the current sensor of the first embodiment.

FIG. 25 shows an example where the current sensor of the first embodiment (10) is applied to a smart meter. This smart meter comprises a voltmeter 20, in addition to the current sensor 10. Moreover, the voltmeter 20 comprises a voltage measuring instrument and an analog-to-digital converter 1100. In this example of FIG. 25, instead of a determination result of the normality/abnormality determination circuit 700 being outputted to the output unit 800, a cutoff relay 900 connected in series to an electric line operates, and a supply of electric power is cut off. Instead of cutting off the supply of electric power, the determination result may be displayed, and so on, similarly to in FIG. 16, and moreover, it is also possible for the determination result to be stored and employed in a subsequent calculation of used electric power, and so on.

[2. Second Embodiment]

[2-1. Configuration]

Figure 26:
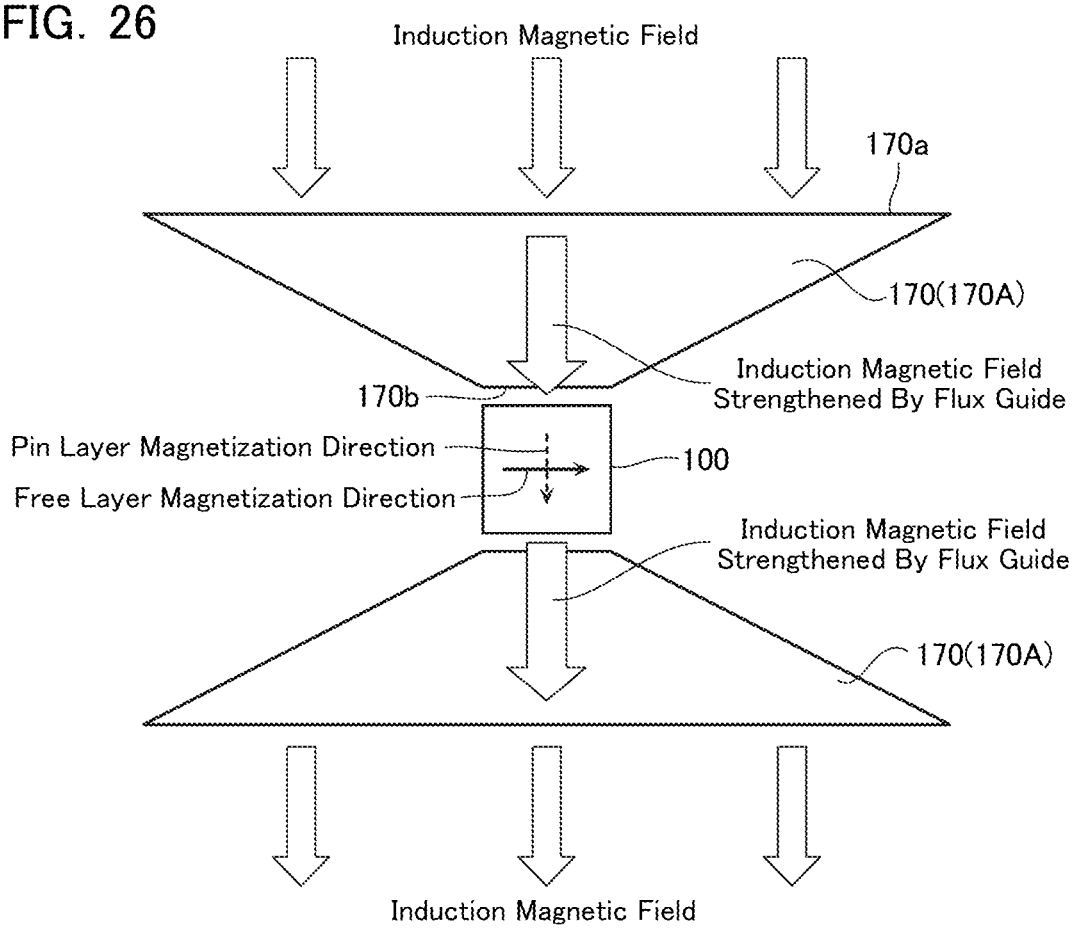
FIG. 26 is a schematic view showing an example of configuration of a current sensor according to a second embodiment.
Figure 27:
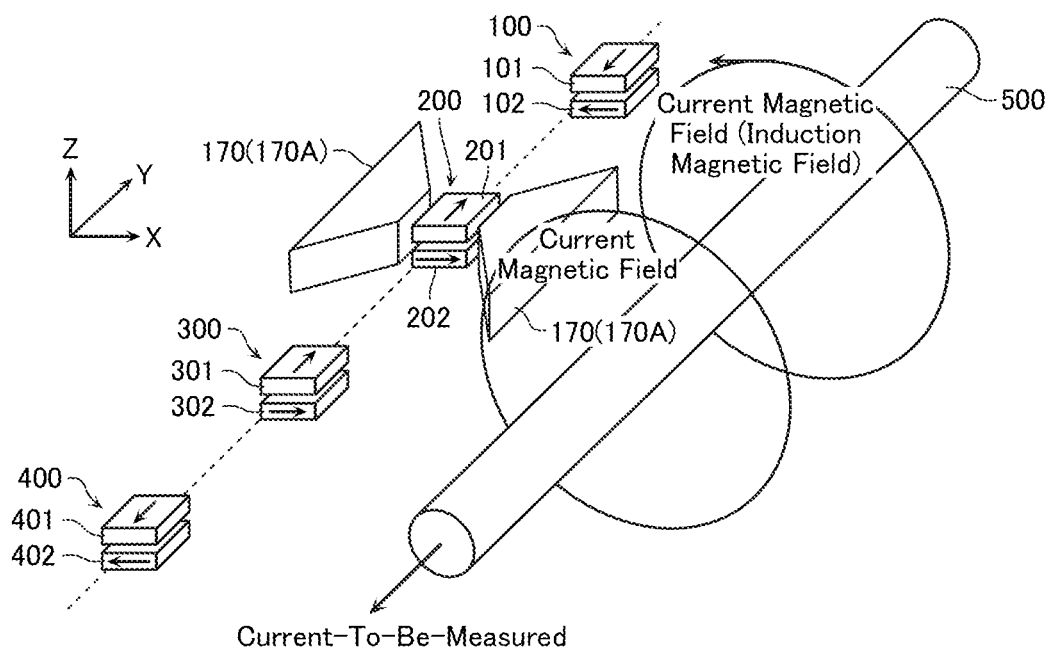
FIG. 27 is a schematic view showing an example of configuration of the current sensor according to the second embodiment.

Next, a current sensor according to a second embodiment will be described with reference to FIGS. 26 and 27. FIG. 26 is a plan view showing a schematic configuration of part of the current sensor according to the second embodiment; and FIG. 27 is a schematic view showing an example of configuration of the same current sensor. As shown in FIG. 26, the current sensor according to the second embodiment, similarly to the current sensor according to the first embodiment, includes first through fourth magnetic resistance elements 100 to 400 that are disposed close to a wiring line W and that have a resistance value that changes by application of a current magnetic field from a measurement current flowing in this wiring line W, these configure a full bridge circuit similarly to in the first embodiment, and the first magnetic resistance element 100 and fourth magnetic resistance element 400 have a forward polarity and the second magnetic resistance element 200 and third magnetic resistance element 300 have a reverse polarity. Moreover, a magnetization direction due to magnetic bodies HB1 and HB2 of the forward polarity magnetic resistance elements 100 and 400 differs by 180° from a magnetization direction due to magnetic bodies HB1 and HB2 of the reverse polarity magnetic resistance elements 200 and 300. The above points are identical to in the first embodiment.

However, the magnetic resistance element according to the present embodiment differs from that of the first embodiment in performing adjustment of magnetic field sensitivity using a magnetic flux guide 170A, not a linear response magnetic body. In FIG. 27, for simplification of illustration, the magnetic flux guide 170A is installed only in the second magnetic resistance element 200, but there is no intention for the present invention to be limited to this configuration, and a similar magnetic flux guide may be provided also to the other magnetic resistance elements 100, 300, and 400.

The magnetic flux guide 170 works by an identical principle to a magnetic core employed in a conventional inductance type, and is configured from a magnetic body of high magnetic permeability disposed in a periphery of the magnetic resistance element. When a magnetic body of high magnetic permeability is disposed, magnetic flux is attracted to this magnetic body as long as the magnetic flux passing through this magnetic body is not more than a saturation magnetic flux of the magnetic body. Therefore, using the above-described magnetic flux guide makes it possible to concentrate magnetic flux on the magnetic resistance element.

As shown in FIGS. 26 and 27, in the current sensor according to the present embodiment, a first magnetic flux guide 170A is disposed in a periphery of the first magnetic resistance element 100. The first magnetic flux guide 170A is one mode of the magnetic flux guide.

The magnetic flux guide 170 is disposed at a side surface in a direction that the current magnetic field from the current-to-be-measured is applied, of the magnetic resistance elements 100 to 400. Moreover, the magnetic flux guide 170 is formed in a trapezoidal shape, and is formed such that its surface 170a far from the first magnetic resistance element 100 is larger than its surface 170b facing the first magnetic resistance element 100. Furthermore, a width of the surface 170b facing the first magnetic resistance element 100, of the magnetic flux guide 170 is slightly larger than a width of the first magnetic resistance element 100.

The current magnetic field from the current-to-be-measured enters perpendicularly to the magnetization direction of the first magnetic layer 101 and parallelly to the magnetization direction of the second magnetic layer 102. Now, since the magnetic flux guide 170 is formed from a magnetic body of high magnetic permeability, the current magnetic field converges toward the surface 170a of the magnetic flux guide 170 and enters the magnetic flux guide 170. Moreover, area of the surface 170b where magnetic flux exits is smaller compared to area of the surface 170a where magnetic flux enters. Therefore, the magnetic flux entering the magnetic flux guide 170 further converges to enter the first magnetic resistance element 100. Therefore, the magnetic field applied to the first magnetic resistance element 100 is larger compared to when the magnetic flux guide 170 is not provided.

The magnetic flux guide 170 may be formed from a variety of soft magnetic bodies of high magnetic permeability (single bodies or alloys of Fe, Co, Ni), but it is possible to apply to the magnetic flux guide 170 a soft magnetic material, for example, ferronickel, cobalt-zirconium-niobium, iron-aluminum-silicon, iron-cobalt-nickel and a soft magnetic amorphous alloy, and so on.

Figure 28A:
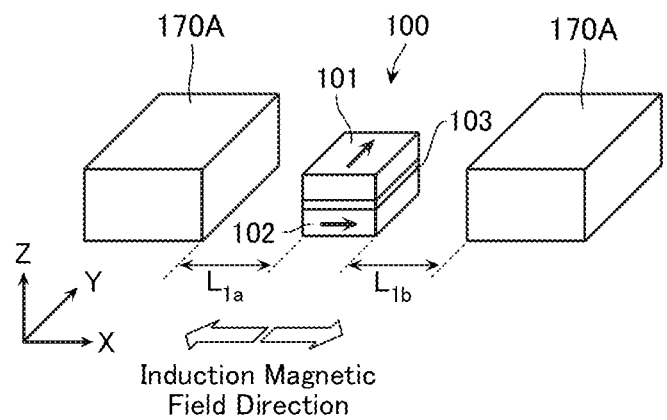
FIGS. 28A and 28B are schematic views showing an example of configuration of the current sensor according to the second embodiment.

Now, magnetic field sensitivity ((dR/R)/2Hs) of the magnetic resistance element can also be adjusted by configurations of the magnetic flux guide 170, and so on. As shown in FIG. 28A, it is possible to change magnetic field sensitivity by changing the sum $L_{1a}+L_{1b}$ of distances between the magnetic resistance element and the first and a second magnetic flux guide 170A and 170A. In this case, the larger the distance from the first or second magnetic flux guide 170A and 170A, the smaller the induction magnetic field applied to the magnetic resistance element 100 becomes.

Figure 28B:
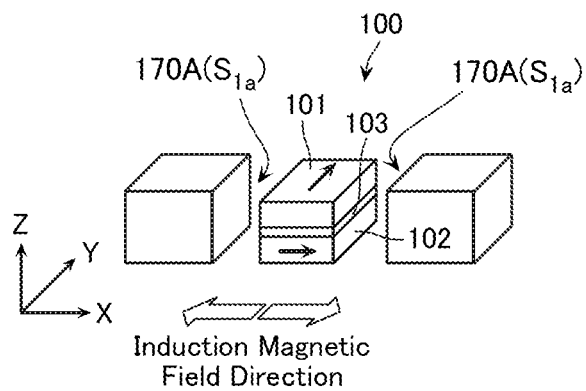
Figure 29A:
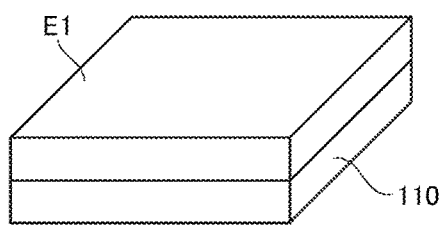
FIGS. 29A to 29J describe a manufacturing method of the current sensor according to the second embodiment.
Figure 29F:
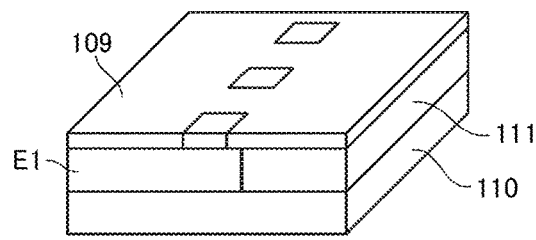
Figure 29B:
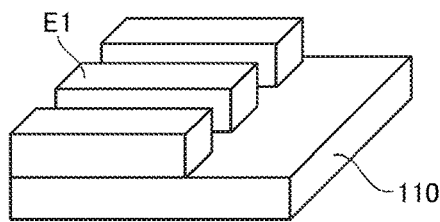
Figure 29G:
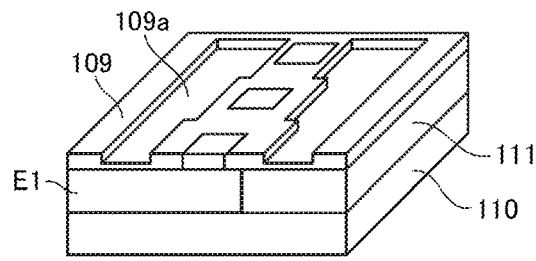
Figure 29C:
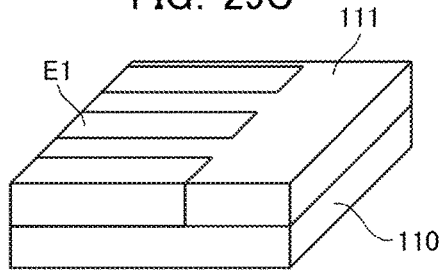
Figure 29H:
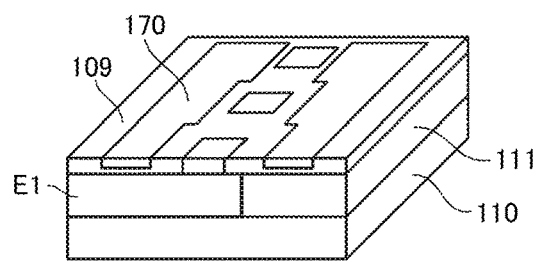
Figure 29D:
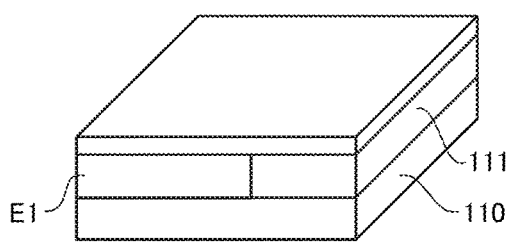
Figure 29I:
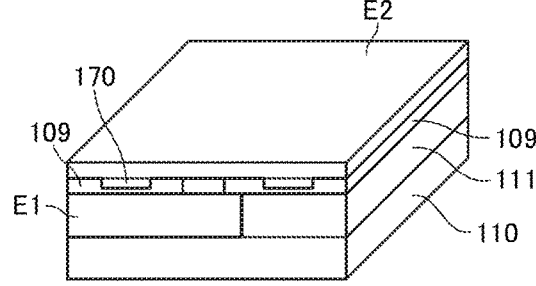
Figure 29E:
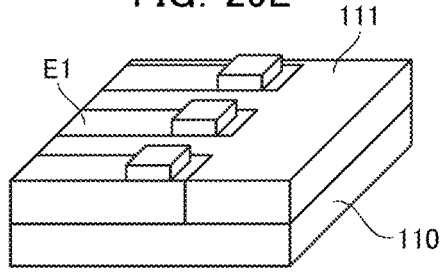
Figure 29J:
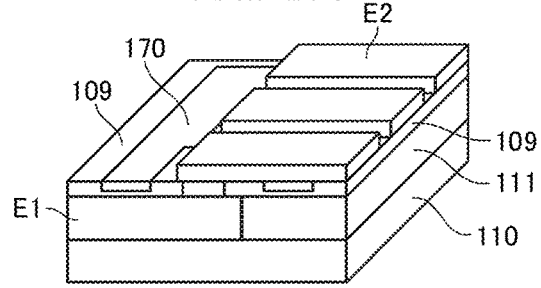

As shown in FIG. 28B, it is possible to change magnetic field sensitivity by changing area of the surface facing the first magnetic resistance element 100 of the first magnetic flux guide 170A and area $S_{1a}$ of the surface facing the second magnetic resistance element 200 of the second magnetic flux guide 170A.

FIGS. 28A and 28B described the case where magnetic field sensitivity is changed by changing arrangement or area of the first and second magnetic flux guides 170A and 170A, but magnetic field sensitivity can be changed also by changing a kind of magnetic material employed in the first and second magnetic flux guides 170A and 170A. For example, it is also possible to employ magnetic materials having a different magnetic permeability in each of the first magnetic flux guide 170A and the second magnetic flux guide 170A.

[2-2. Manufacturing Method]

Next, a manufacturing method of the current sensor according to the present embodiment will be described. FIGS. 29A to 29J are stepwise schematic perspective views illustrating the manufacturing method of the current sensor according to the present embodiment. The manufacturing method of the current sensor according to the present embodiment is substantially similar to the manufacturing method of the current sensor according to the first embodiment, but differs in manufacturing the first magnetic flux guide 170 in the step of manufacturing the first linear response magnetic body 160. Note that the above-mentioned magnetic body of high magnetic permeability may be applied as a material of the first magnetic flux guide 170.

[3. Third Embodiment]

Next, a third embodiment will be described. The present embodiment shows an example where the current sensors according to the above-described first and second embodiments are installed in a smart meter. The smart meter measures voltage and current. Now, voltage can be measured in a conventional semiconductor element. Therefore, the smart meter can be configured by adding this semiconductor element to the current sensors according to any of the above-described embodiments. Described below is an example where a current sensor 601 according to a fourth embodiment is applied to the smart meter, but a current sensor according to another embodiment may also be applied.

Figure 30A:
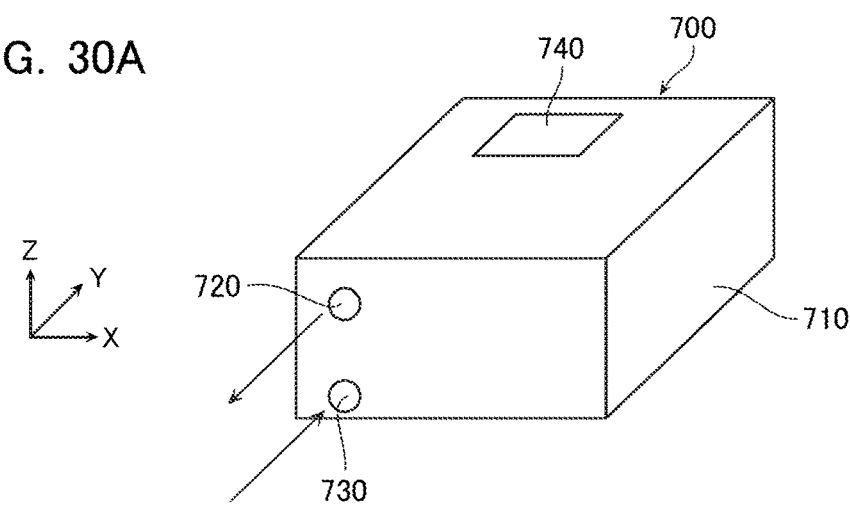
FIGS. 30A to 30C are a schematic view showing a smart meter 700 according to a third embodiment.
Figure 30B:
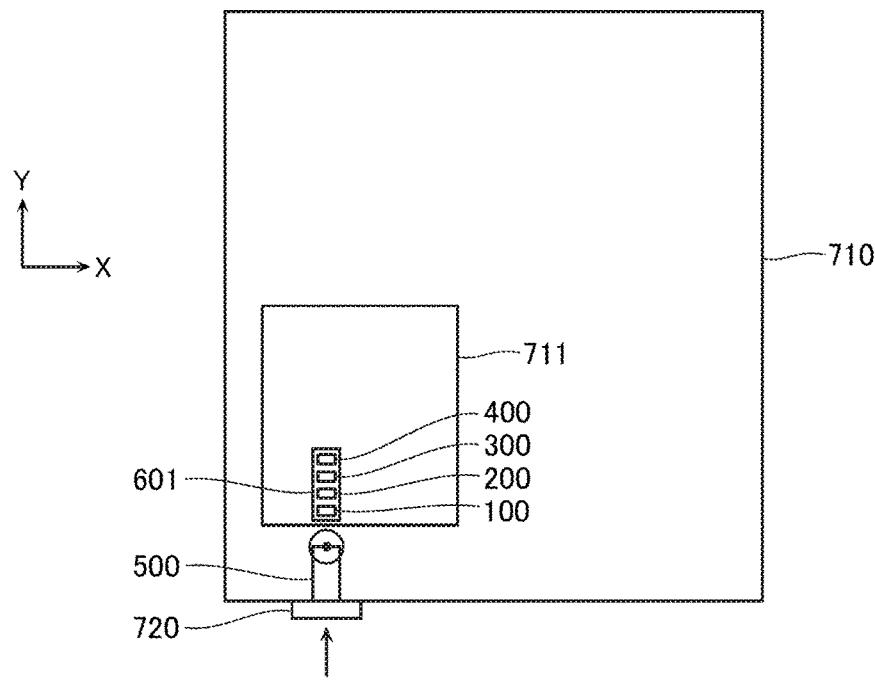

FIG. 30A is a schematic perspective view showing outer appearance of a smart meter 700 according to the present embodiment; FIG. 30B is a schematic plan view of the same smart meter 700; and FIG. 30C is a schematic side view of the same smart meter 700.

Figure 30C:
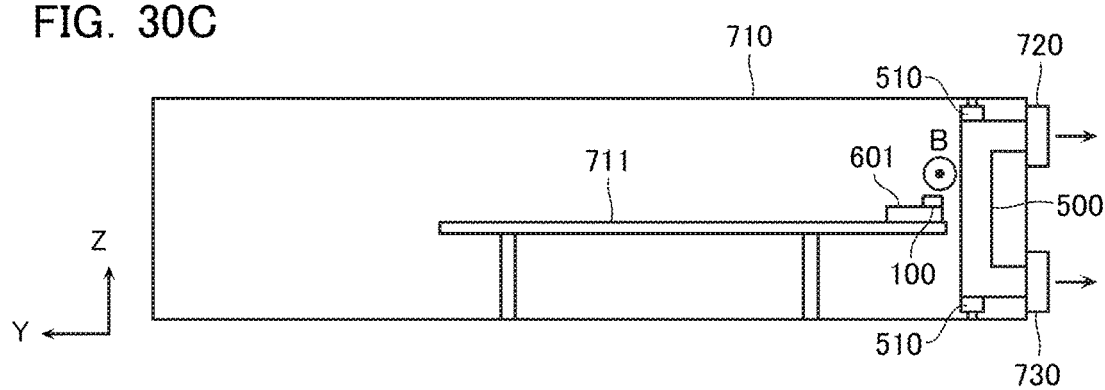

As shown in FIGS. 30A to 30C, the smart meter 700 comprises: a housing 710 for housing a sensor unit; and a first terminal unit 720, a second terminal unit 730, and a display unit 740 externally displaying electrical energy, that are provided in the housing 710. The housing 710 houses each of configurations of the smart meter 700 according to the present embodiment. The first terminal unit 720 and the second terminal unit 730 electrically connect each of configurations of the smart meter 700 and a measurement target via a probe not illustrated. The display unit 740 displays a result of measurement by the smart meter 700, and so on. Note that the various configurations of the smart meter housed in the housing 710 are called a current measuring module.

The smart meter 700 according to the present embodiment is conceivably configured capable of measuring an alternating current and an alternating voltage of about 50 to 60 Hz, for example, but may be configured capable of measuring only a direct current and a direct voltage, for example. Moreover, FIG. 30A to 30C show an example where the smart meter 700 according to the present embodiment is capable of measuring a single-phase alternating current and voltage of about 100 to 200 V, but it may be configured capable of measuring a three-phase alternating current and voltage, for example. In this case, three pairs of the above-described terminal units 720 and 730 are provided.

As shown in FIG. 30B, the smart meter 700 houses the wiring line 500, an electronic substrate module 711, and the current sensor 601, in the housing 710. The current sensor 601 may be identical to that of the first embodiment.

The wiring line 500 has one end connected to the first terminal unit 720 and the other end connected to the second terminal unit 730. Moreover, the wiring line 500 is disposed to allow the current-to-be-measured to flow in an up-down direction of the housing 710 (referred to below as Z direction), and is fixed to the housing 710 via an insulated current line fixing support portion 510 (FIG. 30C). The electronic substrate module 711 is fixed parallel to the bottom of the housing 710, in the housing 710. The current sensor 601 is fixed parallel to the bottom of the housing 710, on the electronic substrate module 711. Therefore, in the smart meter 700 according to the present embodiment, a positional relationship of the wiring line 500 and the current sensor 601 is fixed, hence the current magnetic field from the current-to-be-measured can be suitably measured.

Figure 31A:
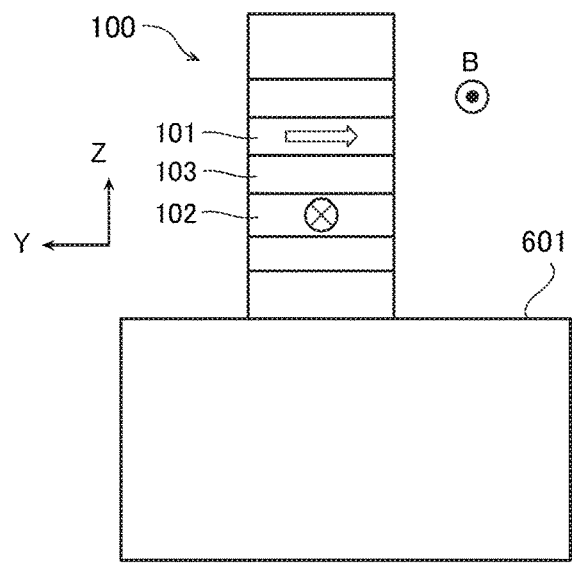
FIGS. 31A and 31B are schematic views showing a schematic configuration of part of the same smart meter 700.
Figure 31B:
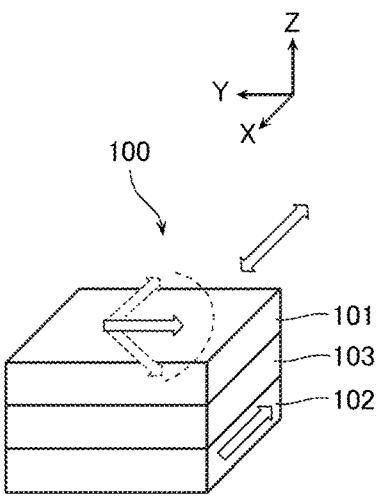

FIGS. 31A and 31B are schematic views for explaining a configuration of part of the same smart meter 700. As shown in FIGS. 31A and 31B, in the present embodiment, the direction of the current magnetic field from the current-to-be-measured is a left-right direction of the housing 710 (referred to below as X direction).

Figure 32:
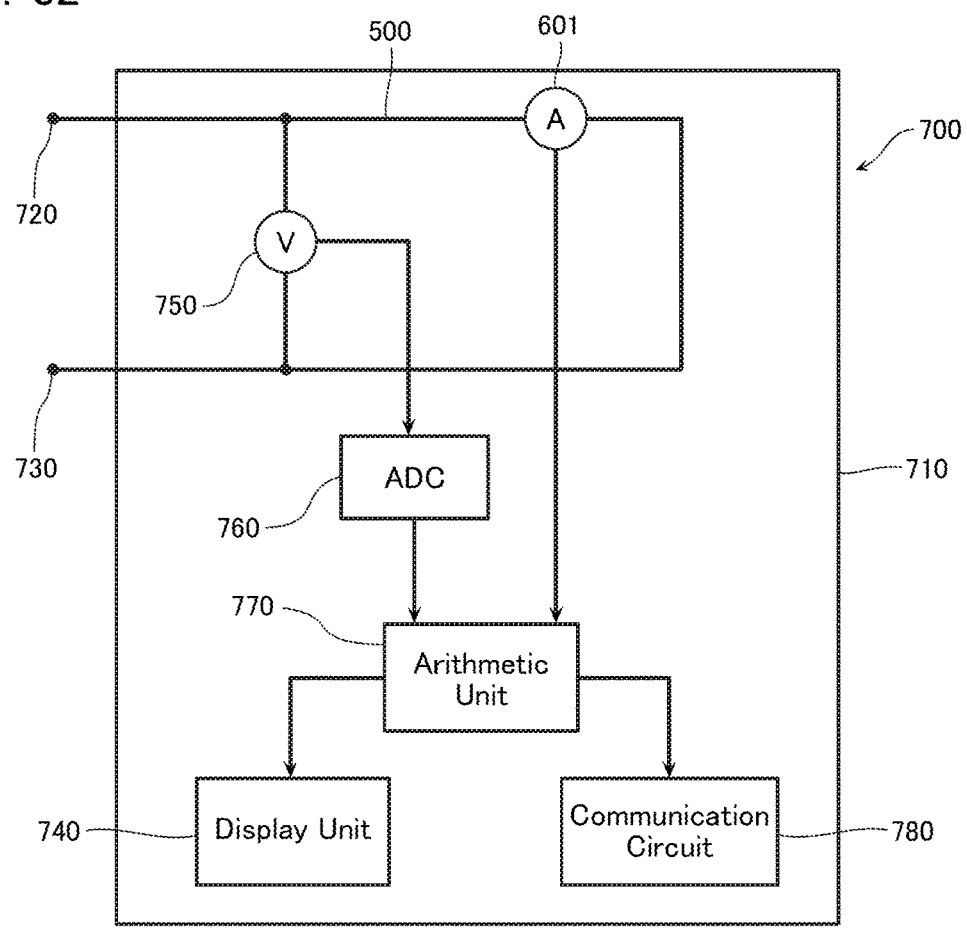
FIG. 32 is a functional block diagram showing a schematic configuration of the same smart meter 700.

FIG. 32 is a functional block diagram showing a schematic configuration of the smart meter 700. As shown in FIG. 32, in addition to the above-described wiring line 500 and current sensor 601, the smart meter 700 further comprises: a voltmeter 750; an A/D converter circuit 760; an arithmetic unit 770; and a communication circuit 780. Note that the voltmeter 750, the A/D converter circuit 760, the arithmetic unit 770, and the communication circuit 780 may also be fabricated on the electronic substrate module 711 as semiconductor elements.

The current sensor 601 may be the current sensor according to the first embodiment. The current sensor 601 is disposed close to the wiring line 500 and measures a current flowing in the wiring line 500.

A variety of voltmeters may be applied as the voltmeter 750. The voltmeter 750 measures a voltage between the first terminal unit 720 and the second terminal unit 730. The A/D converter circuit 760 converts a voltage value measured by the voltmeter 750 into a digital signal.

The arithmetic unit 770 acquires a current value from the current sensor 601 and the voltage value from the A/D converter circuit 760, and performs a calculation of electric power, and so on. The display unit 740 acquires the current value, the voltage value, a magnitude of electric power, and so on, from the arithmetic unit 770, and displays these. The communication circuit 780 similarly acquires the current value, the voltage value, the magnitude of electric power, and so on, from the arithmetic unit 770, and outputs these to outside of the smart meter 700.

[4. Fourth Embodiment]

Figure 33A:
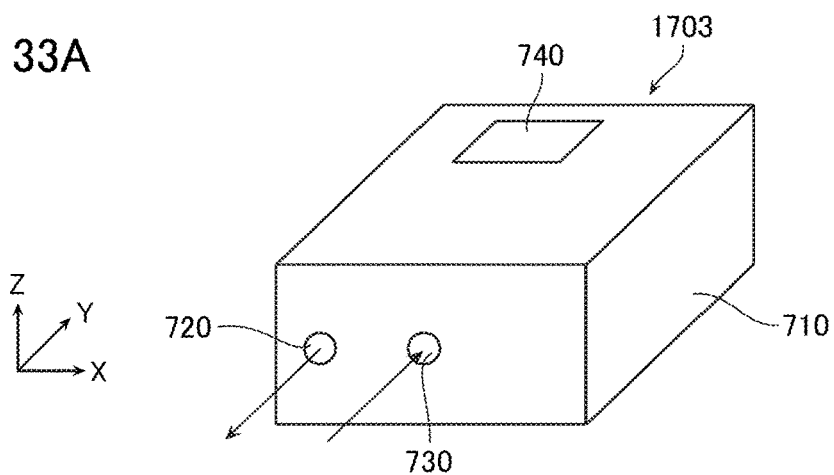
FIGS. 33A to 33C are schematic views showing a smart meter according to a fourth embodiment.
Figure 33B:
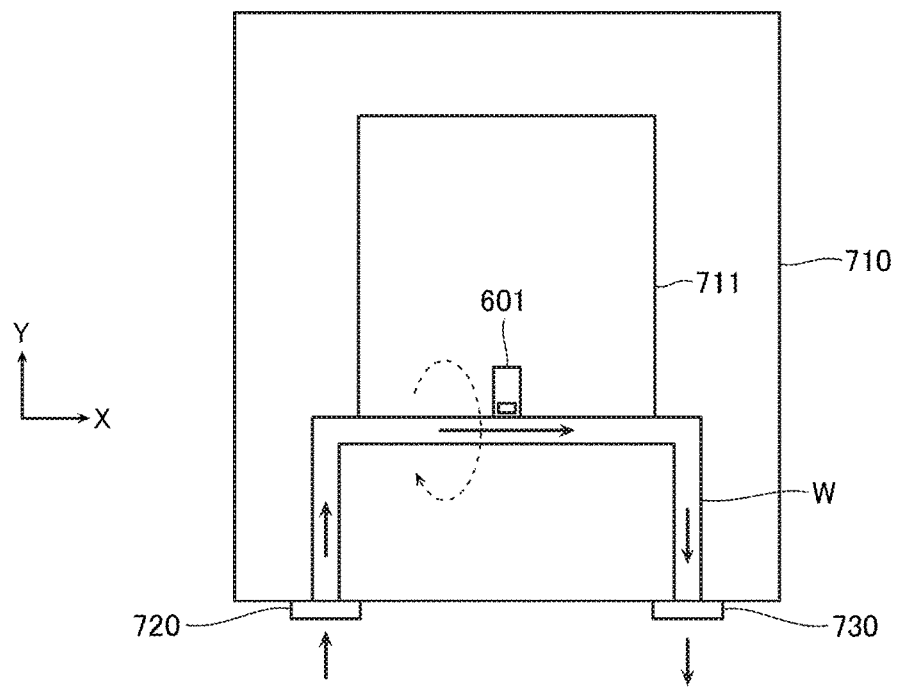
Figure 33C:
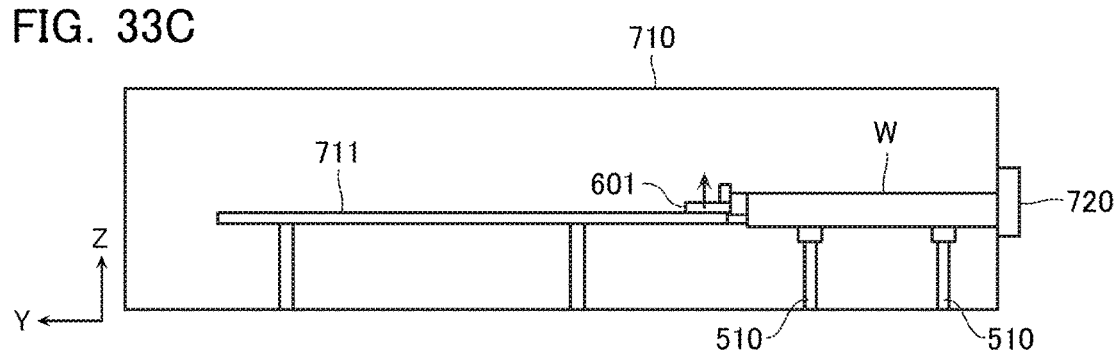

Next, a smart meter 1703 according to a fourth embodiment will be described. FIG. 33A is a schematic perspective view showing outer appearance of the smart meter 1703 according to the present embodiment; FIG. 33B is a schematic plan view of the same smart meter 1703; and FIG. 33C is a schematic side view of the same smart meter 1703. Moreover, FIGS. 33A and 33B are schematic views for explaining a configuration of part of the same smart meter 1703.

The smart meter 1703 according to the present embodiment is basically configured similarly to the smart meters according to the previously described embodiments, but differs from the smart meters according to the previously described embodiments in the following points.

That is, as shown in FIG. 33A, in the smart meter 1703 according to the present embodiment, the first terminal unit 720 and the second terminal unit 730 are arranged in the X direction. Moreover, since the first terminal unit 720 and the second terminal unit 730 are arranged in the X direction, then, as shown in FIGS. 33B and 33C, the wiring line W is disposed to allow the current-to-be-measured to flow in the X direction of the housing 710. Furthermore, in this case, the direction of the current magnetic field due to the current-to-be-measured is the Y direction of the housing 710. Therefore, as shown in FIGS. 33A and 33B, the current sensor 601 is fixed perpendicularly to the bottom of the housing 710, on the electronic substrate module 711.

[5. Fifth Embodiment]

Figure 34:
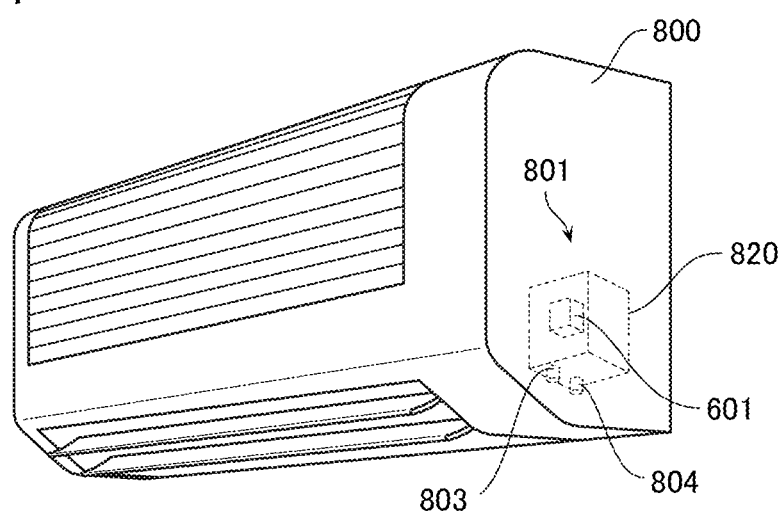
FIG. 34 is a schematic view showing appearance of a household electrical appliance according to a fifth embodiment.

Next, a fifth embodiment will be described. A current sensor according to the fifth embodiment is installed in a household electrical appliance. This makes it possible also for a HEMS (Home Energy Management System) to be achieved. FIG. 34 is a schematic view showing appearance of the household electrical appliance according to the present embodiment. The current sensor can be installed in a variety of household electrical appliances. FIG. 34 shows appearance when installed in an air conditioner 800 as an example.

The air conditioner 800 according to the present embodiment comprises a current measuring mechanism 801. The current measuring mechanism 801 houses the current sensor 601 according to the previously described embodiment, for example, in a housing 802. First and second terminal units 803 and 804 are provided on a side surface of the housing 802, and the current sensor 601 is connected to other components via these first and second terminal units.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A sensor comprising:
   a first magnetic resistance element outputting a first signal;
   a second magnetic resistance element outputting a second signal;
   a signal outputting circuit outputting a difference between the first signal and the second signal, an output signal of the sensor including an output signal of the signal outputting circuit; and
   an information circuit
      outputting a first information if a difference between a first value and a second value is smaller than a threshold value,
      outputting a second information if the difference between the first value and the second value is larger than the threshold value,
      the first value being a magnitude of an absolute value of a difference between the first signal and a first predetermined magnitude, and
      the second value being a magnitude of an absolute value of a difference between the second signal and a second predetermined magnitude,
   wherein
      the output signal of the signal outputting circuit changes according to a magnetic field in a first direction,
      an output information of the information circuit changes according to a magnetic field in a second direction, and
      the second direction crosses the first direction.

2. The sensor according to claim 1, wherein the information circuit comprises:
   a first difference outputting circuit outputting the magnitude of the absolute value of the difference between the first signal and the first predetermined magnitude;
   a second difference outputting circuit outputting the magnitude of the absolute value of the difference between the second signal and the second predetermined magnitude;
   a third difference outputting circuit outputting a difference between an output signal of the first difference outputting circuit and an output signal of the second difference outputting circuit; and
   an information outputting circuit outputting the first information if an output signal of the third difference outputting circuit is smaller than the threshold value, and outputting the second information if the output signal of the third difference outputting circuit is larger than the threshold value.

3. The sensor according to claim 1 further comprising:
   a first terminal;
   a second terminal;
   a third magnetic resistance element, the first magnetic resistance element and the third magnetic resistance element being connected in series between the first terminal and the second terminal;
   a fourth magnetic resistance element, the second magnetic resistance element and the fourth magnetic resistance element being connected in series between the first terminal and the second terminal;
   a first node connected to a node between the first magnetic resistance element and the third magnetic resistance element, the signal outputting circuit and the information circuit; and
   a second node connected to a node between the second magnetic resistance element and the fourth magnetic resistance element, the signal outputting circuit and the information circuit.

4. The sensor according to claim 3, wherein
   a first voltage is applied between the first terminal and the second terminal, and
   the first predetermined magnitude and the second predetermined magnitude have a magnitude of half of the first voltage.

5. A sensor comprising:
   a first magnetic resistance element outputting a first signal;
   a second magnetic resistance element outputting a second signal;
   a signal outputting circuit outputting a difference between the first signal and the second signal, an output signal of the sensor including an output signal of the signal outputting circuit;
   a first difference outputting circuit outputting a magnitude of an absolute value of a difference between the first signal and a first magnitude;
   a second difference outputting circuit outputting a magnitude of an absolute value of a difference between the second signal and a second magnitude;
   a third difference outputting circuit outputting a difference between an output signal of the first difference outputting circuit and an output signal of the second difference outputting circuit; and
   an information outputting circuit outputting a first information if an output signal of the third difference outputting circuit is smaller than a threshold value, and, outputting a second information if the output signal of the third difference outputting circuit is larger than the threshold value, wherein the output signal of the signal outputting circuit changes according to a magnetic field in a first direction, an output information of the information outputting circuit changes according to a magnetic field in a second direction, and the second direction crosses the first direction.

6. The sensor according to claim 5 further comprising:

a first terminal;

a second terminal;

a third magnetic resistance element, the first magnetic resistance element and the third magnetic resistance element being connected in series between the first terminal and the second terminal;

a fourth magnetic resistance element, the second magnetic resistance element and the fourth magnetic resistance element being connected in series between the first terminal and the second terminal;

a first node connected to a node between the first magnetic resistance element and the third magnetic resistance element, the signal outputting circuit and the first difference outputting circuit; and a second node connected to a node between the second magnetic resistance element and the fourth magnetic resistance element, the signal outputting circuit and the second difference outputting circuit.

7. The sensor according to claim 6, wherein a first voltage is applied between the first terminal and the second terminal, and the first magnitude and the second magnitude have a magnitude of half of the first voltage.

8. A sensor comprising:

a first magnetic resistance element outputting a first signal;

a second magnetic resistance element outputting a second signal;

a signal outputting circuit outputting a difference between the first signal and the second signal, an output signal of the sensor including an output signal of the signal outputting circuit; and an information circuit outputting a first information if a difference between a first value including the first signal and a second value including the second signal is smaller than a threshold value, outputting a second information if the difference between the first value and the second value is larger than the threshold value, wherein the output signal of the signal outputting circuit changes according to a magnetic field in a first direction, an output information of the information circuit changes according to a magnetic field in a second direction, and the second direction crosses the first direction.

9. The sensor according to claim 8 further comprising:

a first terminal;

a second terminal;

a third magnetic resistance element, the first magnetic resistance element and the third magnetic resistance element being connected in series between the first terminal and the second terminal;

a fourth magnetic resistance element, the second magnetic resistance element and the fourth magnetic resistance element being connected in series between the first terminal and the second terminal;

a first node connected to a node between the first magnetic resistance element and the third magnetic resistance element, the signal outputting circuit and the information circuit; and a second node connected to a node between the second magnetic resistance element and the fourth magnetic resistance element, the signal outputting circuit and the information circuit.

\* \* \* \* \*